US011662393B2

(12) United States Patent
Yamamoto et al.

(10) Patent No.: US 11,662,393 B2
(45) Date of Patent: May 30, 2023

(54) CABLE, METHOD FOR CONTROLLING CABLE, TRANSMISSION DEVICE, METHOD FOR CONTROLLING TRANSMISSION DEVICE, RECEPTION DEVICE, AND METHOD FOR CONTROLLING RECEPTION DEVICE

(71) Applicant: SONY CORPORATION, Tokyo (JP)

(72) Inventors: Masanari Yamamoto, Tokyo (JP); Kazuaki Toba, Tokyo (JP); Kazuo Yamamoto, Tokyo (JP); Hiroshi Morita, Tokyo (JP)

(73) Assignee: SONY CORPORATION, Tokyo (JP)

( * ) Notice: Subject to any disclaimer, the term of this patent is extended or adjusted under 35 U.S.C. 154(b) by 216 days.

(21) Appl. No.: 17/046,489

(22) PCT Filed: Apr. 15, 2019

(86) PCT No.: PCT/JP2019/016231
§ 371 (c)(1),
(2) Date: Oct. 9, 2020

(87) PCT Pub. No.: WO2019/203206
PCT Pub. Date: Oct. 24, 2019

(65) Prior Publication Data
US 2021/0135708 A1    May 6, 2021

(30) Foreign Application Priority Data
Apr. 18, 2018    (JP) .............................. JP2018-080265

(51) Int. Cl.
*G01R 31/52*    (2020.01)
*G01R 31/55*    (2020.01)
(Continued)

(52) U.S. Cl.
CPC ............. *G01R 31/52* (2020.01); *G01R 31/55* (2020.01); *H04B 3/46* (2013.01); *H04B 3/54* (2013.01)

(58) Field of Classification Search
CPC .......... G01R 31/52; G01R 31/55; H04B 3/46; H04B 3/54; H04L 25/02; H03K 17/693; H03K 2217/0081
See application file for complete search history.

(56) References Cited

U.S. PATENT DOCUMENTS 6,643,728 B1    11/2003    Crutchfield
2004/0190464 A1*    9/2004    Tesdahl ................... H04L 25/02
370/278

(Continued)

FOREIGN PATENT DOCUMENTS

CN    103283221 A    9/2013
JP    2001337125 A    12/2001

(Continued)

OTHER PUBLICATIONS

International Search Report and Written Opinion of PCT Application No. PCT/JP2019/016231, dated Jun. 18, 2019, 09 pages of ISRWO.

*Primary Examiner* — Khanh C Tran
(74) *Attorney, Agent, or Firm* — Chip Law Group

(57) ABSTRACT

It is possible to determine, with a simple configuration, that the connection direction of a cable is the reverse direction. A cable is connected for use between a transmission device and a reception device, and transmits data in one direction. A connection direction determination unit determines whether the connection direction is the reverse direction, on the basis of a result of voltage monitoring at a predetermined position on a power-supply line. When the connection direction is determined to be the reverse direction, the information transmission unit transmits information indicat- (Continued)

ing that the connection direction is the reverse direction, to the transmission device or the reception device.

17 Claims, 58 Drawing Sheets

(51) Int. Cl.
    *H04B 3/46*          (2015.01)
    *H04B 3/54*          (2006.01)

(56) References Cited

U.S. PATENT DOCUMENTS

| | | | |
|---|---|---|---|
| 2009/0091656 A1* | 4/2009 | Kitaru | H04L 5/20 |
| | | | 348/E5.133 |
| 2010/0043045 A1* | 2/2010 | Shakiba | H04B 3/32 |
| | | | 725/127 |
| 2013/0183045 A1 | 7/2013 | Niiho et al. | |
| 2016/0335219 A1* | 11/2016 | Chang | G06F 11/221 |
| 2018/0321721 A1 | 11/2018 | Teramoto | |
| 2019/0286204 A1* | 9/2019 | Kimura | G06F 1/266 |

FOREIGN PATENT DOCUMENTS

| | | |
|---|---|---|
| JP | 2003007394 A | 1/2003 |
| JP | 2009-130680 A | 6/2009 |
| JP | 2014-082634 A | 5/2014 |
| JP | 2014-082681 A | 5/2014 |
| JP | 2015-222960 A | 12/2015 |
| JP | 2017-092916 A | 5/2017 |
| WO | 2013/099069 A1 | 7/2013 |
| WO | 2017/086039 A1 | 5/2017 |

* cited by examiner 10-1 (REVERSE CONNECTION STATE)

EXAMPLE NOTIFICATION 1 BY LEDS

☐ ▨
POWER   CONNECTION
(GREEN) DIRECTION
        CHECK
        (RED)

FIG. 18B

EXAMPLE NOTIFICATION 2 BY LEDS

☐
POWER/REVERSE
CONNECTION
(GREEN/RED)

FIG. 19A

EXAMPLE NOTIFICATION BY DISPLAY

Because the cable used for Output-xx is reversely connected to the input and the output, there is a possibility that the image will not be correctly displayed. Please reverse the direction of the cable and reconnect it to the input and the output.

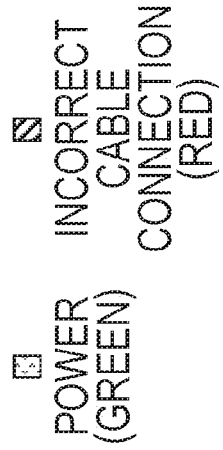

FIG. 19B

EXAMPLE NOTIFICATION 1 BY LEDS

☐ POWER (GREEN)   ☒ INCORRECT CABLE CONNECTION (RED)

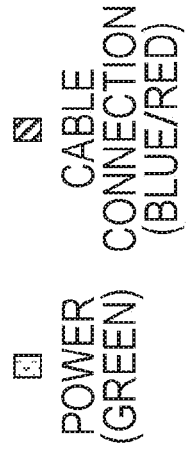

FIG. 19C

EXAMPLE NOTIFICATION 2 BY LEDS

☐ POWER (GREEN)   ☒ CABLE CONNECTION (BLUE/RED)

FIG. 23

EXAMPLE NOTIFICATION BY DISPLAY

Because the input and the output of the cable being used are reversely connected, there is a possibility that the image will not be correctly displayed.
Please reverse the direction of the cable and reconnect it to the input and the output.

FIG. 30A

EXAMPLE NOTIFICATION BY DISPLAY

Because the input and the output of the cable connected to Output-xx are reversely connected, there is a possibility that the image will not be correctly displayed. Please reverse the direction of the cable and reconnect it to Output-xx.

FIG. 30B

EXAMPLE NOTIFICATION BY DISPLAY

Because the input and the output of the cable used at the device as a destination of Output-xx are reversely connected, there is a possibility that the image will not be correctly displayed. Please reverse the direction of the cable and reconnect it to the destination device.

EXAMPLE NOTIFICATION BY DISPLAY

EXAMPLE NOTIFICATION BY DISPLAY 10-4 (REVERSE CONNECTION STATE, WITH Sink BEING DETECTED)

FIG. 58A

Display Port

| PIN No. | PIN NAME |
|---|---|
| 1 | MainLane0+ |
| 2 | Gnd |
| 3 | MainLane0- |
| 4 | MainLane1+ |
| 5 | Gnd |
| 6 | MainLane1- |
| 7 | MainLane2+ |
| 8 | Gnd |
| 9 | MainLane2- |
| 10 | MainLane3+ |
| 11 | Gnd |
| 12 | MainLane3- |
| 13 | Gnd |
| 14 | Gnd |
| 15 | Aux+ |
| 16 | Gnd |
| 17 | Aux- |
| 18 | HOT PLUG DETECTION |
| 19 | Gnd |
| 20 | 3.3V |

FIG. 58B

Thunderbolt

| PIN No. | PIN NAME |
|---|---|
| 1 | HV INPUT/ACGND |
| 2 | HPD |
| 3 | HS0TX(P) |
| 4 | HS0RX(P) |
| 5 | HS0TX(N) |
| 6 | HS0RX(N) |
| 7 | GND |
| 8 | GND |
| 9 | LSR2P Tx |
| 10 | (Reserved) GND |
| 11 | LSP2R Rx |
| 12 | (Reserved) GND |
| 13 | GND |
| 14 | GND |
| 15 | HS1TX(P) |
| 16 | HS1RX(P) |
| 17 | HS1TX(N) |
| 18 | HS1RX(N) |
| 19 | GND |
| 20 | DPPWR |

CABLE, METHOD FOR CONTROLLING CABLE, TRANSMISSION DEVICE, METHOD FOR CONTROLLING TRANSMISSION DEVICE, RECEPTION DEVICE, AND METHOD FOR CONTROLLING RECEPTION DEVICE

CROSS REFERENCE TO RELATED APPLICATIONS

This application is a U.S. National Phase of International Patent Application No. PCT/JP2019/016231 filed on Apr. 15, 2019, which claims priority benefit of Japanese Patent Application No. JP 2018-080265 filed in the Japan Patent Office on Apr. 18, 2018. Each of the above-referenced applications is hereby incorporated herein by reference in its entirety.

TECHNICAL FIELD

The present technology relates to a cable, a method for controlling a cable, a transmission device, a method for controlling a transmission device, a reception device, and a method for controlling a reception device, and more particularly, to a cable and the like that transmit data in one direction.

BACKGROUND ART

With a cable using a copper wire for a high-speed signal transmission path, high-speed signals attenuate due to the characteristics of the copper wire, and therefore, long-distance transmission is not possible. With an active cable using an active element in a high-speed signal transmission path, it is possible to transmit high-speed signals over a long distance. In this active cable, however, the input/output connection direction is limited. Therefore, if this active cable is connected in an incorrect direction, high-speed signals cannot be transmitted.

In a case where image data is to be transmitted, for example, an image based on the image data is not displayed on the reception side. However, the user cannot easily recognize whether the non-display of the image is caused by the transmission device, the reception device, or the cable. Further, it is not easy for the user to recognize that the connection direction of the cable is the reverse direction, and correct the connection by reversing the direction of the cable.

Therefore, in a case where the connection direction of the cable is the reverse direction, a notification to that effect is required to be sent to the user. For example, according to Patent Document 1, a check is made to determine whether the connection direction of a cable is the reverse direction, on the basis of signals of a power-supply line and an HPD line. The determination information is then transmitted to a source device (a transmission device) and a sink device (a reception device) through a utility line.

CITATION LIST

Patent Document

Patent Document 1: WO 2013/099069 A

SUMMARY OF THE INVENTION

Problems to be Solved by the Invention

An object of the present technology is to determine, with a simple configuration, that the connection direction of a cable is the reverse direction.

Solutions to Problems

The concept of the present technology lies in
a cable that is connected for use between a transmission device and a reception device, and transmits data in one direction,
the cable including:
a connection direction determination unit that determines whether a connection direction is a reverse direction, on the basis of a result of voltage monitoring at a predetermined position on a power-supply line; and
an information transmission unit that transmits information indicating that the connection direction is the reverse direction to the transmission device or the reception device, when the connection direction is determined to be the reverse direction.

In the present technology, a cable is connected for use between a transmission device and a reception device, and transmits data in one direction. The connection direction determination unit determines whether the connection direction is the reverse direction, on the basis of a result of voltage monitoring at a predetermined position on the power-supply line. For example, a first switch may be disposed on the power-supply line at a position that becomes closer to the side of the transmission device than the predetermined position when the connection direction is correct, and the connection direction determination unit determines whether the connection direction is the reverse direction, on the basis of the result of voltage monitoring at the predetermined position at a time when the first switch is in an unconnected state.

When the connection direction is determined to be the reverse direction, the information transmission unit transmits information indicating that the connection direction is the reverse direction, to the transmission device or the reception device. For example, the information transmission unit may transmit the information, using a predetermined line that is not the power-supply line. In this case, the predetermined line may be grounded via a series circuit of a voltage-dividing resistor and a second switch, and the information transmission unit may change the second switch from an unconnected state to a connected state, to transmit the information using the predetermined line, for example. As the second switch is put into a connected state in this manner, a predetermined voltage divided by the voltage-dividing resistor is generated in the predetermined line, and the predetermined voltage is sent as the information indicating that the connection direction of the cable is the reverse direction, to the transmission device or the like. Thus, the transmission device or the like can accurately recognize that the connection direction of the cable is the reverse direction.

Further, in this case, a third switch may be disposed at a position that becomes closer to the side of the reception device than the point of connection of the series circuit to the predetermined line at a time when the connection direction is the reverse direction, and the third switch may be put into an unconnected state when the second switch is put into a connected state, for example. Thus, the predetermined voltage divided by the voltage-dividing resistor can be prevented from being supplied to the reception device and inversely affecting the reception device.

As described above, in the present technology, a check is made to determine whether the connection direction is the reverse direction, on the basis of a result of voltage monitoring at a predetermined position on the power-supply line. Thus, it is possible to determine, with a simple configuration, that the connection direction of the cable is the reverse direction.

Note that, in the present technology, the cable may further include a notification unit that notifies the user of reverse connection, when the connection direction is determined to be the reverse direction, for example. Thus, the user can easily recognize that the connection direction of the cable is the reverse direction, and easily correct the connection.

Further, in the present technology, the cable may further include: a compatible device determination unit that determines whether the transmission device is a compatible device; and a control unit that performs control to operate in a compatible mode, when the transmission device is determined to be the compatible device, for example. Thus, it is possible to use a cable that has a specific function such as a register for holding specification data and the like and a current consumption unit such as an element for adjusting signal quality.

Further, another concept of the present technology lies in a transmission device that is connected to a reception device via a cable that transmits data in one direction, the transmission device including:

an information reception unit that receives information indicating that the connection direction of the cable is a reverse direction, the information being transmitted from the cable;

a notification unit that notifies the user of reverse connection, on the basis of the received information; and a power supply unit that supplies power to a power-supply line of the cable via a first path.

In the cable, a ground voltage is applied to a second path via a first voltage-dividing resistor, the second path being connected to a predetermined line of the cable, the predetermined line not being the power-supply line, and the information reception unit receives the information on the basis of a result of voltage monitoring in the second path.

The transmission device of the present technology is connected to a reception device via a cable that transmits data in one direction. The information reception unit receives the information that is transmitted from the cable and indicates that the connection direction of the cable is the reverse direction. The notification unit notifies the user of the fact, on the basis of the received information. Further, the power supply unit supplies power to the power-supply line of the cable via the first path. The ground voltage is applied, via the first voltage-dividing resistor, to the second path connected to the predetermined line that is not the power-supply line of the cable. The information reception unit receives the information indicating that the connection direction of the cable is the reverse direction, on the basis of a result of voltage monitoring in the second path.

For example, the transmission device may further include a connection determination unit that determines whether the cable is connected directly to the transmission device, on the basis of a result of voltage monitoring in the second path at a time when a predetermined voltage, instead of the power, is applied to the first path via a second voltage-dividing resistor. In this case, the notification unit may issue a notification that the connection direction of the cable is the reverse direction, and a notification as to whether the cable is connected directly to the transmission device, for example. Thus, the user can easily recognize whether or not a cable whose connection direction is the reverse direction is connected directly to the transmission device, and correct the connection efficiently.

As described above, in the present technology, the ground voltage is applied, via the first voltage-dividing resistor, to the second path connected to the predetermined line that is not the power-supply line of the cable, and the information indicating that the connection direction of the cable is the reverse direction is received from the cable, on the basis of a result of voltage monitoring in the second path. Thus, it is possible to receive, without fail, the information indicating that the connection direction of the cable is the reverse direction.

Note that the present technology may further include an information transmission unit that transmits the information indicating that the direction of the cable is the reverse direction, to the reception device through the predetermined line of the cable, on the basis of the received information, for example. Thus, it becomes possible to notify the reception device that the direction of the cable is the reverse direction, and, through the reception device, notify the user that the connection direction of the cable is the reverse direction. In this case, the information transmission unit may write the information into a register included in the reception device, for example.

The present technology may further include: a compatible device determination unit that determines whether the cable is a compatible cable; and a control unit that performs control to operate in a compatible mode, when the cable is determined to be the compatible cable, for example. The compatible device determination unit and the control unit may operate when the cable is correctly oriented. Thus, it is possible to use a cable that has a specific function such as a register for holding specification data and the like and a current consumption unit such as an element for adjusting signal quality.

Further, another concept of the present technology lies in a reception device that is connected to a transmission device via a cable that transmits data in one direction, the reception device including:

an information acquisition unit that acquires information indicating that the connection direction of the cable is a reverse direction; and a notification unit that notifies the user of reverse connection, on the basis of the acquired information.

The information acquisition unit acquires the information from a register on which writing has been performed by the transmission device.

The reception device of the present technology is connected to a transmission device via a cable that transmits data in one direction. The information acquisition unit acquires information indicating that the connection direction of the cable is the reverse direction. In this case, the information is acquired from a register on which writing has been performed by the transmission device. The notification unit notifies the user of the fact, on the basis of the acquired information.

As described above, in the present technology, the information indicating that the connection direction of the cable is the reverse direction is acquired from a register on which writing has been performed by the transmission device, and the user is notified of that fact. Thus, the user can easily recognize that the connection direction of the cable is the reverse direction, and correct the connection efficiently.

Effects of the Invention

According to the present technology, it is possible to determine, with a simple configuration, that the connection direction of a cable is the reverse direction. Note that the advantageous effects described in this specification are merely examples, and the advantageous effects of the present technology are not limited to them and may include additional effects.

BRIEF DESCRIPTION OF DRAWINGS

FIG. 16 is a diagram for explaining an operation of the transmission system shown in FIG. 15.

FIGS. 18A and 18B are diagrams for explaining example notifications in a notification unit of the HDMI cable.

FIGS. 19A, 19B, and 19C are diagrams for explaining example notifications in a notification unit of the source device.

FIG. 23 is a diagram for explaining an example notification in the notification unit of the sink device.

FIGS. 30A and 30B are diagrams for explaining example notifications in the notification unit of the source device.

FIGS. 58A and 58B are diagrams showing pin arrangements in "Display Port" and "Thunderbolt".

MODE FOR CARRYING OUT THE INVENTION

The following is a description of a mode for carrying out the invention (the mode will be hereinafter referred to as "embodiment"). Note that explanation will be made in the following order.
1. Embodiment
2. Modifications 1. Embodiment

[Configuration of a Transmission System]

Figure 1:
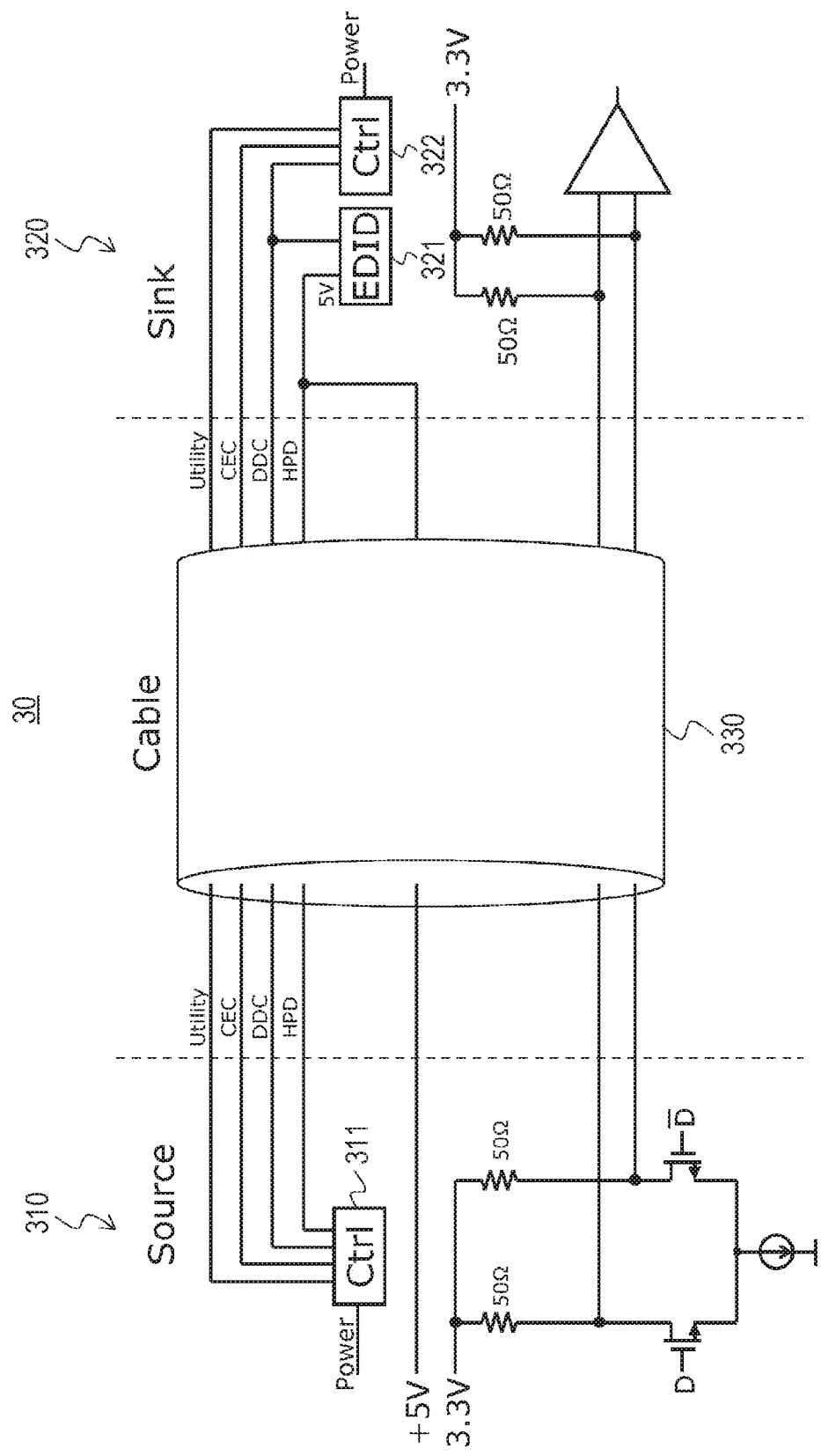
FIG. 1 is a diagram showing an example configuration of a transmission system.

FIG. 1 shows an example configuration of a transmission system 30. This transmission system 30 is an HDMI transmission system that uses HDMI as a digital interface. This transmission system 30 includes a source device 310 that is an HDMI transmitter, a sink device 320 that is an HDMI receiver, and an HDMI cable 330 that connects these devices.

The transmission channels of the transmission system 30 include three TMDS channels for transmitting video, audio, and control signals as digital signals in TMDS data, and one TMDS clock channel for transmitting a clock signal. The TMDS channels and the TMDS clock channel each include two differential signal lines. In the example in the drawing, only one channel is shown.

Further, control signal lanes of the HDMI system include a DDC line, a CEC line, an HPD line, a utility line, and a +5 V power-supply line. The DDC line is formed with two signal lines, which are an SDA line and an SCL line included in the HDMI cable 330. The DDC line is used by the source device 310 to read the EDID from the sink device 320, for example. The CEC line is used for bidirectional communication of control data between the source device 310 and the sink device 320.

In the TMDS channel, a current drive type that transmits data "0" or "1" by drawing a current from a 50Ω termination resistor to the side of the source device 310 is used, the 50Ω termination resistor being connected to the side of the sink device 320. At this time, a signal is differentially transmitted on the basis of a differential signal of D and D (bars). Note that, in the example shown in the drawing, the 50Ω termination resistor on the side of the source device 310 is used. However, it is also possible to perform driving only with the 50Ω terminating resistor on the sink device side without the use of this 50Ω in TMDS.

Under the HDMI standard, the sequence when the HDMI cable 330 is connected is specified. When both ends of the plug of the HDMI cable 330 are connected to the source device 310 and the sink device 320, respectively, a 5 V voltage is transmitted from the source device 310 to the sink device 320 via a +5 V power-supply line. When 5 V is detected in the sink device 320, 5 V is transmitted from the sink device 320 to the source device 310 via the HPD line, so that the source device 310 is notified that the cable is correctly connected.

When a control unit 311 of the source device 310 detects 5 V of the HPD line, the control unit 311 determines that the cable is connected, and then reads the EDID from an EDID ROM 321 on the side of the sink device 320, using the DDC line. After that, using a control line such as the DDC line, the source device 310 and the sink device 320 start exchanging signals of a high-bandwidth digital content protection system (HDCP) or the like. TMDS data transmission using the TMDS channel is started in the one direction from the source device 310 toward the sink device 320. Note that the source device 310 and the sink device 320 can exchange information by using a register prepared on the side of the sink device 320.

Figure 2:
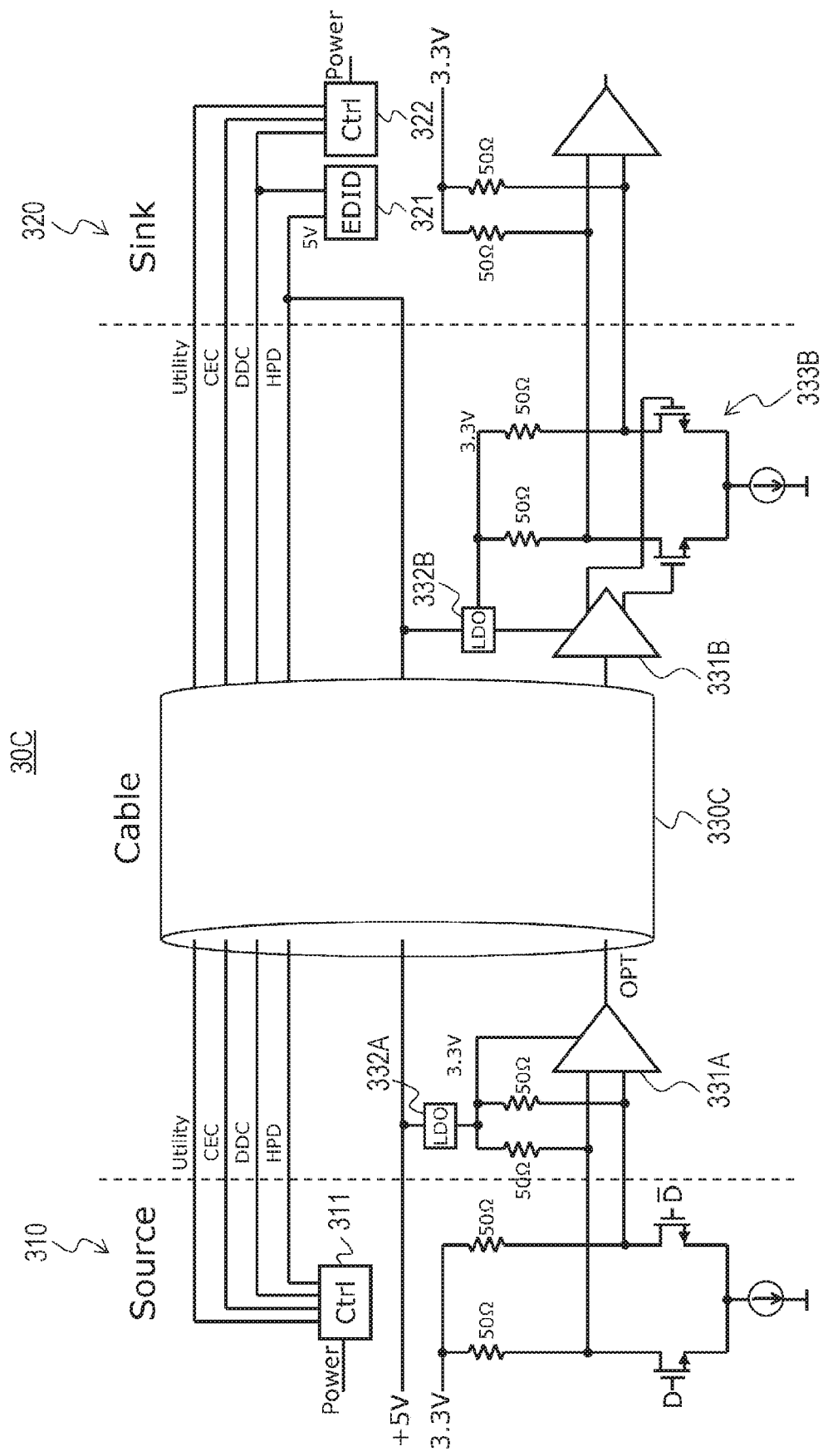
FIG. 2 is a diagram showing an example configuration of a transmission system in a case where an HDMI cable that is an AOC is used.

FIG. 2 shows an example configuration of a transmission system 30C in a case where an HDMI cable 330C that is an active optical cable (AOC) is used. In FIG. 2, the components corresponding to those shown in FIG. 1 are denoted by the same reference numerals as those used in FIG. 1, and explanation of them is not repeated herein.

In the case of this transmission system 30C, a conversion circuit 331A that converts electricity into light is present in the source-side plug of the HDMI cable 330C, and further, a conversion circuit 331B that converts light into electricity is present in the sink-side plug. These conversion circuits 331A and 331B are supplied with 3.3 V power obtained by low drop out (LDO) regulators 332A and 332B from +5 V of the +5 V power-supply line. Note that the conversion circuits 331A and 331B are elements for adjusting signal quality intervened by data lines (TMDS lines), and constitute a current consumption unit.

Also, in the source-side plug of the HDMI cable 330C, 3.3 V obtained by the LDO regulator 332A is applied as a bias voltage to a data line (TMDS line) through a 50Ω termination resistor. Further, in the sink-side plug of the HDMI cable 330C, a current drive unit 333B for differentially transmitting a signal on the basis of a differential signal obtained from the conversion circuit 331B is provided.

Figure 3:
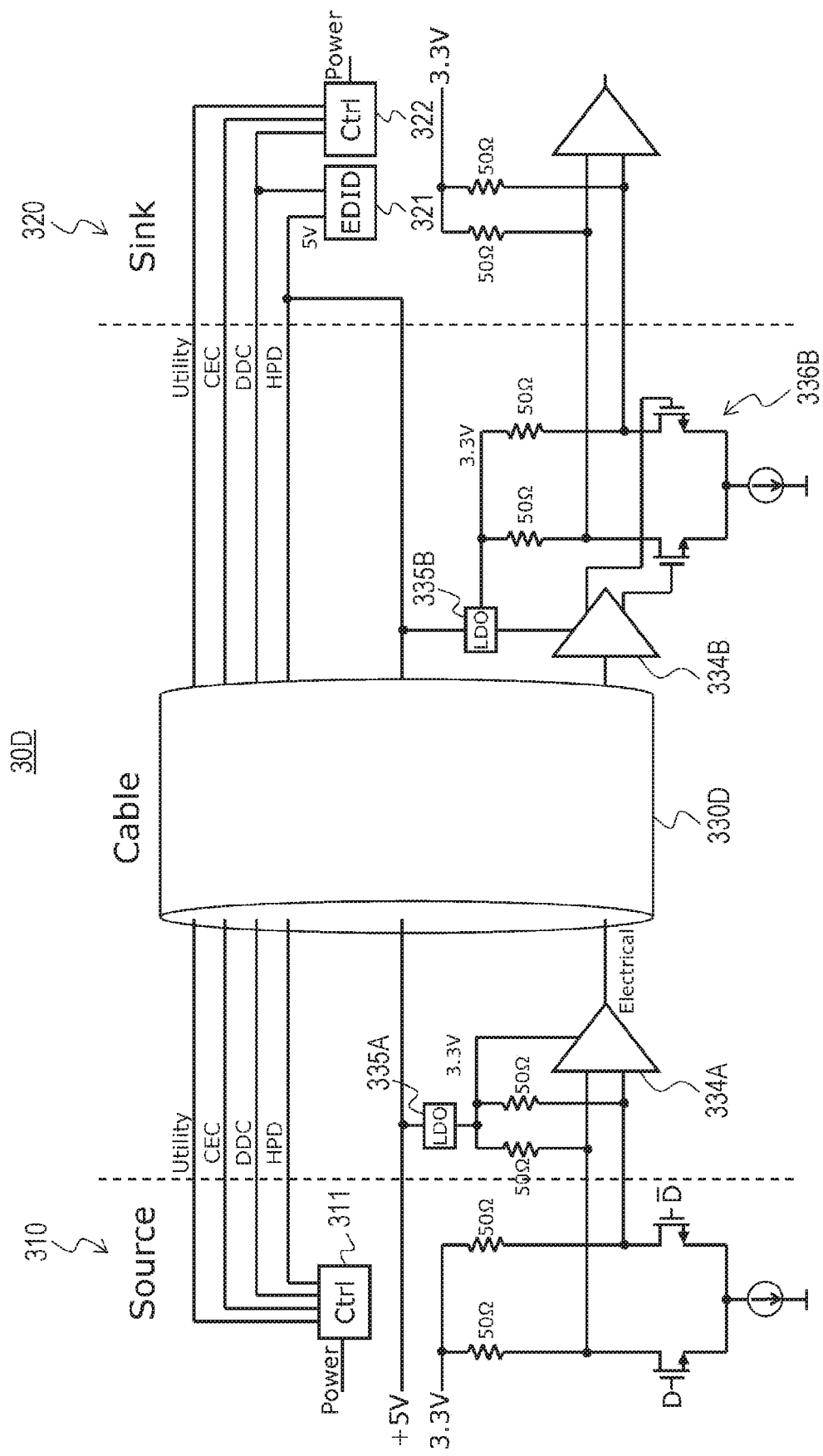
FIG. 3 is a diagram showing an example configuration of a transmission system in a case where an HDMI cable that is an ACC is used.

FIG. 3 shows an example configuration of a transmission system 30D in a case where an HDMI cable 330D that is an active copper cable (ACC) is used. In FIG. 3, the components corresponding to those shown in FIG. 1 are denoted by the same reference numerals as those used in FIG. 1, and explanation of them is not repeated herein.

In the case of this transmission system 30D, drive circuits 334A and 334B for driving electrical 50-Ω wiring lines are present in the plugs on both sides of the HDMI cable 330D. These drive circuits 334A and 334B are supplied with 3.3 V power obtained by LDO regulators 335A and 335B from +5 V of the +5 V power-supply line. Note that these drive circuits 334A and 334B are elements for adjusting signal quality intervened by data lines (TMDS lines), and constitute a current consumption unit.

Also, in the source-side plug of the HDMI cable 330D, 3.3 V obtained by the LDO 335A is applied as a bias voltage to a data line (TMDS line) through a 50Ω termination resistor. Further, in the sink-side plug of the HDMI cable 330D, a current drive unit 336B for differentially transmitting a signal on the basis of a differential signal obtained from the conversion circuit 334B is provided.

The minimum guaranteed value of a current that is output from the +5 V power-supply line in the source device 310 is 55 mA. In a case where the HDMI cable 330C, which is an AOC, is used (see FIG. 2), a circuit for converting electricity into light and a circuit for converting light into electricity are required at either end of the cable plug, and it is difficult to operate constantly at 55 mA. In a case where the cable tries to draw a current of 55 mA or higher from the source device that guarantees only 55 mA at this stage, there is a possibility that the source device cannot withstand overcurrent, and will break down. The same applies in a case where the HDMI cable 330D, which is an ACC, is used (see FIG. 3).

In this embodiment, the source device and the HDMI cable that form a transmission system each perform a different operation, depending on whether or not it is a compatible product, and whether or not the other is a compatible product. A compatible source device (a source device that is a compatible product) operates in a compatible mode in a case where a compatible cable (an HDMI cable that is a compatible product) is connected thereto, and operates in an incompatible mode in a case where an incompatible cable is connected thereto. An incompatible source device performs a normal operation in a case where either a compatible cable or an incompatible cable is connected thereto. Also, a compatible cable operates in a compatible mode in a case where a compatible source device is connected thereto, and operates in an incompatible mode in a case where an incompatible source device is connected thereto. An incompatible cable performs a normal operation in a case where either a compatible source device or an incompatible source device is connected thereto.

Furthermore, in this embodiment, an HDMI cable is a cable that transmits data in one direction, like an AOC cable, an ACC cable, or the like. This HDMI cable then determines whether or not the connection direction of the cable is the reverse direction. When the HDMI cable determines the connection direction to be the reverse direction, a notification unit notifies the user of the fact. Further, when the connection direction of the cable is the reverse direction, this HDMI cable sends the source device and sink device a notification to that effect, so that the notification unit can notify the user of the fact.

EXAMPLE 1

Figure 4:
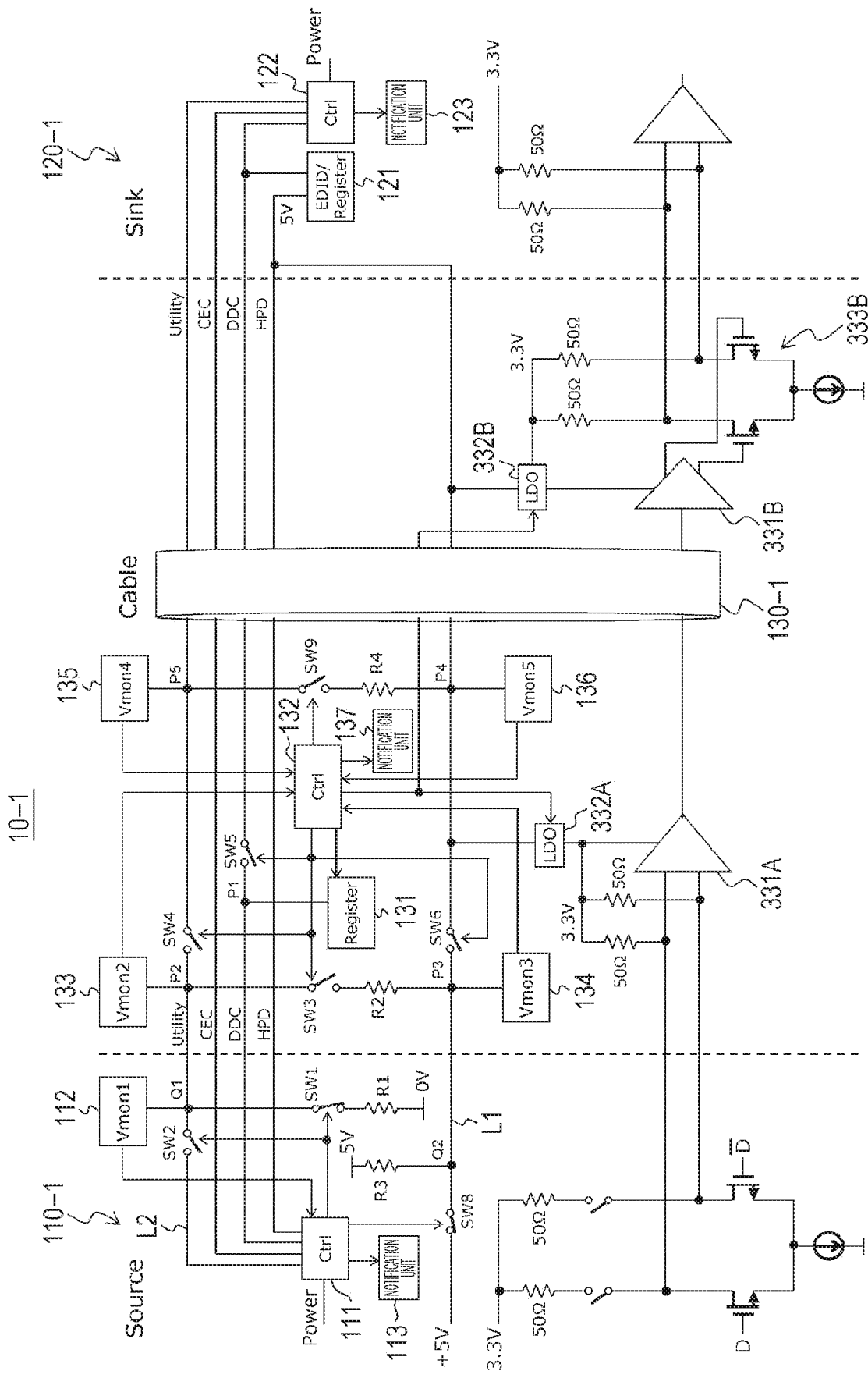
FIG. 4 is a diagram showing an example configuration (the HDMI cable being correctly connected) of a transmission system of Example 1.

FIG. 4 shows an example configuration of a transmission system 10-1. In FIG. 4, the components corresponding to the components shown in FIGS. 1 and 2 are denoted by the same reference numerals as those used in FIGS. 1 and 2, and detailed explanation of them is not repeated herein. This transmission system 10-1 is an HDMI transmission system that uses HDMI as a digital interface. This transmission system 10-1 includes a source device 110-1 as a transmission device, a sink device 120-1 as a reception device, and an HDMI cable 130-1 connecting these devices.

The HDMI cable 130-1 is an active optical cable (AOC) as a compatible cable. This HDMI cable 130-1 includes a register 131, a control unit 132, voltage monitor units 133, 134, 135, and 136, switches SW3, SW4, SW5, SW6, and SW9, and resistors R2 and R4 for voltage division. The HDMI cable 130-1 further includes AOC constituent circuits, such as conversion circuits 331A and 331B, LDO regulators 332A and 332B, and a current drive unit 333B, and a notification unit 137.

The register 131 is connected to the DDC line at point P1. The switch SW5 is inserted at a point closer to the side of the sink device 120-1 than the point P1 of the DDC line. A series circuit of the resistor R2 and the switch SW3 is connected between point P2 of the utility line and point P3 of the +5 V power-supply line. As a result, in a case where +5 V power is supplied to the point P3 of the power-supply line, 5 V is applied to the point P2 of the utility line via the series circuit of the resistor R2 and the switch SW3. The switch SW4 is inserted at a point closer to the side of the sink device 120-1 than the point P2 of the utility line. Further, the switch SW6 is inserted at a point closer to the side of the sink device 120-1 than the point P3 of the +5 V power-supply line.

The voltage monitor unit 133 monitors the voltage at the point P2 of the utility line, and sends the monitor result to the control unit 132. The voltage monitor unit 134 monitors the voltage at the point P3 of the +5 V power-supply line, and sends the monitor result to the control unit 132. Power is supplied to the LDO regulators 332A and 332B from a point closer to the side of the sink device 120-1 than the insertion position of the switch SW6 of the +5 V power-supply line. The control unit 132 controls operation of each component of the HDMI cable 130-1.

Further, a series circuit of the resistor R4 and the switch SW9 is connected between point P4 closer to the side of the sink device 120-1 than the switch SW6 of the power-supply line and point P5 closer to the side of the sink device 120-1 than the switch SW4 of the utility line. As a result, in a case where +5 V power is supplied to the point P4 of the +5 V power-supply line, 5 V is applied to the point P5 of the utility line via the series circuit of the resistor R4 and the switch SW9. The voltage monitor unit 135 monitors the voltage at the point P5 of the utility line, and sends the monitor result to the control unit 132. The voltage monitor unit 136 monitors the voltage at the point P4 of the +5 V power-supply line, and sends the monitor result to the control unit 132.

The notification unit 137 is formed with an LED, a buzzer, and the like. In a case where the connection direction of the HDMI cable 130-1 is the reverse direction, the notification unit 137 notifies the user of the fact through light emission, a buzzer sound, or the like, under the control of the control unit 132.

The source device 110-1 is a compatible source device. This source device 110-1 includes a voltage monitor unit 112, a notification unit 113, switches SW1, SW2, and SW8, and resistors R1 and R3 for voltage division, in addition to a control unit 111 that controls operation of each component. To reduce current consumption, the resistors R2 and R4 of the HDMI cable 130-1 described above and the resistors R1 and R3 of this source device 110-1 each preferably have a reasonably large value. In the description below, R1=400 kΩ, R2=50 kΩ, R3=100 kΩ, and R4=300 kΩ. Note that the resistance value is not limited to this.

A series circuit of the resistor R1 and the switch SW1 is connected between point Q1 of a second path L2 connected to the utility line of the HDMI cable 130-1 and the ground. As a result, 0 V, which is the ground voltage, is applied to the point Q1 via the series circuit of the resistor R1 and the switch SW1. The switch SW2 is inserted on the opposite side of the point Q1 of the second path L2 from the terminal side. The voltage monitor unit 112 monitors the voltage at the point Q1, and sends the monitor result to the control unit 111. Further, 5 V power is applied, via the resistor R3, to point Q2 of a first path L1 connected to the +5 V power-supply line of the HDMI cable 130-1. The switch SW8 is inserted on the opposite side of the point Q2 of the first path L1 from the terminal side.

The notification unit 113 is formed with a display unit, a speaker, an LED, a buzzer, and the like. In a case where the connection direction of the HDMI cable 130-1 is the reverse direction, the notification unit 113 notifies the user of the fact through display, sound, light emission, a buzzer sound, or the like, under the control of the control unit 111.

The sink device 120-1 includes an EDID/register 121 and a notification unit 123, in addition to a control unit 122 that controls operation of each component. Using the register in the EDID/register 121, the source device 110-1 and the sink device 120-1 can exchange information. The notification unit 123 is formed with a display unit, a speaker, an LED, a buzzer, and the like. In a case where the connection direction of the HDMI cable 130-1 is the reverse direction, the notification unit 123 notifies the user of the fact through display, sound, light emission, a buzzer sound, or the like, under the control of the control unit 122.

In the transmission system 10-1 shown in FIG. 4, the HDMI cable 130-1 is a compatible cable, and the source device 110-1 is a compatible source device. Therefore, as shown in the drawing, in a case where the connection direction of the HDMI cable 130-1 is correct, the source device 110-1 determines the connected HDMI cable to be a compatible cable, and operates in the compatible mode. Likewise, the HDMI cable 130-1 determines the connected source device to be a compatible source device, and operates in the compatible mode.

A negotiation operation between the source device 110-1 and the HDMI cable 130-1 is now described in detail. In FIG. 4, the source device 110-1 and the HDMI cable 130-1 exhibit an initial state. In the source device 110-1, in the initial state, the switches SW1 and SW8 are in a short-circuited state (a connected state), and the switch SW2 is in an open state. In the HDMI cable 130-1, on the other hand, in the initial state, the switches SW3, SW4, SW5, and SW6 are in an open state (an unconnected state).

Figure 5:
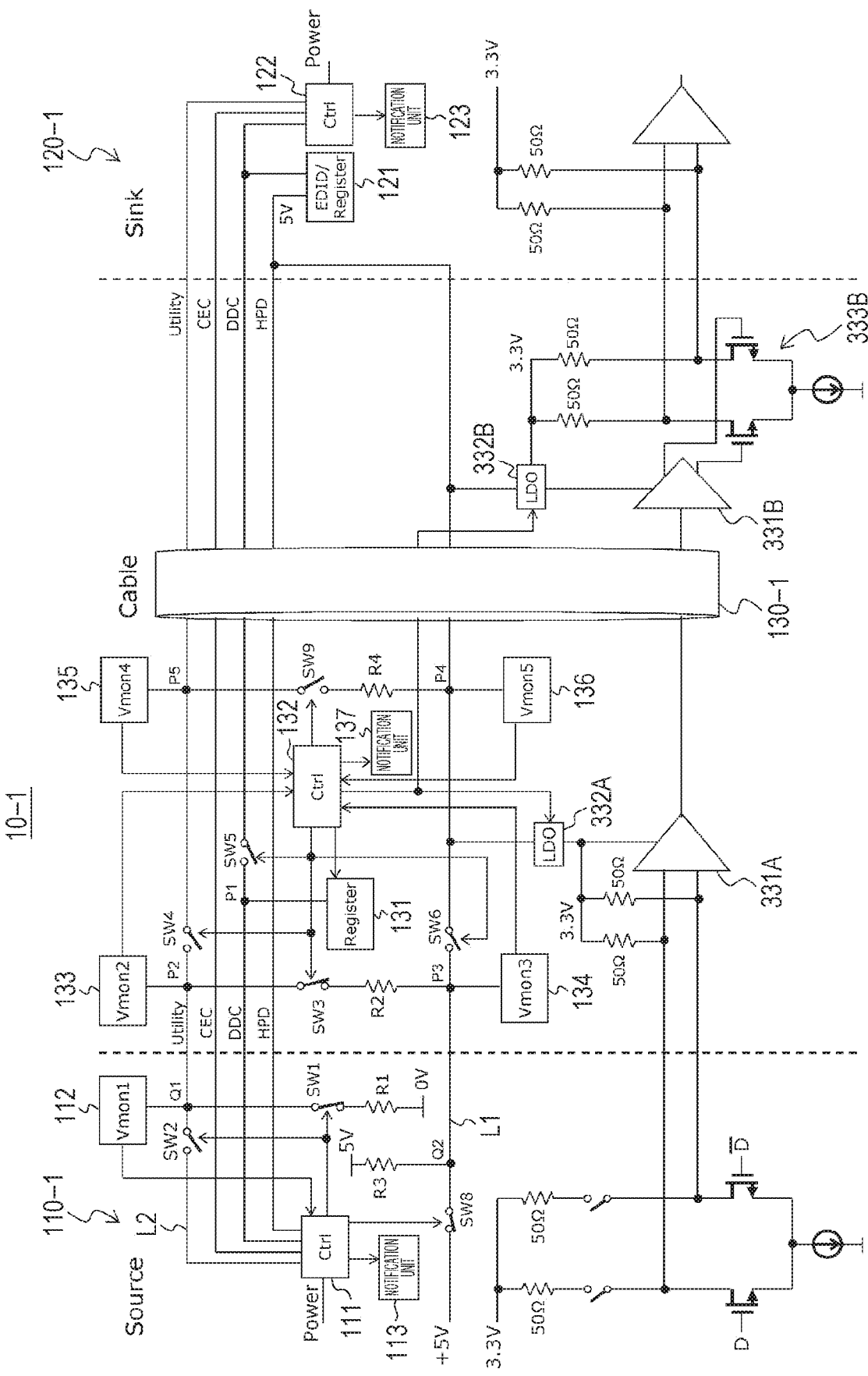
FIG. 5 is a diagram for explaining an operation of the transmission system shown in FIG. 4.

Receiving a monitor result from the voltage monitor unit 134, the control unit 132 of the HDMI cable 130-1 detects that the voltage at the point P3 of the +5 V power-supply line, which is the voltage of the +5 V power-supply line, is stabilized at 5 V, and puts the switch SW3 into a short-circuited state, as shown in FIG. 5. As the switch SW3 is put into a short-circuited state after the voltage of the power-supply line stabilizes at 5 V as described above, it is possible to avoid a change in the timing to start a negotiation between the source device 110-1 and the HDMI cable 130-1 due to an instable state of the voltage of the power-supply line at a time of cable insertion.

When the switch SW3 is put into a short-circuited state, the resistors R1 and R2 are connected in series between the ground (0 V) of the source device 110-1 and the +5 V power-supply line of the HDMI cable 130-1, and a voltage of 3.33 V is obtained at the points Q1 and P2 through resistance voltage division.

The voltage monitor unit 112 of the source device 110-1 monitors that the voltage at the point Q1 is 3.33 V, and sends the monitor result to the control unit 111. On the basis of this monitor result, the control unit 111 determines that there is a connection with an HDMI cable that is a compatible cable. Likewise, the voltage monitor unit 133 of the HDMI cable 130-1 monitors that the voltage at the point P2 is 3.33 V, and sends the monitor result to the control unit 132. On the basis of this monitor result, the control unit 132 determines that there is a connection with a source device that is a compatible source device.

Here, the switch SW2 is in an open state in the source device 110-1. Therefore, the voltage of 3.33 V is not transmitted to the inside of the source device 110-1, and does not affect the inside of the source device 110-1. Likewise, the switch SW4 is in an open state in the HDMI cable 130-1. Therefore, the voltage of 3.33 V is not transmitted to the sink device 120-1, and does not affect the sink device 120-1.

Figure 6:
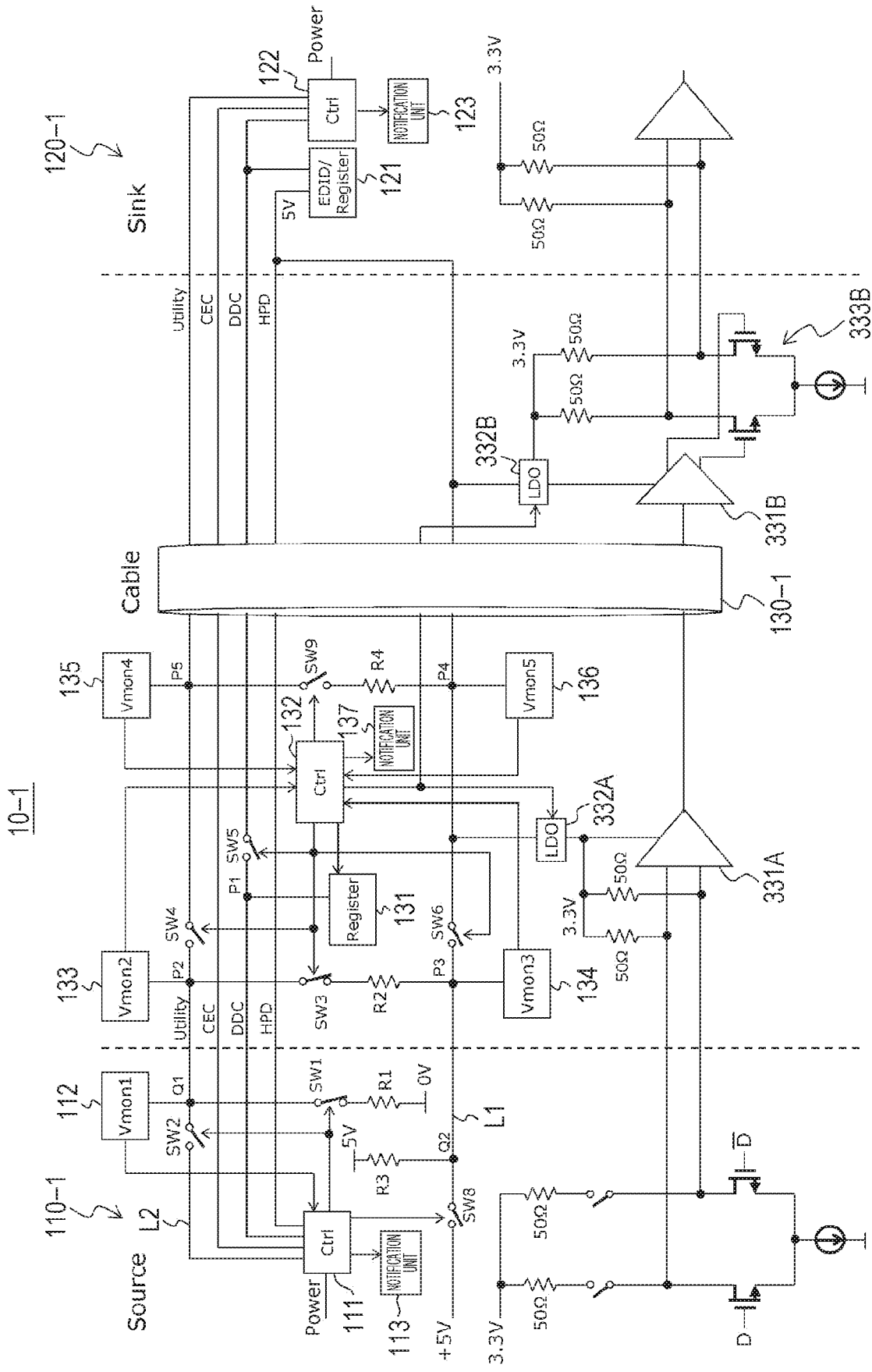
FIG. 6 is a diagram for explaining an operation of the transmission system shown in FIG. 4.

On the basis of the 3.33 V monitor result from the voltage monitor unit 112, the control unit 111 of the source device 110-1 puts the switch SW8 into an open state, as shown in FIG. 6. Here, the resistor R3 is connected in series to the resistors R1 and R2, and a voltage of 2 V is obtained at the points Q1 and P2 through resistance voltage division.

Here, in a case where a relay device such as a repeater that separates the +5 V power-supply line is connected between the source device 110-1 and the HDMI cable 130-1, the voltage to be generated by the resistor R3 does not change. Accordingly, obtaining a voltage of 2 V at the points Q1 and P2 means that a relay device such as a repeater is not connected.

The voltage monitor unit 112 of the source device 110-1 monitors that the voltage at the point Q1 has changed to 2 V, and sends the monitor result to the control unit 111. On the basis of the monitor result, the control unit 111 determines that any relay device such as a repeater that separates the +5 V power-supply line is not connected to the compatible cable, and performs control to operate in the compatible mode.

Likewise, the voltage monitor unit 133 of the HDMI cable 130-1 monitors that the voltage at the point P2 has changed to 2 V, and sends the monitor result to the control unit 132. On the basis of the monitor result, the control unit 132 determines that any relay device such as a repeater that separates the +5 V power-supply line is not connected to the compatible source device, and performs control to operate in the compatible mode.

Note that, in a case where a relay device such as a repeater that separates the +5 V power-supply line is connected between the source device 110-1 and the HDMI cable 130-1, the voltage at the points Q1 and P2 remains 3.33 V even when the switch SW8 is put into an open state. In this case, the control unit 111 of the source device 110-1 controls the state switching of the switch SW8. Therefore, even if the state of the switch SW8 is switched, the voltage at the point Q1 remains 3.33V. Accordingly, it can be determined that a relay device such as a repeater is connected between the source device 110-1 and the HDMI cable 130-1.

However, the timing at which the state of the switch SW8 of the source device 110-1 is switched is not clear. Therefore, the control unit 132 of the HDMI cable 130-1 cannot determine that a relay device such as a repeater is connected between the source device 110-1 and the HDMI cable 130-1, from a result of voltage monitoring at the point P2. Therefore, in this case, the control unit 111 of the source device 110-1 puts the switch SW1 into an open state, and sets the voltage at the point P2 of the utility line to 5 V. The control unit 111 then notifies the control unit 132 of the HDMI cable 130-1 that a relay device such as a repeater is connected between the source device 110-1 and the HDMI cable 130-1.

In a case where a relay device such as a repeater is connected between the source device 110-1 and the HDMI cable 130-1 as described above, the source device 110-1 and the HDMI cable 130-1 carries out predetermined procedures, to move on to a normal operation.

In a case where any relay device such as a repeater is not connected between the source device 110-1 and the HDMI cable 130-1, the source device 110-1 is controlled to operate in the compatible mode. Therefore, the control unit 111 accesses (reads/writes) the register 131 of the HDMI cable 130-1 via the DDC line. In this case, the control unit 111 can read and use the specification information and the like about the HDMI cable 130-1 existing in the register 131, and write information about the current supply capacity of the source device 110-1. After moving on to a normal operation, the control unit 132 of the HDMI cable 130-1 can read and use the information about the current supply capability of the source device 110-1 written in the register 131.

Note that, in a case where the control unit 111 accesses (reads/writes) the register 131 via the DDC line, the switch SW5 is in an open state. Accordingly, transmission of access information about the register 131 to the sink device 120-1 can be prevented, and malfunctioning of the sink device 120-1 having no corresponding address defined is avoided.

Figure 7:
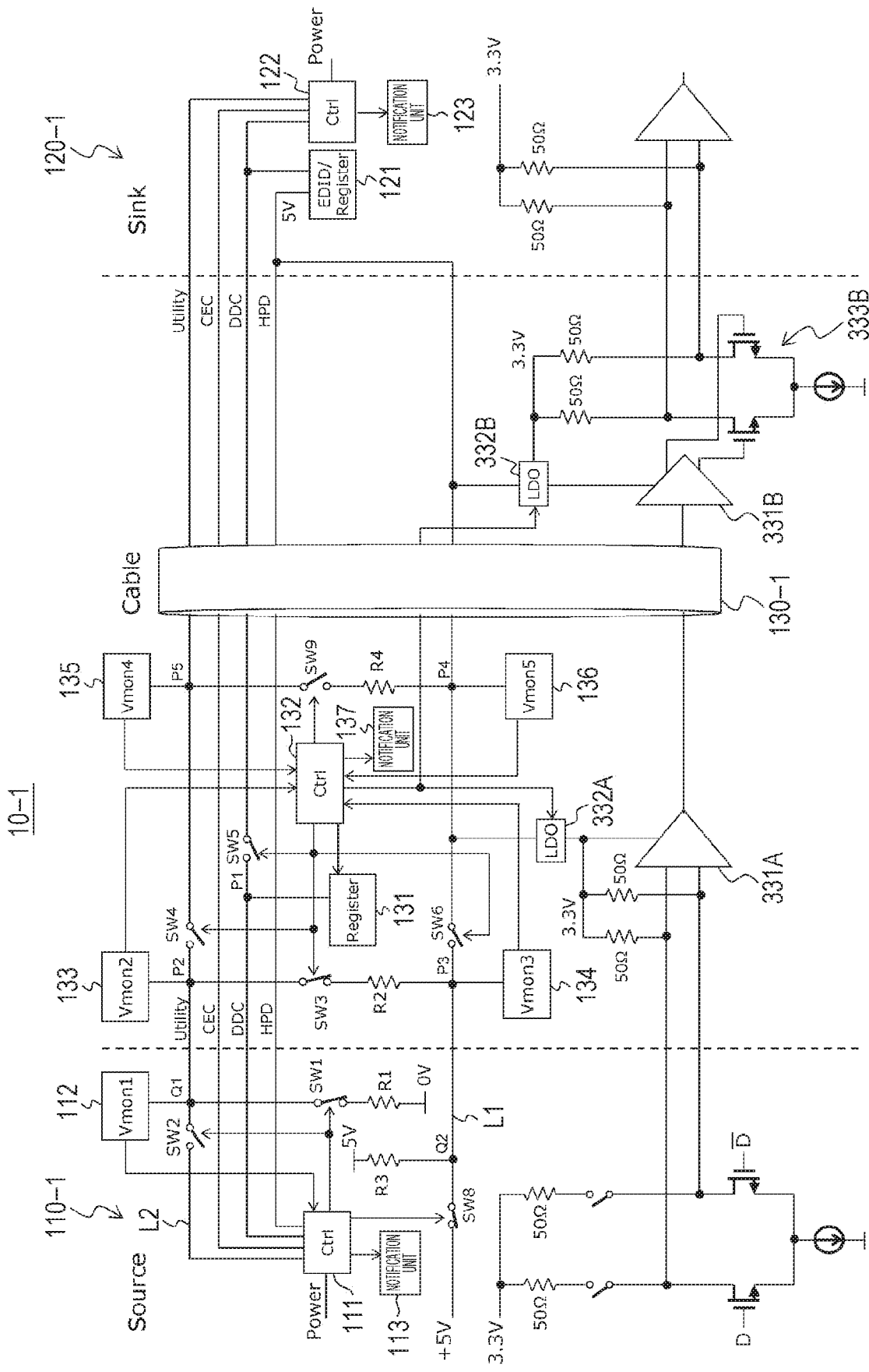
FIG. 7 is a diagram for explaining an operation of the transmission system shown in FIG. 4.

After completing the above access (read/write) to the register 131, the control unit 111 of the source device 110-1 puts the switch SW8 into a short-circuited state, as shown in FIG. 7. Therefore, the voltage at the point P2 of the utility line returns to 3.33 V. In the HDMI cable 130-1, the voltage monitor unit 133 monitors that the voltage at the point P2 has changed to 3.33 V, and sends the monitor result to the control unit 132.

Figure 8:
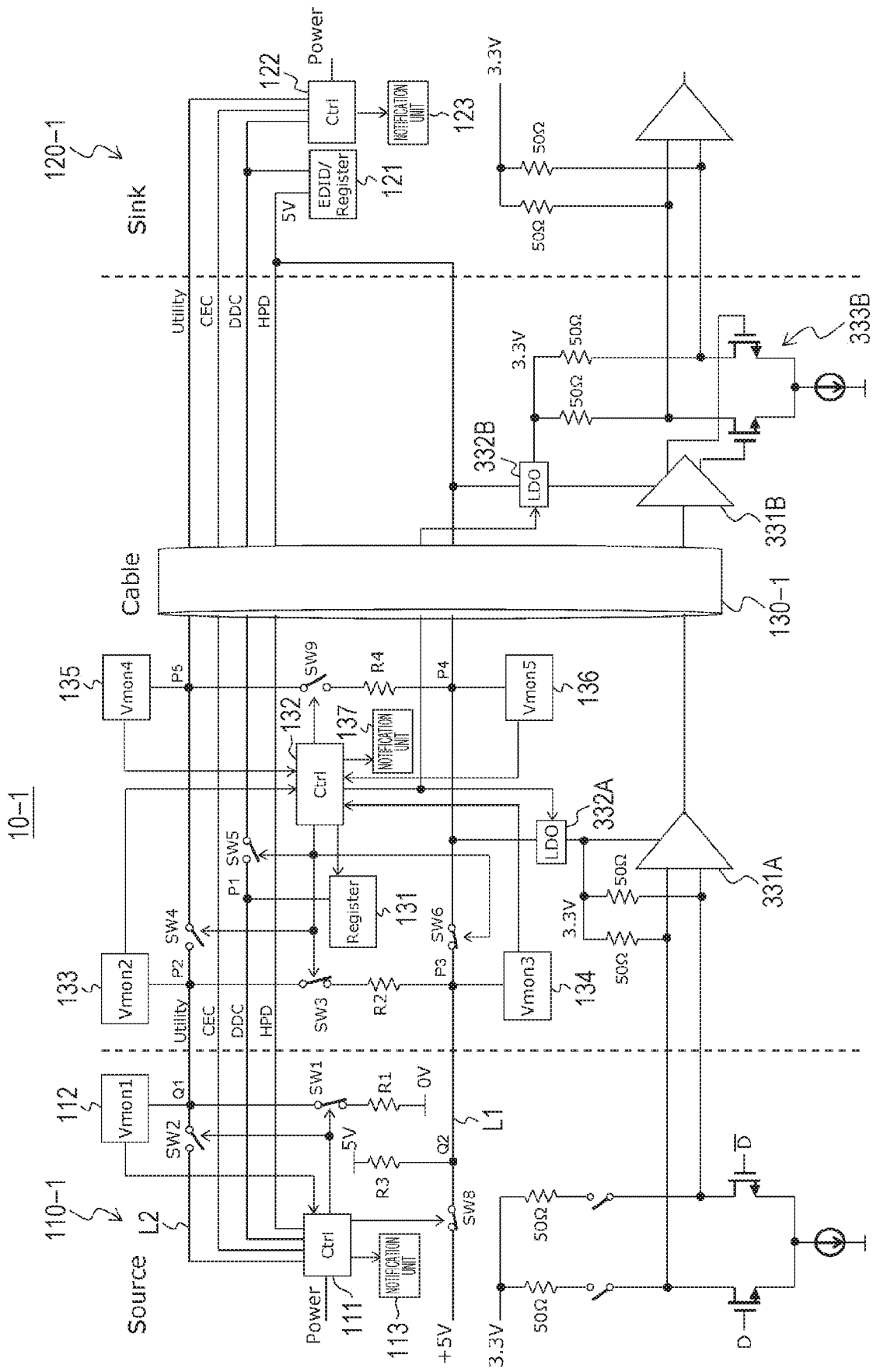
FIG. 8 is a diagram for explaining an operation of the transmission system shown in FIG. 4.

On the basis of this monitor result, the control unit 132 puts the switch SW6 into a short-circuited state, as shown in FIG. 8. In a case where the switch SW6 is put into a short-circuited state in this manner, so that a 5 V voltage is sent from the source device 110-1 to the sink device 120-1 through the +5 V power-supply line, the sink device 120-1 is enabled to send a 5 V voltage (a connection detection signal) to the source device 110-1 via the HPD line.

In this case, the switch SW1 of the source device 110-1 is in a short-circuited state, and the switch SW3 of the HDMI cable 130-1 is also in a short-circuited state. Therefore, the voltage at the point Q1 is 3.33 V. Accordingly, in a case where the HDMI cable 130-1 is removed from the source device 110-1, the control unit 111 of the source device 110-1 can detect that from a monitor result supplied from the voltage monitor unit 112, and is enabled to take measures such as returning the switches to the initial state so as to prevent malfunction.

Figure 9:
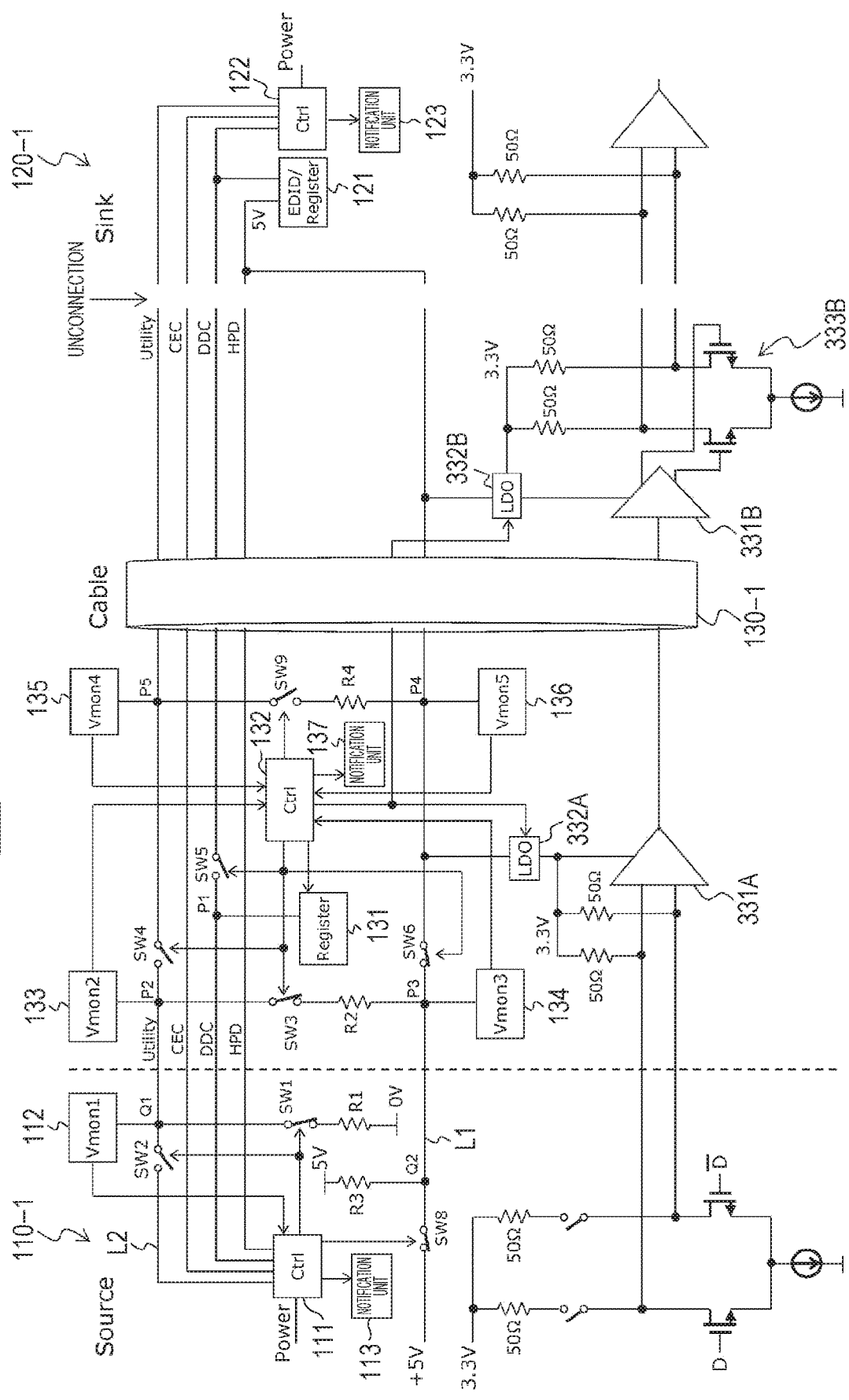
FIG. 9 is a diagram for explaining an operation of the transmission system shown in FIG. 4.

For example, as shown in FIG. 9, in a case where the sink device 120-1 is in an unconnected state with respect to the HDMI cable 130-1, the sink device 120-1 continues to be in a state not to send a 5 V voltage (a connection detection signal) to the source device 110-1 via the HPD line. In a case where the HDMI cable 130-1 is removed from the source device 110-1 in this state, the voltage at the point Q1 changes from 3.33 V to 0 V. Accordingly, the control unit 111 of the source device 110-1 can detect that the HDMI cable 130-1 has been removed from the source device 110-1.

Figure 10:
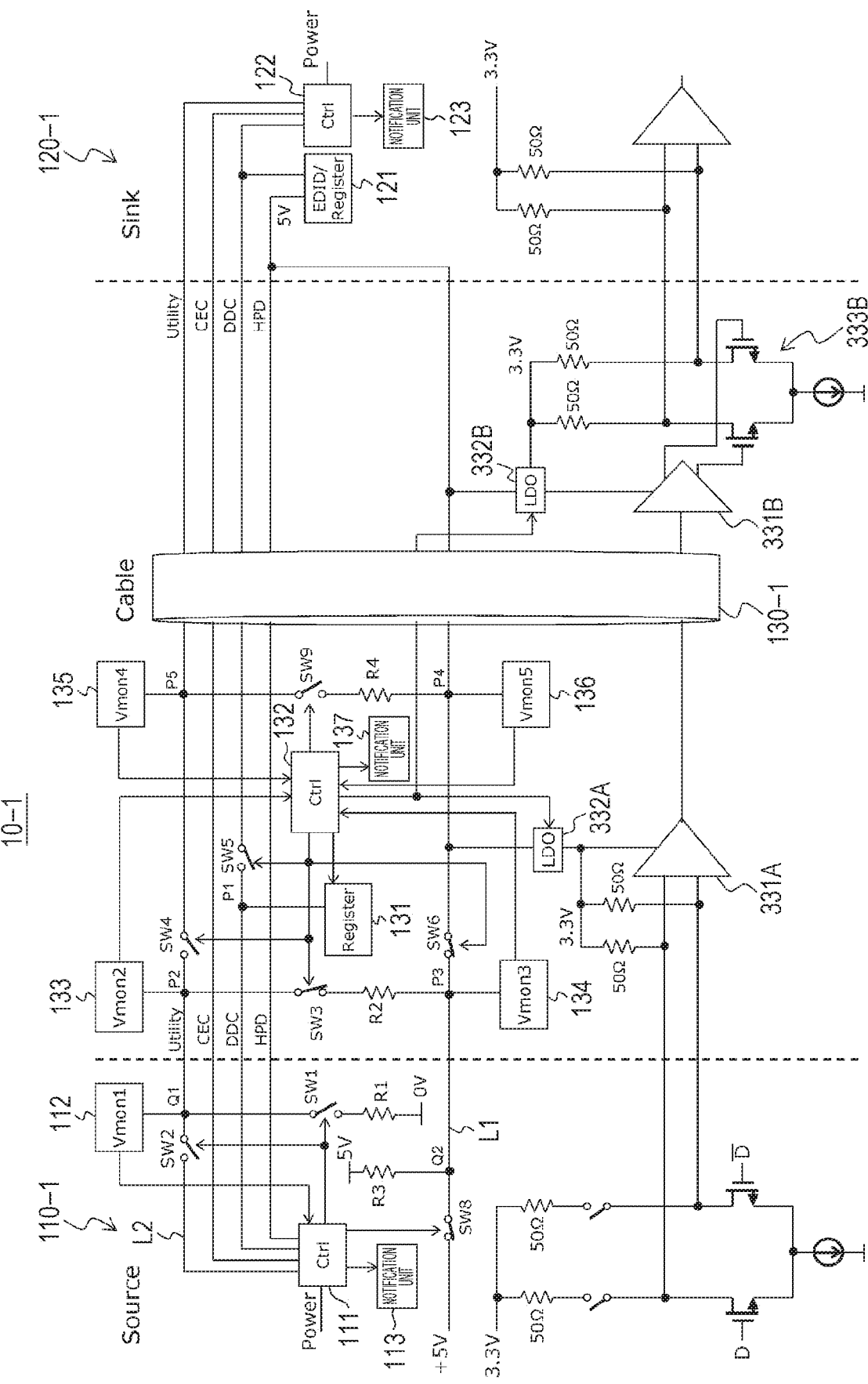
FIG. 10 is a diagram for explaining an operation of the transmission system shown in FIG. 4.

When the 5 V voltage (connection detection signal) is sent from the sink device 120-1 to the source device 110-1 via the HPD line, the control unit 111 of the source device 110-1 recognizes that cable preparation has been completed, and puts the switch SW1 into an open state, as shown in FIG. 10. Therefore, the voltage at the point P2 of the utility line changes to 5 V.

In the HDMI cable 130-1, the voltage monitor unit 133 monitors that the voltage at the point P2 is 5 V, and sends the monitor result to the control unit 132.

Figure 11:
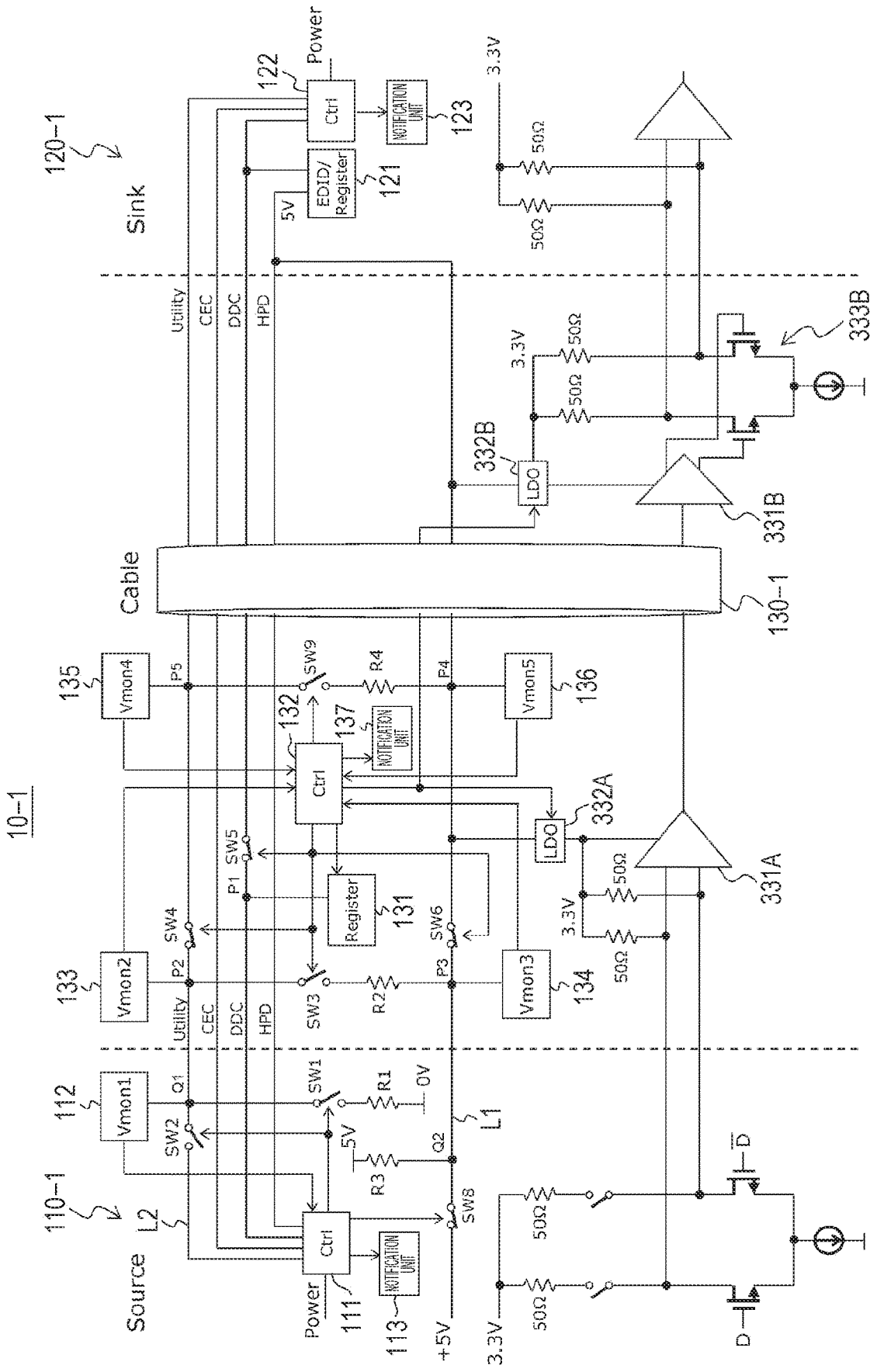
FIG. 11 is a diagram for explaining an operation of the transmission system shown in FIG. 4.
Figure 12:
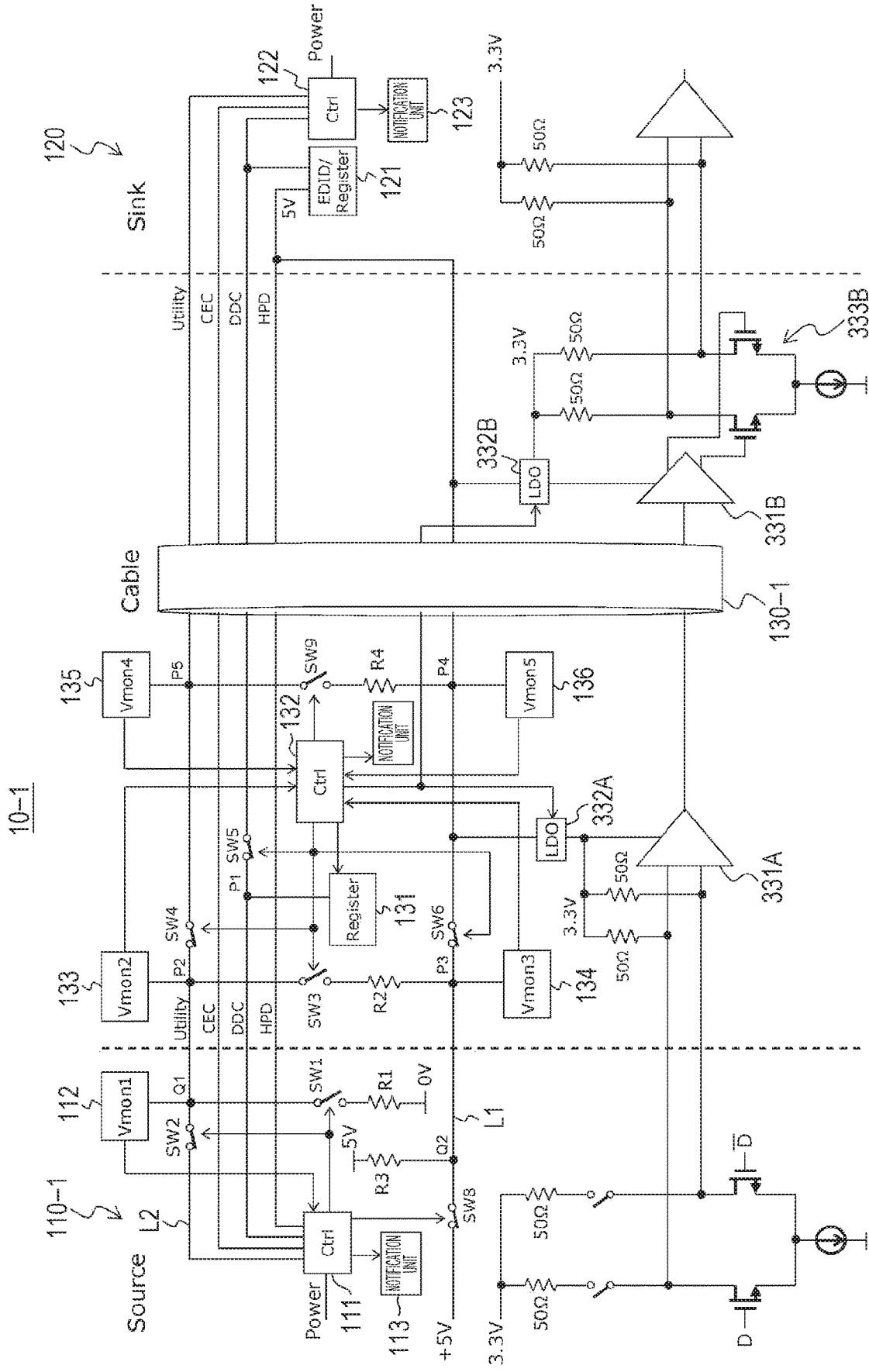
FIG. 12 is a diagram for explaining an operation of the transmission system shown in FIG. 4.

On the basis of the monitor result, the control unit 132 changes the state of each switch, and moves on to a normal operation, as shown in FIG. 11. In this case, the switch SW3 is first put into an open state, the switch SW4 is then put into a short-circuited state, and the switch SW5 is also put into a short-circuited state, so as not to affect the sink device. When a certain stand-by time has passed since the control unit 111 of the source device 110-1 put the switch SW1 into an open state, the control unit 111 further puts the switch SW2 into a short-circuited state, and moves on to a normal operation, as shown in FIG. 12.

In the case described above, the register 131 exists in the HDMI cable 130-1. However, in a case where it is known that there is no register access from the source device 110-1, the HDMI cable 130-1 may not have the register 131 and the switch SW5. Note that, in a case where it is not clear whether or not there is register access from the source device 110-1, even if the HDMI cable 130-1 does not have the register 131, it is possible to prevent transmission of an undefined address to the sink device 120-1 and avoid the occurrence of malfunction in the sink device 120-1 by adopting the switch SW5.

As described above, in the transmission system 10-1 shown in FIG. 4, after the voltage of the +5 V power-supply line stabilizes at 5 V, the switch SW3 of the HDMI cable 130-1 is put into a short-circuited state, the resistors R1 and R2 are connected in series between the ground (0 V) of the source device 110-1 and the +5 V power-supply line of the HDMI cable 130-1, and a voltage of 3.33 V is obtained at the points Q1 and P2. Accordingly, the source device 110-1 can determine that there is a compatible HDMI cable connection, and the HDMI cable 130-1 can determine that there is a compatible source device connection.

Also, in the transmission system 10-1 shown in FIG. 4, the switch SW8 is put into an open state, the resistors R1, R2, and R3 are connected in series between the ground (0 V) of the source device 110-1 and the 5 V power supply, and a voltage of 2 V is obtained at the points Q1 and P2. Accordingly, the source device 110-1 and the HDMI cable 130-1 can determine that any relay device such as a repeater that separates the +5 V power-supply line does not exist in between.

Further, in the transmission system 10-1 shown in FIG. 4, the switch SW1 is in a short-circuited state until the source device 110-1 receives a connection detection signal from the sink device 120-1 via the HPD line, and a voltage of 3.33 V is obtained at the point Q1. Accordingly, in a case where the HDMI cable 130-1 is removed from the source device 110-1, the voltage at the point Q1 changes from 3.33 V to 0 V. Thus, the source device 110-1 can detect the removal, and can take measures such as returning the switches to the initial state so as not to cause any malfunction.

Figure 13:
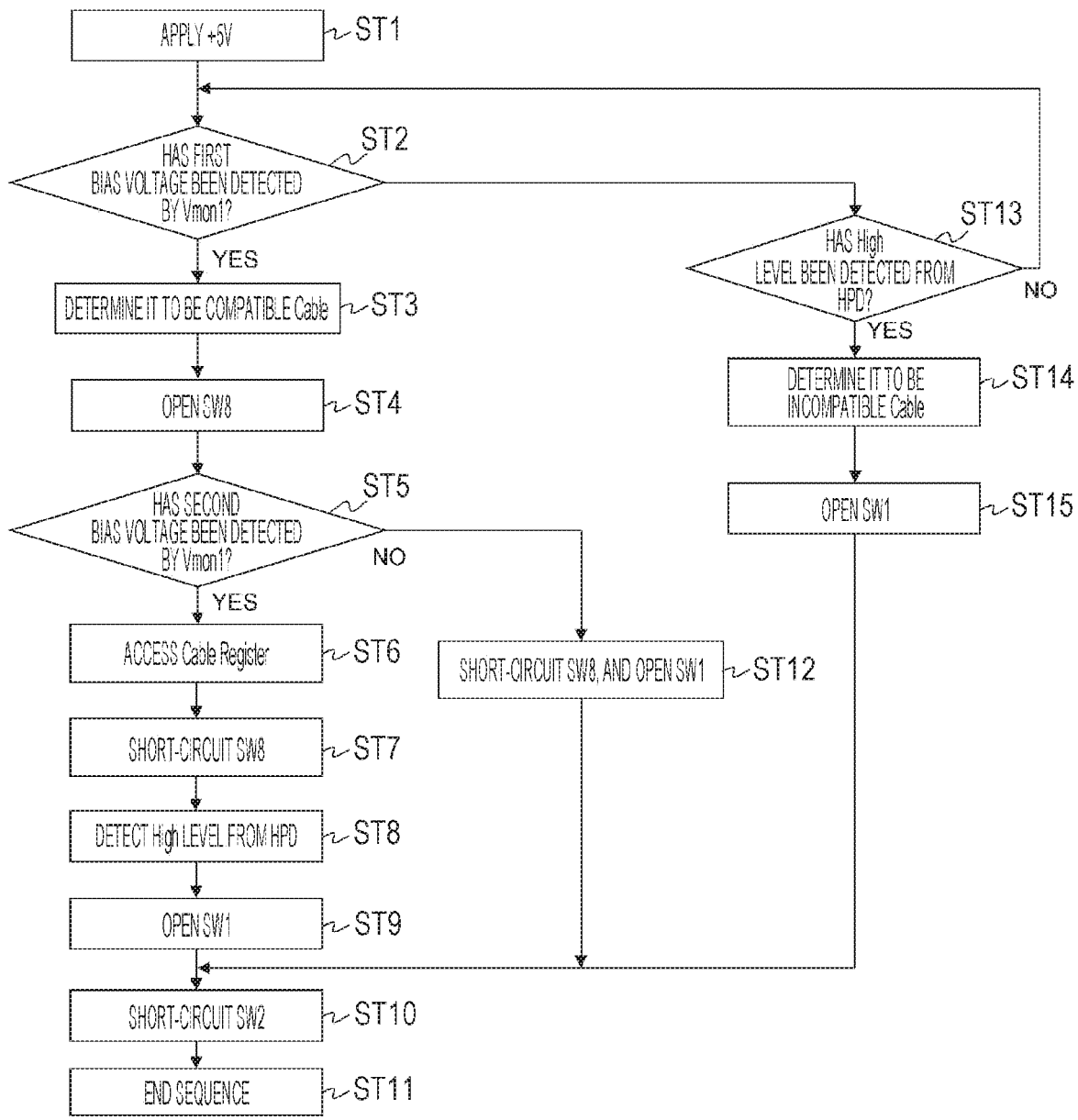
FIG. 13 is a diagram showing an example sequence in a negotiation operation of the source device in the transmission system shown in FIG. 4.

FIG. 13 shows an example sequence in a negotiation operation of the source device 110-1, which is a compatible source device. In step ST1, when the power switch is turned on, and +5 V is applied, for example, the sequence is started and moves on to step ST2. In step ST2, the control unit 111 determines whether the voltage monitor unit 112 has detected a first bias voltage (3.33 V).

If the first bias voltage (3.33 V) has been detected, the control unit 111 determines in step ST3 that an HDMI cable that is a compatible cable is connected. In step ST4, the control unit 111 then changes the switch SW8 from a short-circuited state to an open state.

Next, in step ST5, the control unit 111 determines whether the voltage monitor unit 112 has detected a second bias voltage (2 V). If the second bias voltage (2 V) has been detected, the control unit 111 determines that any relay device such as a repeater that separates the +5 V power-supply line is not interposed between the device and the HDMI cable 130-1, and the sequence moves on to step ST6. In step ST6, the control unit 111 accesses (reads/writes) the register 131 of the HDMI cable. After the access to the register 131 is completed, in step ST7, the control unit 111 then changes the switch SW8 from an open state to a short-circuited state.

Next, if the control unit 111 detects that the HPD line has switched to the high level (5 V) in step ST8, the control unit 111 changes the switch SW1 from a short-circuited state to an open state in step ST9. After a certain stand-by time, the control unit 111 then changes the switch SW2 from an open state to a short-circuited state in step ST10. After that, in step ST11, the sequence is ended.

If the second bias voltage (2 V) is not detected in step ST5, on the other hand, the control unit 111 determines that a relay device such as a repeater that separates the +5 V power-supply line is interposed between the device and the HDMI cable, and the sequence moves on to step ST12. In step ST12, the control unit 111 changes the switch SW8 from an open state to a short-circuited state, and further changes the switch SW1 from a short-circuited state to an open state. In step ST10, the control unit 111 then changes the switch SW2 from an open state to a short-circuited state. In step ST11, the sequence is then ended.

If the first bias voltage (3.33 V) is not detected in step ST2, on the other hand, the control unit 111 determines in step ST13 whether or not the high level (5 V) of the HPD line has been detected. If the high level (5 V) of the HPD line is not detected, the sequence returns to step ST2. If the high level (5 V) of the HPD line is detected, on the other hand, the control unit 111 determines in step ST14 that the HDMI cable, which is an incompatible cable, is connected.

In step ST15, the switch SW1 is then changed from a short-circuited state to an open state. Next, in step ST10, the control unit 111 changes the switch SW2 from an open state to a short-circuited state. In step ST11, the sequence is then ended.

Figure 14:
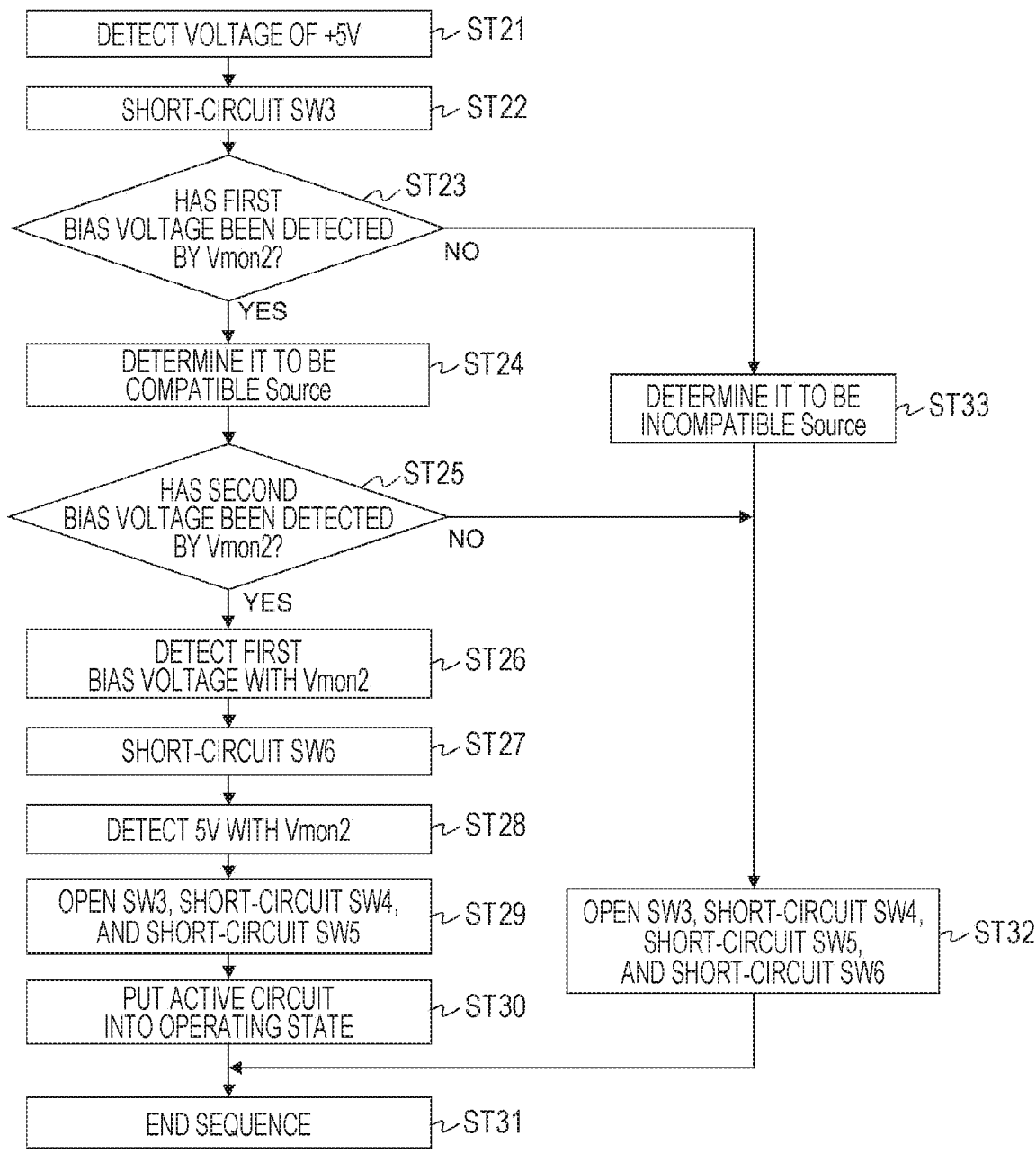
FIG. 14 is a diagram showing an example sequence in a negotiation operation of the HDMI cable in the transmission system shown in FIG. 4.

FIG. 14 shows an example sequence in a negotiation operation of the HDMI cable 130-1, which is a compatible cable. In step ST21, when the voltage monitor unit 134 detects a voltage of 5 V, the sequence is started, and moves on to step ST22. In step ST22, the control unit 132 changes the switch SW3 from an open state to a short-circuited state after the 5 V voltage of the +5 V power-supply line stabilizes.

Next, in step ST23, the control unit 132 determines whether the voltage monitor unit 133 has detected the first bias voltage (3.33 V). If the first bias voltage (3.33 V) has been detected, the control unit 132 determines in step ST24 that a source device that is a compatible source device is connected.

Next, in step ST25, the control unit 132 determines whether the voltage monitor unit 133 has detected the second bias voltage (2 V). If the second bias voltage (2 V) has been detected, the control unit 132 determines that any relay device such as a repeater that separates the +5 V power-supply line is not interposed between the cable and the source device, and the sequence moves on to step ST26. In step ST26, if the voltage monitor unit 133 detects the first bias voltage (3.33 V), the sequence moves on to step ST27.

In step ST27, the control unit 132 changes the switch SW6 from an open state to a short-circuited state. Next, after 5 V is detected by the voltage monitor unit 133 in step ST28, the control unit 132 in step ST29 changes the switch SW3 from a short-circuited state to an open state, changes the switch SW4 from an open state to a short-circuited state, and further changes the switch SW5 from an open state to a short-circuited state.

Next, in step ST30, the control unit 132 turns on the LDO regulators 332A and 332B and puts the active circuit into an operating state (Enabled), on the basis of current supply capacity information given from the source device 110-1 through the register 131, which is information indicating that the cable may draw a current of 55 mA or more. In step ST31, the sequence is then ended.

If the second bias voltage (2 V) is not detected in step ST25, on the other hand, the control unit 132 determines, after the voltage monitor unit 133 detects 5 V, that a relay device such as a repeater that separates the +5 V power-supply line is interposed between the cable and the source device, and the sequence moves on to step ST32. In step ST32, the control unit 132 changes the switch SW3 from a short-circuited state to an open state, changes the switch SW4 from an open state to a short-circuited state, changes the switch SW5 from an open state to a short-circuited state, and further changes the switch SW6 from an open state to a short-circuited state. In step ST31, the sequence is then ended.

If the first bias voltage (3.33 V) is not detected in step ST23, on the other hand, the control unit 132 determines in step ST33 that a source device that is an incompatible source device is connected. In step ST32, the control unit 132 then changes the switch SW3 from a short-circuited state to an open state, changes the switch SW4 from an open state to a short-circuited state, changes the switch SW5 from an open state to a short-circuited state, and further changes the switch SW6 from an open state to a short-circuited state. In step ST31, the sequence is then ended.

Figure 15:
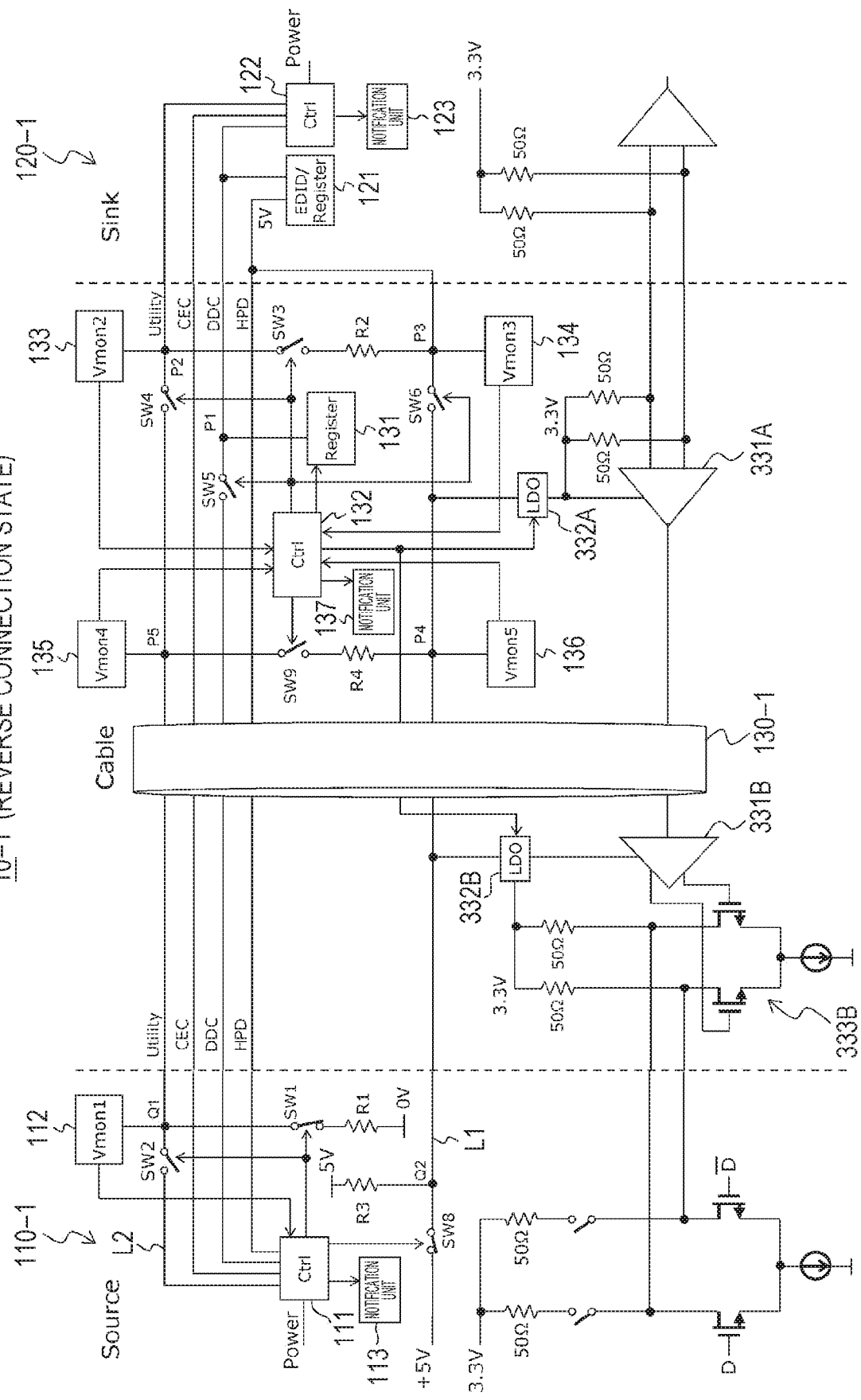
FIG. 15 is a diagram showing an example configuration (the HDMI cable being in a reverse connection state) of the transmission system of Example 1.

Next, an operation to be performed in a case where the connection direction of the HDMI cable 130-1 with respect to the source device 110-1 and the sink device 120-1 is the reverse direction is described in detail. FIG. 15 shows a case where the connection direction of the HDMI cable 130-1 is the reverse direction in the transmission system 10-1. In FIG. 15, the source device 110-1 and the HDMI cable 130-1 exhibit an initial state.

Figure 16:
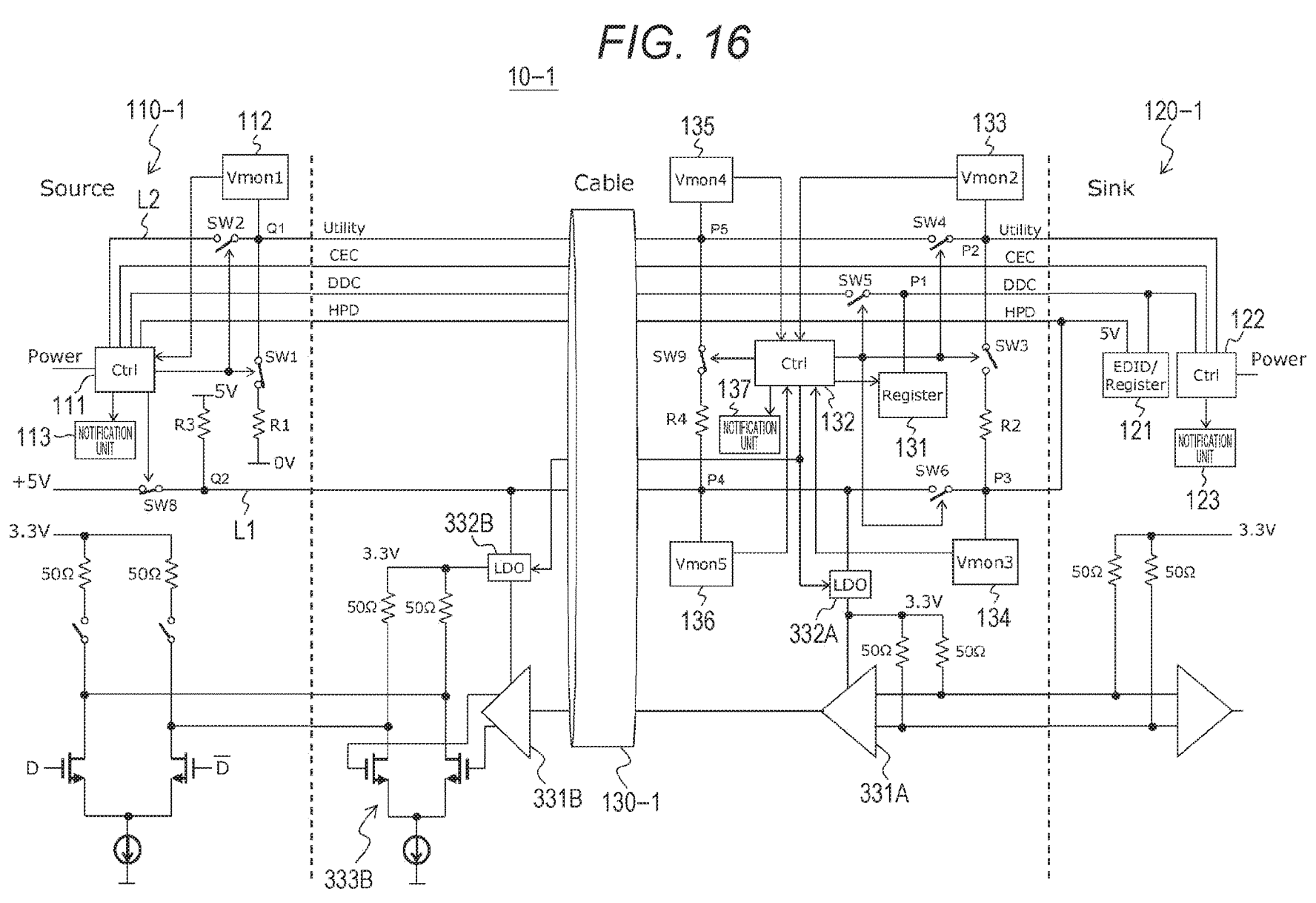

In this initial state, the voltage monitor unit 136 of the HDMI cable 130-1 monitors that the voltage at the point P4 is 5 V, and sends the monitor result to the control unit 132. Likewise, the voltage monitor unit 134 of the HDMI cable 130-1 monitors that the voltage at the point P3 is not 5 V, and sends the monitor result to the control unit 132. On the basis of these monitor results, the control unit 132 determines that the connection direction of the cable is the reverse direction, and puts the switch SW9 into a short-circuited state, as shown in FIG. 16.

When the switch SW9 is put into a short-circuited state, the resistors R1 and R4 are connected in series between the ground (0 V) of the source device 110-1 and the +5 V power-supply line of the HDMI cable 130-1, and a voltage of 1.25 V is obtained at the points Q1 and P2 through resistance voltage division. In this arrangement, the HDMI cable 130-1 transmits information indicating that the direction of the cable is the reverse direction, to the source device 110-1, via the utility line. The voltage monitor unit 112 of the source device 110-1 monitors that the voltage at the point Q1 is 1.25 V, and sends the monitor result to the control unit 111. On the basis of this monitor result, the control unit 111 recognizes that the connection direction of the HDMI cable 130-1 is the reverse direction.

Figure 17:
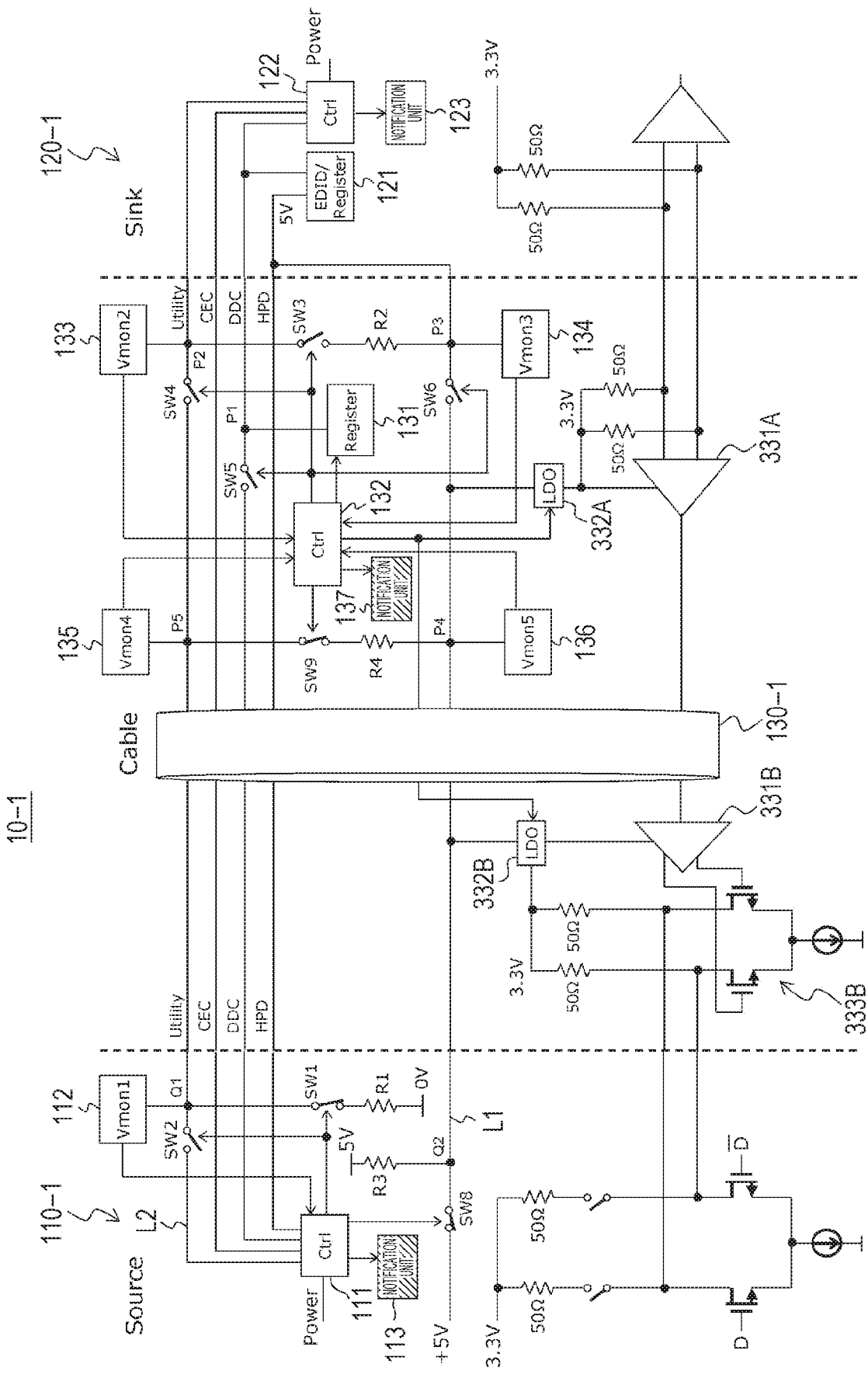
FIG. 17 is a diagram for explaining an operation of the transmission system shown in FIG. 15.

On the basis of the determination that the connection direction of the cable is the reverse direction, the control unit 132 of the HDMI cable 130-1 controls the notification operation of the notification unit 137, to notify the user that the connection direction of the cable is the reverse direction, as indicated by the shaded portion of the notification unit 137 in FIG. 17. This notification is issued through light emission, a buzzer sound, or the like.

FIG. 18A shows an example notification by LEDs in the notification unit 137. This example involves a first LED that indicates turning on of the power supply with green light emission, and a second LED for prompting checking of the connection direction of the cable through red light emission. FIG. 18B also shows an example notification by LEDs in the notification unit 137. This example involves a single LED that indicates turning on of the power supply with green light emission, and indicates a reverse connection of the cable with red light emission.

Meanwhile, on the basis of the recognition that the connection direction of the HDMI cable 130-1 is the reverse direction, the control unit 111 of the source device 110-1 controls the notification operation of the notification unit 113, to notify the user that the connection direction of the HDMI cable 130-1 is the reverse direction, as indicated by the shaded portion of the notification unit 113 in FIG. 17. This notification is issued through display, voice, light emission, a buzzer sound, or the like.

FIG. 19A shows an example notification by display in the notification unit 113. FIG. 19B shows an example notification by LEDs in the notification unit 113. The example shown in the drawing involves a first LED that indicates turning on of the power supply with green light emission, and a second LED that indicates, with red light emission, a reverse connection, or an incorrect connection, of the cable. FIG. 19C also shows an example notification by LED light emission in the notification unit 113. The example shown in the drawing involves a first LED that indicates turning on of the power supply with green light emission, and a second LED that indicates a correct connection of the cable with blue light emission and indicates an incorrect connection of the cable with red light emission.

Figure 20:
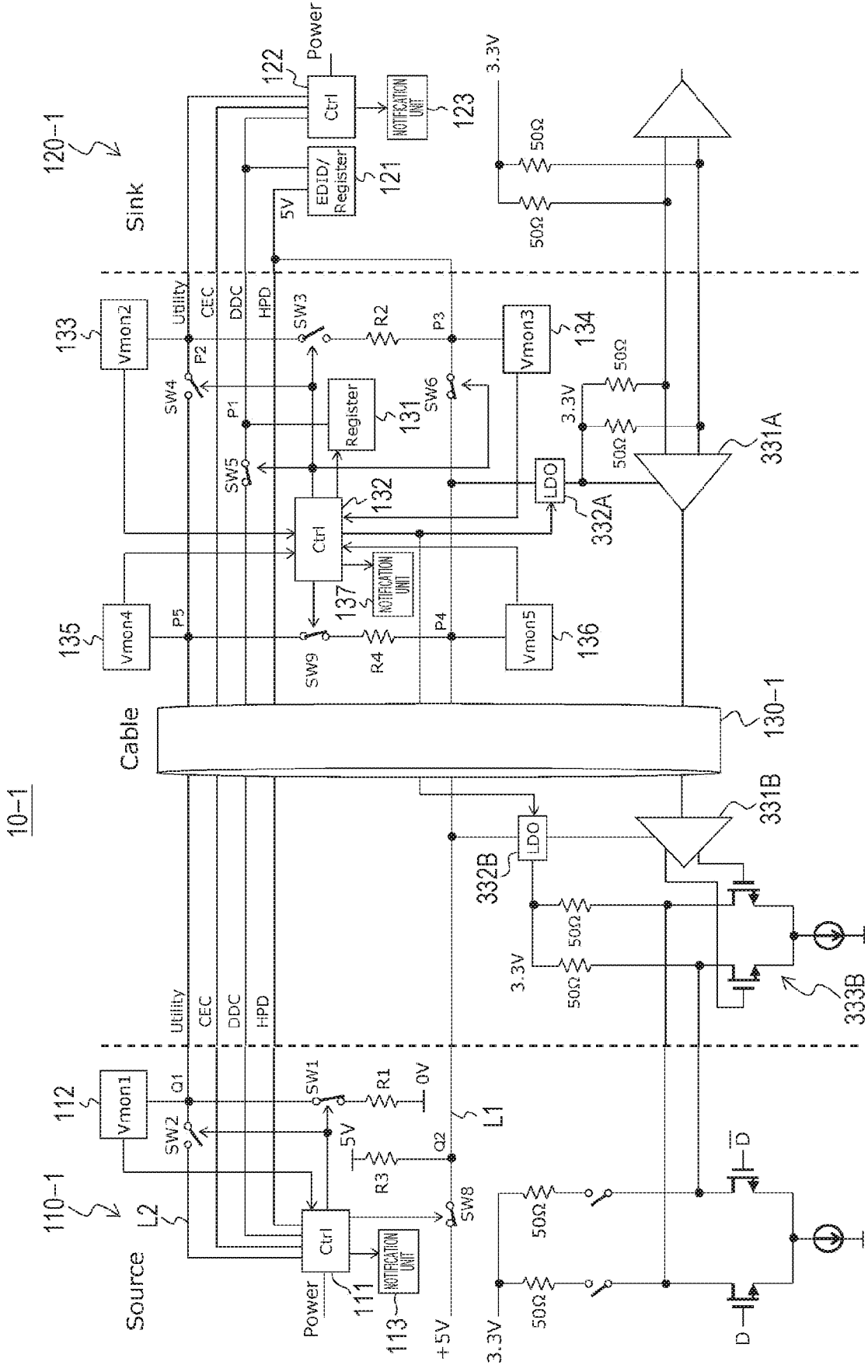
FIG. 20 is a diagram for explaining an operation of the transmission system shown in FIG. 15.

The voltage monitor unit 135 of the HDMI cable 130-1 monitors that the voltage at the point P5 is 1.25 V, and sends the monitor result to the control unit 132. On the basis of this monitor result, the control unit 132 of the HDMI cable 130-1 puts the switch SW5 and the switch SW6 into a short-circuited state, as shown in FIG. 20. As the switch SW6 is put into a short-circuited state in this manner, it becomes possible to send a 5 V voltage from the source device 110-1 to the sink device 120-1 through the +5 V power-supply line. Further, as the switch SW5 is put into a short-circuited state, it becomes possible to access the EDID/register 121 of the sink sink device 120-1 from the source device 110-1 via the DDC line.

In a case where the control unit 111 of the source device 110-1 receives a 5 V voltage (a connection detection signal) from the sink device 120-1 via the HPD line as a 5 V voltage is supplied from the source device 110-1 to the sink device 120-1 through the +5 V power-supply line, the control unit 111 determines that the sink device 120-1 is connected. The control unit 111 then accesses the EDID/register 121 of the sink sink device 120-1 via the DDC line, and writes information indicating that the connection direction of the cable is the reverse direction, into a register portion of the EDID/register 121.

Figure 21:
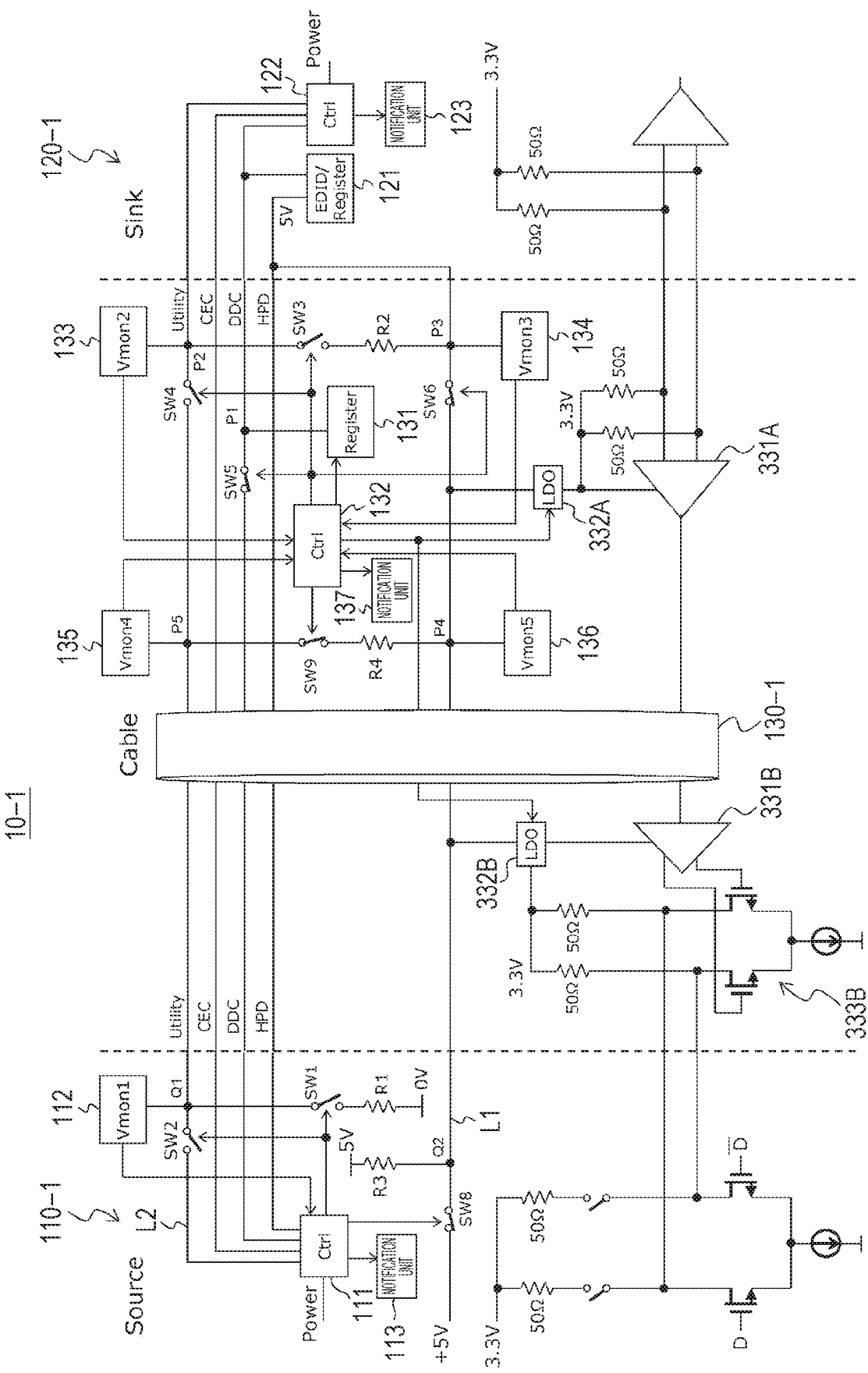
FIG. 21 is a diagram for explaining an operation of the transmission system shown in FIG. 15.

After completing the access to the EDID/register 121 described above, the control unit 111 of the source device 110-1 puts the switch SW1 into an open state, as shown in FIG. 21. Therefore, the voltage at the point P5 of the utility line changes to 5 V. In the HDMI cable 130-1, the voltage monitor unit 135 monitors that the voltage at the point P5 is 5 V, and sends the monitor result to the control unit 132.

Figure 22:
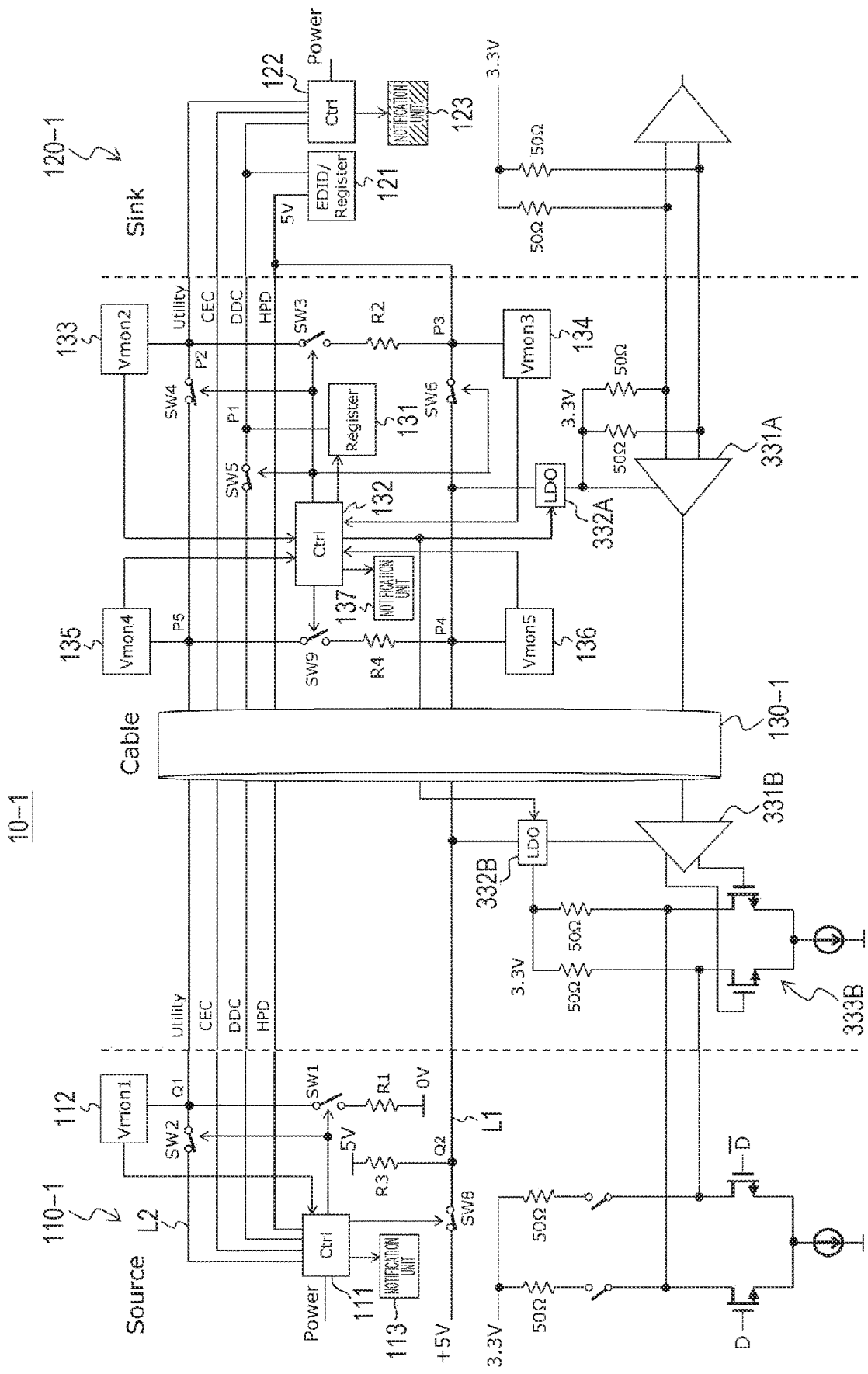
FIG. 22 is a diagram for explaining an operation of the transmission system shown in FIG. 15.

On the basis of this monitor result, the control unit 132 of the HDMI cable 130-1 puts the switch SW9 into an open state and the switch SW4 into a short-circuited state, as shown in FIG. 22. When a certain stand-by time has passed since the control unit 111 of the source device 110-1 put the switch SW1 into an open state, the control unit 111 further puts the switch SW2 into a short-circuited state, as shown in FIG. 22.

Meanwhile, on the basis of information written in a register portion of the EDID/register 121, the control unit 122 of the sink device 120-1 notifies the user that the connection direction of the HDMI cable 130-1 is the reverse direction, as indicated by the shaded portion of the notification unit 123 in FIG. 22. This notification is issued through display, voice, light emission, a buzzer sound, or the like. FIG. 23 shows an example notification by display in the notification unit 123.

As shown in FIG. 15, in a case where the connection direction of the HDMI cable 130-1 with respect to the source device 110-1 and the sink device 120-1 is the reverse direction, a voltage of 5 V from the source device 110-1 is obtained at the point P4 of the +5 V power-supply line, but a voltage of 5 V is not obtained at the point P3 of the +5 V power-supply line, as described above. Therefore, in the HDMI cable 130-1, it is possible to easily determine that the connection direction of the cable is the reverse direction. Also, in the HDMI cable 130-1, the notification unit 137 notifies the user of the reverse connection, on the basis of the determination. This enables the user to recognize that the connection direction of the cable is the reverse direction.

Further, as shown in FIG. 15, in a case where the connection direction of the HDMI cable 130-1 with respect to the source device 110-1 and the sink device 120-1 is the reverse direction, information indicating that the connection direction of the cable is the reverse direction is sent from the HDMI cable 130-1 to the source device 110-1 through the utility line, as described above. In this case, the switch SW9 is put into a short-circuited state, so that 2 V divided by the voltage-dividing resistors R1 and R4 is generated in the utility line, and this 2 V voltage is sent as information indicating that the connection direction of the cable is the reverse direction, to the source device 110-1. Thus, the source device 110-1 can accurately recognize that the connection direction of the HDMI cable 130-1 is the reverse direction.

Further, as shown in FIG. 15, in a case where the connection direction of the HDMI cable 130-1 with respect to the source device 110-1 and the sink device 120-1 is the reverse direction, the source device 110-1 recognizes that the connection direction of the cable is the reverse direction, on the basis of the information to that effect sent from the HDMI cable 130-1. The notification unit 113 then notifies the user of the reverse connection. Thus, the user can recognize from the source device 110-1 that the connection direction of the cable is the reverse direction, and easily correct the connection.

Further, as shown in FIG. 15, in a case where the connection direction of the HDMI cable 130-1 with respect to the source device 110-1 and the sink device 120-1 is the reverse direction, the source device 110-1 recognizes that the cable connection direction sent from the HDMI cable 130-1 is the reverse direction, and then writes information indicating the reverse connection into a register portion of the EDID/register 121 of the sink device 120-1, as described above. Accordingly, the sink device 120-1 also recognizes that the connection direction of the HDMI cable 130-1 is the reverse direction, and the notification unit 123 notifies the user of the reverse connection. Thus, the user can recognize from the sink device 120-1 that the connection direction of the cable is the reverse direction, and easily correct the connection.

Figure 24:
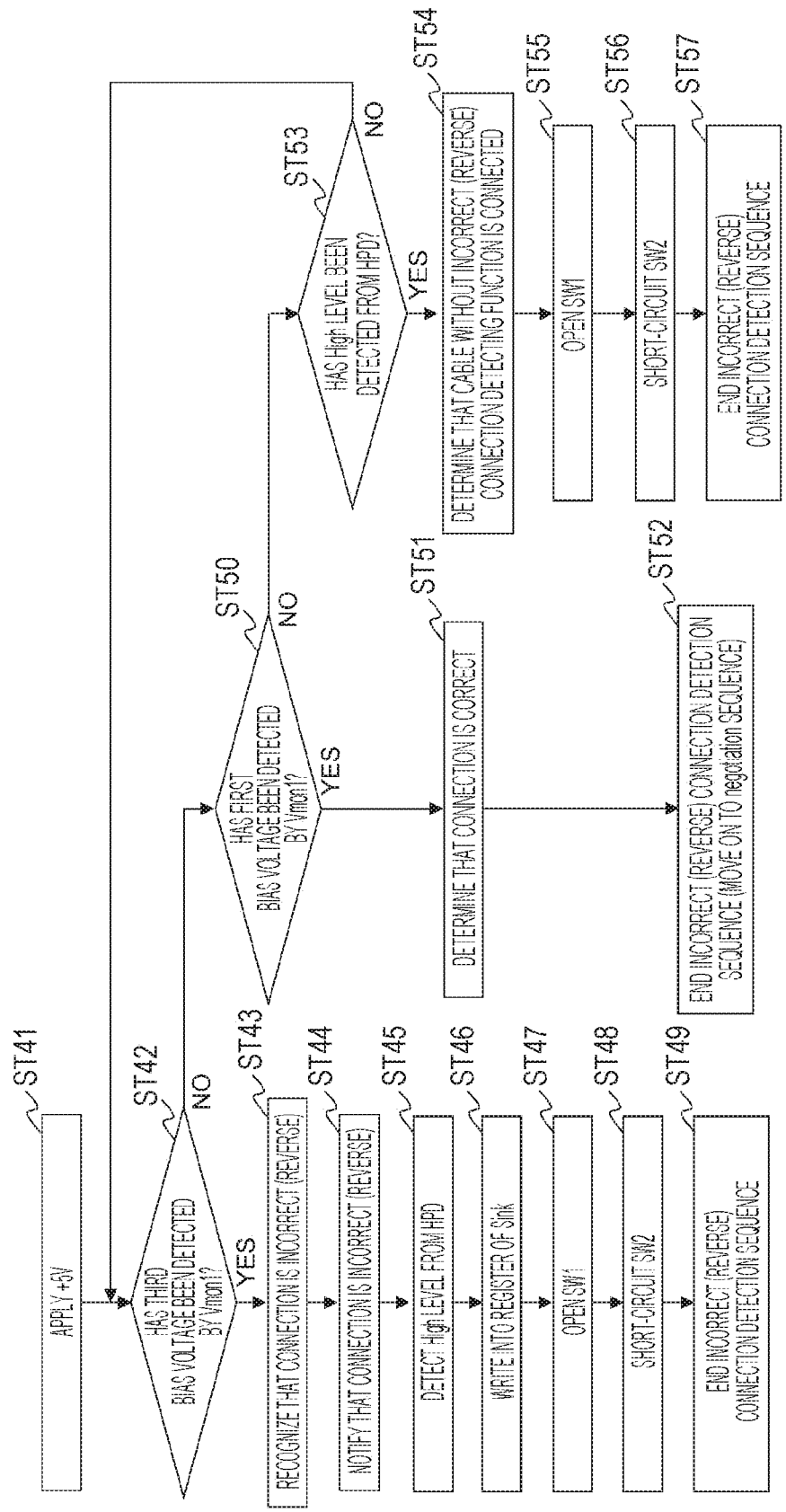
FIG. 24 is a diagram showing an example of an incorrect (reverse) cable connection detection sequence of the source device in the transmission system shown in FIG. 15.

FIG. 24 shows an example of an incorrect (reverse) cable connection detection sequence in the source device 110-1. In step ST41, when the power switch is turned on, and +5 V is applied, for example, the sequence is started and moves on to step ST42. In step ST42, the control unit 111 determines whether the voltage monitor unit 112 has detected a third bias voltage (1.25 V).

If the third bias voltage (1.25 V) has been detected, the control unit 111 determines in step ST43 that the HDMI cable is incorrectly (reversely) connected. In step ST44, the control unit 111 then controls the notification operation of the notification unit 113, to notify the user through display, voice, LED light emission, or the like.

Next, after it is detected in step ST45 that the HPD line has switched to the high level (5 V), the control unit 111 in step ST46 writes information indicating that the connection direction of the cable is the reverse direction, into a register portion of the EDID/register 121 of the sink device 120-1.

Next, in step ST47, the switch SW1 is changed from a short-circuited state to an open state. After a certain stand-by time, the control unit 111 then changes the switch SW2 from an open state to a short-circuited state in step ST48. After that, in step ST49, the sequence is ended.

If the third bias voltage (1.25 V) is not detected in step ST42, on the other hand, the control unit 111 determines in step ST50 whether the first bias voltage (3.33 V) has been detected by the voltage monitor unit 112. If the first bias voltage (3.33V) has been detected, the control unit 111 determines in step ST51 that the connection is correct. After that, in step ST52, the sequence is ended and moves on to the negotiation operation described above.

If the first bias voltage (3.33 V) is not detected in step ST50, on the other hand, the control unit 111 determines in step ST53 whether or not the high level (5 V) of the HPD line has been detected. If the high level (5 V) of the HPD line is not detected, the sequence returns to step ST42. If the high level (5 V) of the HPD line is detected, on the other hand, the control unit 111 determines in step ST54 that an HDMI cable without an incorrect (reverse) connection detecting function is connected.

In step ST55, the control unit 111 then changes the switch SW1 from a short-circuited state to an open state. Next, in step ST56, the control unit 111 changes the switch SW2 from an open state to a short-circuited state. In step ST57, the sequence is then ended.

Figure 25:
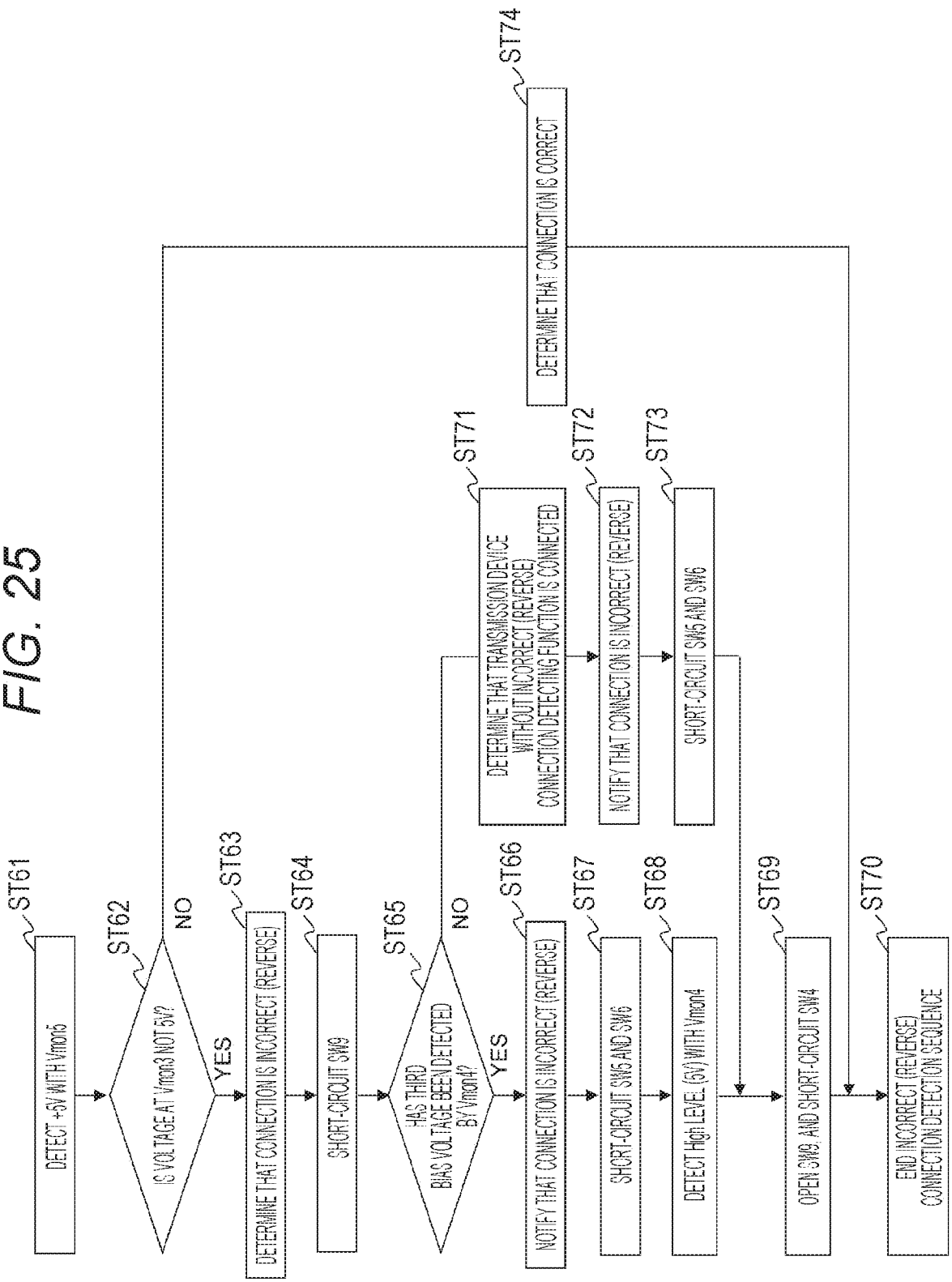
FIG. 25 is a diagram showing an example of an incorrect (reverse) cable connection detection sequence of the HDMI cable in the transmission system shown in FIG. 15.

FIG. 25 shows an example of an incorrect (reverse) cable connection detection sequence in the HDMI cable 130-1. In step ST61, when the voltage monitor unit 136 detects a voltage of 5 V, the sequence is started, and moves on to step ST62. In step ST62, the control unit 132 determines whether or not the voltage monitor unit 134 has detected a voltage of 5 V. If a voltage of 5 V has not been detected, the control unit 132 determines in step ST63 that the connection is incorrect (reverse).

Next, in step ST64, the control unit 132 changes the switch SW9 from an open state to a short-circuited state, so that information indicating that the connection direction of the cable is the reverse direction is sent to the source device 110-1. In step ST65, the control unit 132 then determines whether the voltage monitor unit 135 has detected the third bias voltage (1.25 V). If the third bias voltage (1.25 V) has been detected, the notification operation of the notification unit 137 is controlled by the control unit 132 in step ST66, so that the user is notified that the connection direction of the cable is the reverse direction, through LED light emission, a buzzer sound, or the like.

Next, in step ST67, the control unit 132 changes the switch SW6 from an open state to a short-circuited state, and changes the switch SW5 from an open state to a short-circuited state. After 5 V is detected by the voltage monitor unit 135 in step ST68, the switch SW9 is then changed from a short-circuited state to an open state, and the switch SW4 is changed from an open state to a short-circuited state in step ST69. In step ST70, the sequence is then ended.

If the third bias voltage (1.25 V) is not detected in step ST65, on the other hand, the control unit 132 determines in step ST71 that a transmission device without an incorrect (reverse) connection detecting function is connected. In step ST72, the notification operation of the notification unit 137 is then controlled by the control unit 132, so that the user is notified that the connection direction of the cable is the reverse direction, through LED light emission, a buzzer sound, or the like.

Next, in step ST73, the control unit 132 changes the switch SW6 from an open state to a short-circuited state, and changes the switch SW5 from an open state to a short-circuited state. In step ST69, the switch SW9 is then changed from a short-circuited state to an open state, and the switch SW4 is changed from an open state to a short-circuited state. In step ST70, the sequence is then ended.

If a voltage of 5 V has been detected in step ST62, on the other hand, the control unit 132 determines in step ST74 that the connection is correct. In step ST70, the sequence is then ended.

Figure 26:
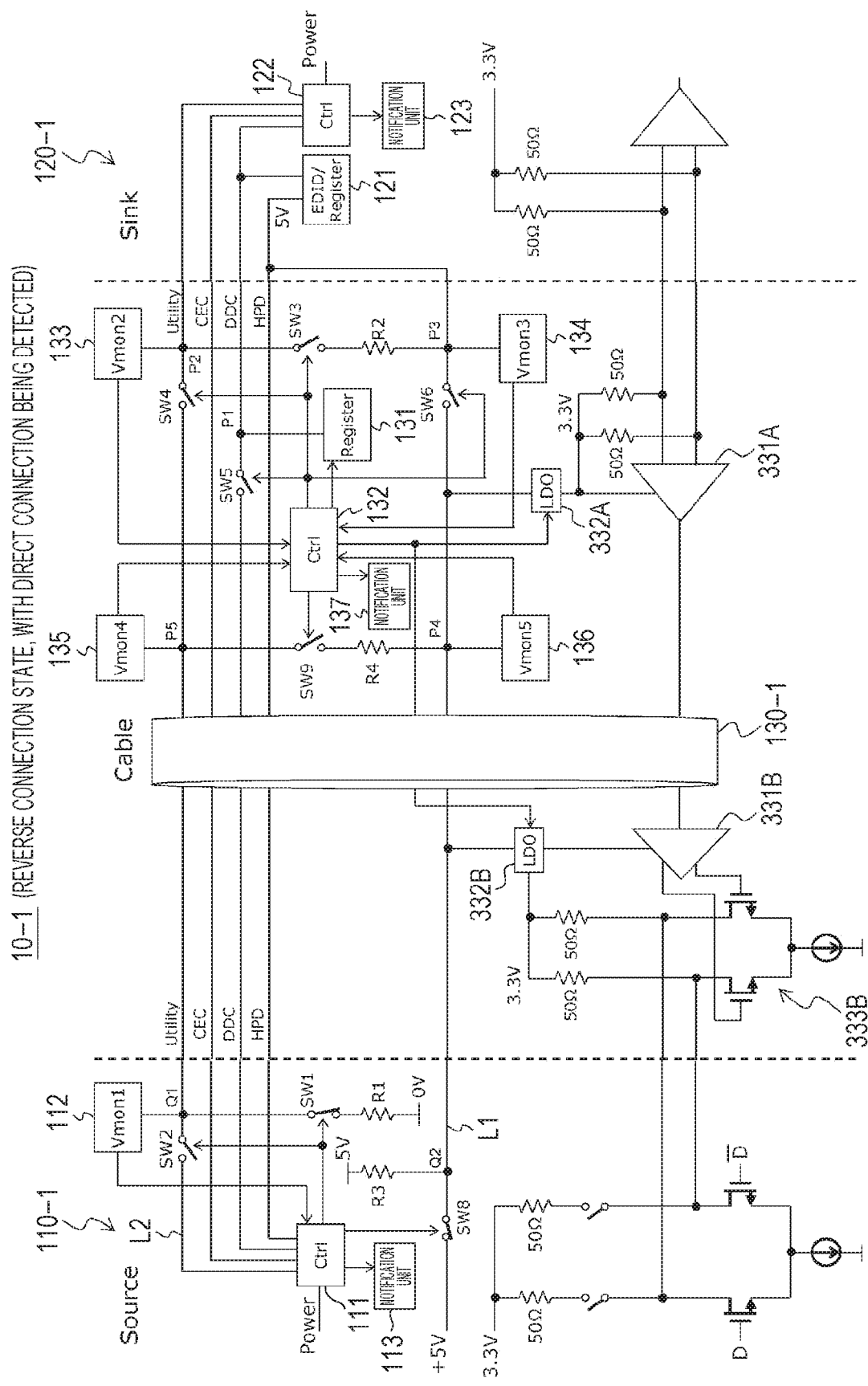
FIG. 26 is a diagram showing an example configuration (the HDMI cable being in a reverse connection state, a direction connection of the source device being detected) of the transmission system of Example 1.

Note that, in the example operation described above, a reverse connection direction of the HDMI cable 130-1 with respect to the source device 110-1 and the sink device 120-1 is detected. In a possible example operation, in addition to this detection, whether the HDMI cable 130-1 is connected directly to the source device 110-1 is further determined. The operation in that case will be described below in detail. FIG. 26 shows a case where the connection direction of the HDMI cable 130-1 is the reverse direction in the transmission system 10-1. In FIG. 26, the source device 110-1 and the HDMI cable 130-1 exhibit an initial state.

Figure 27:
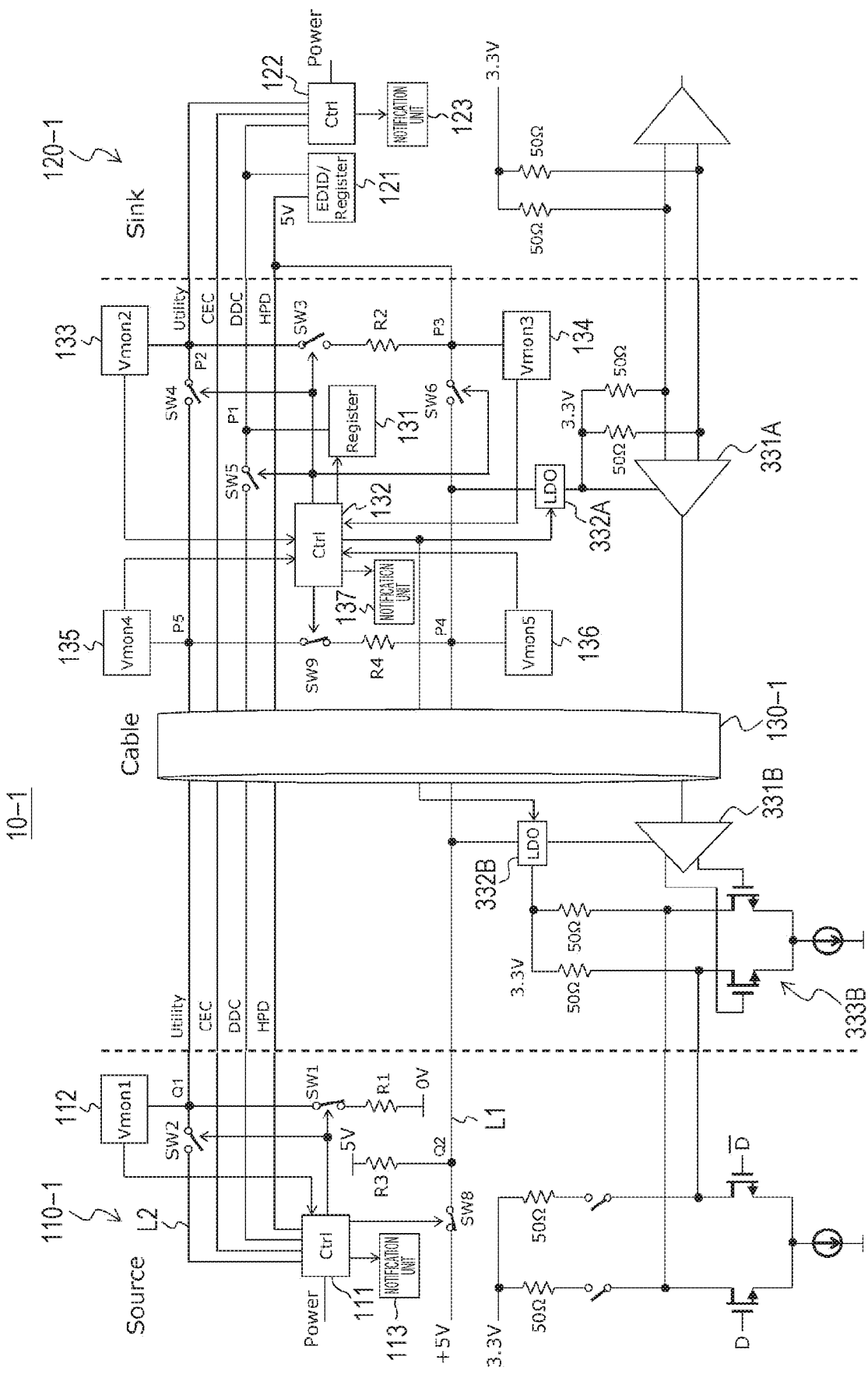
FIG. 27 is a diagram for explaining an operation of the transmission system shown in FIG. 26.

In this initial state, the voltage monitor unit 136 of the HDMI cable 130-1 monitors that the voltage at the point P4 is 5 V, and sends the monitor result to the control unit 132. Likewise, the voltage monitor unit 134 of the HDMI cable 130-1 monitors that the voltage at the point P3 is not 5 V, and sends the monitor result to the control unit 132. On the basis of these monitor results, the control unit 132 determines that the connection direction of the cable is the reverse direction, and puts the switch SW9 into a short-circuited state, as shown in FIG. 27.

When the switch SW9 is put into a short-circuited state, the resistors R1 and R4 are connected in series between the ground (0 V) of the source device 110-1 and the +5 V power-supply line of the HDMI cable 130-1, and a voltage of 1.25 V is obtained at the points Q1 and P2 through resistance voltage division. In this arrangement, the HDMI cable 130-1 transmits information indicating that the direction of the cable is the reverse direction, to the source device 110-1, via the utility line. The voltage monitor unit 112 of the source device 110-1 monitors that the voltage at the point Q1 is 1.25 V, and sends the monitor result to the control unit 111. On the basis of this monitor result, the control unit 111 recognizes that the connection direction of the HDMI cable 130-1 is the reverse direction.

Figure 28:
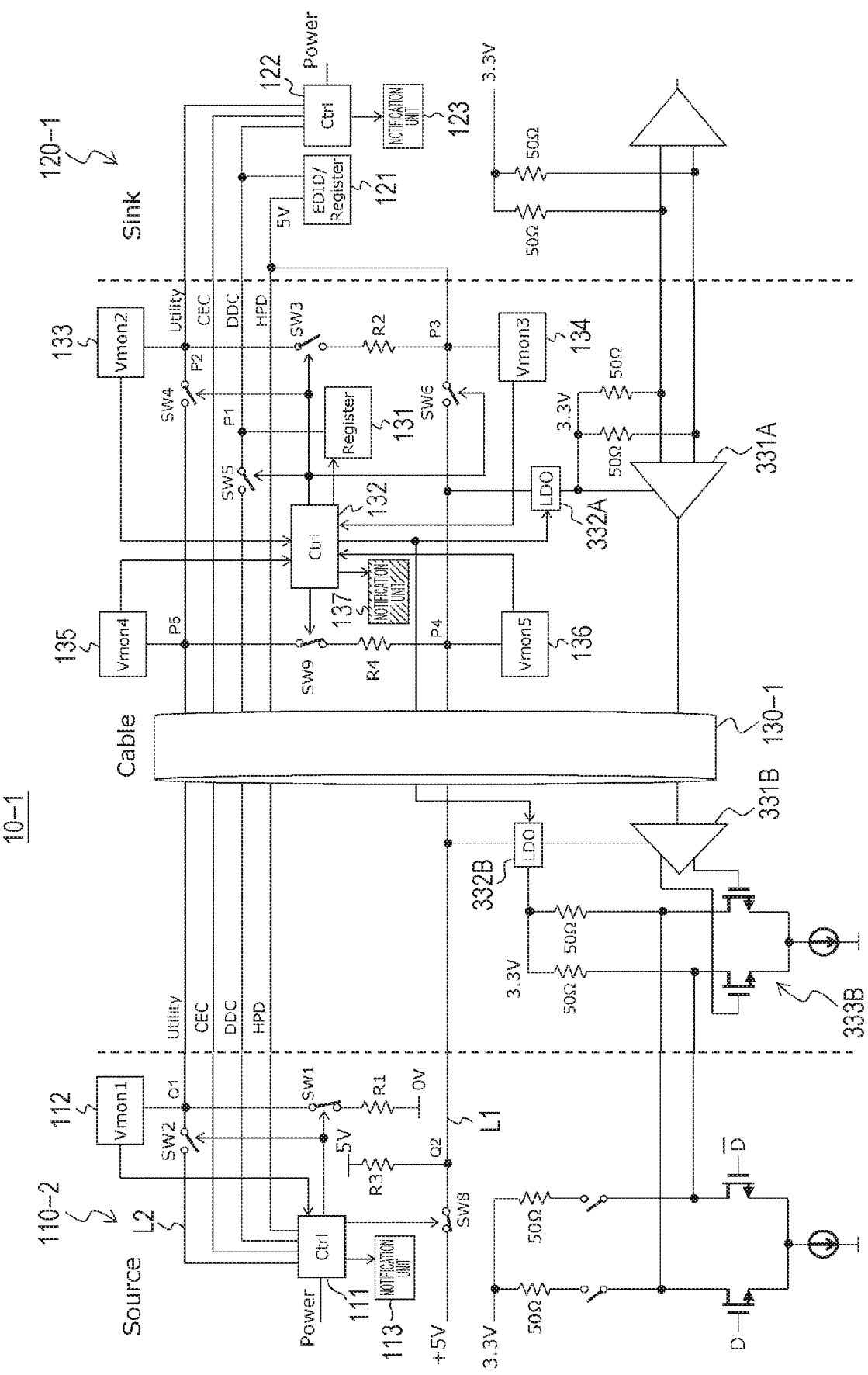
FIG. 28 is a diagram for explaining an operation of the transmission system shown in FIG. 26.

On the basis of the determination that the connection direction of the cable is the reverse direction, the control unit 132 of the HDMI cable 130-1 controls the notification operation of the notification unit 137, to notify the user that the connection direction of the cable is the reverse direction, as indicated by the shaded portion of the notification unit 137 in FIG. 28. This notification is issued through light emission, a buzzer sound, or the like (see FIGS. 18A and 18B).

Figure 29:
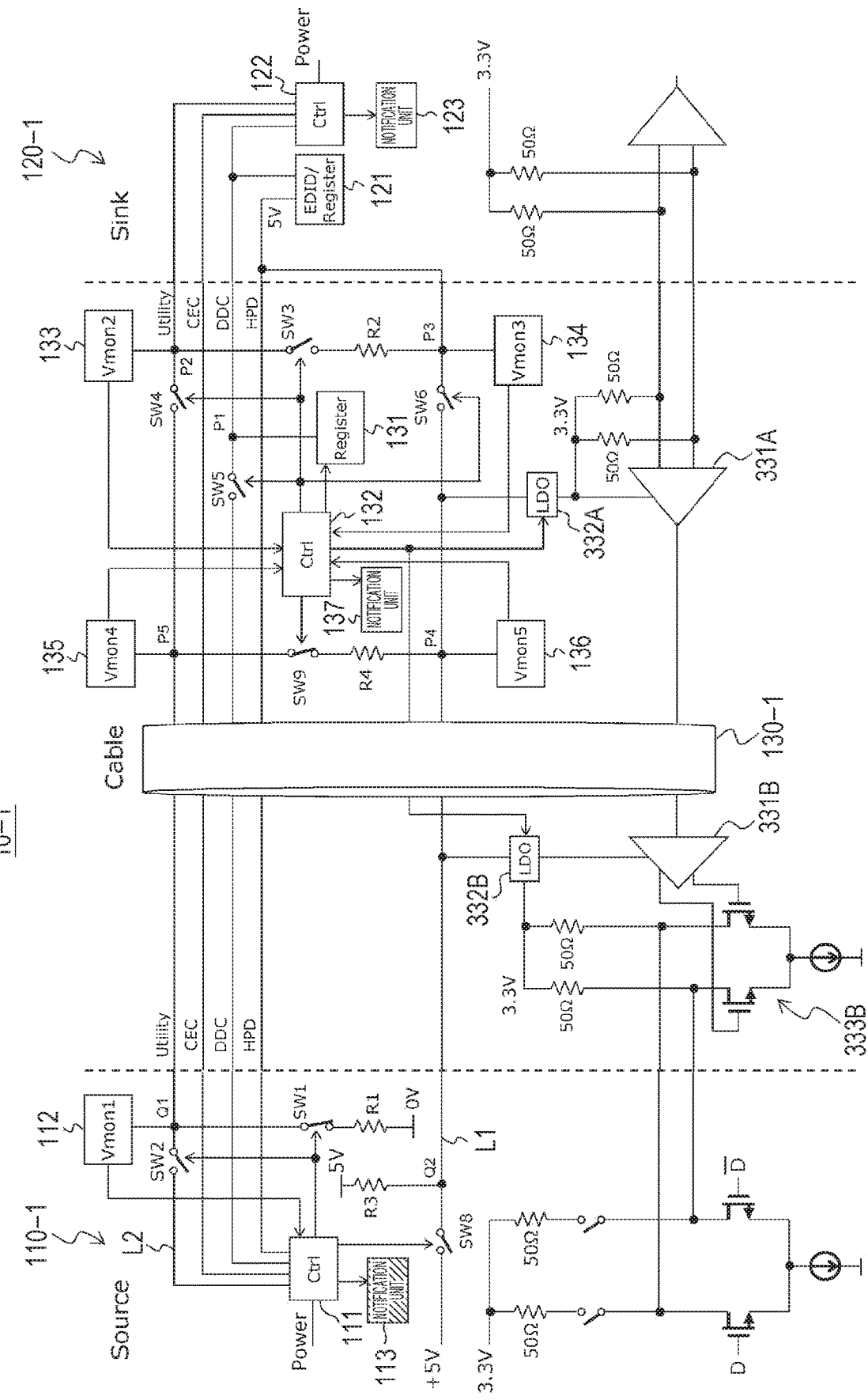
FIG. 29 is a diagram for explaining an operation of the transmission system shown in FIG. 26.

After recognizing that the connection direction of the HDMI cable 130-1 is the reverse direction, the control unit 111 of the source device 110-1 further puts the switch SW8 into an open state as shown in FIG. 29, to determine whether the HDMI cable 130-1 is connected directly to the source device 110-1. Here, the resistor R3 is connected in series to the resistors R1 and R4, and a voltage of 1 V is obtained at the points Q1 and P5 through resistance voltage division.

The voltage monitor unit 112 of the source device 110-1 monitors that the voltage at the point Q1 is 1 V, and sends the monitor result to the control unit 111. On the basis of this monitor result, the control unit 111 determines that the HDMI cable 130-1 is connected directly to the source device 110-1.

Further, on the basis of the recognition that the connection direction of the HDMI cable 130-1 is the reverse direction, and the determination that this HDMI cable 130-1 is connected directly to the source device 110-1, the control unit 111 of the source device 110-1 controls the notification operation of the notification unit 113, to notify the user that the connection direction of the HDMI cable 130-1 is the reverse direction, and the HDMI cable 130-1 is connected directly to the source device 110-1, as indicated by the shaded portion of the notification unit 113 in FIG. 29. This notification is issued through display, voice, light emission, a buzzer sound, or the like.

FIGS. 30A and 30B show example notifications by display in the notification unit 113. FIG. 30A is an example notification in a case where the HDMI cable 130-1 is connected directly to the source device 110-1 (see FIG. 29). On the other hand, FIG. 30B is an example notification in a case where a relay device such as a repeater that separates the +5 V power-supply line is connected between the source device 110-1 and the sink device 120-1, and the HDMI cable 130-1 is reversely connected between the relay device and the sink device 120-1, for example.

Figure 31:
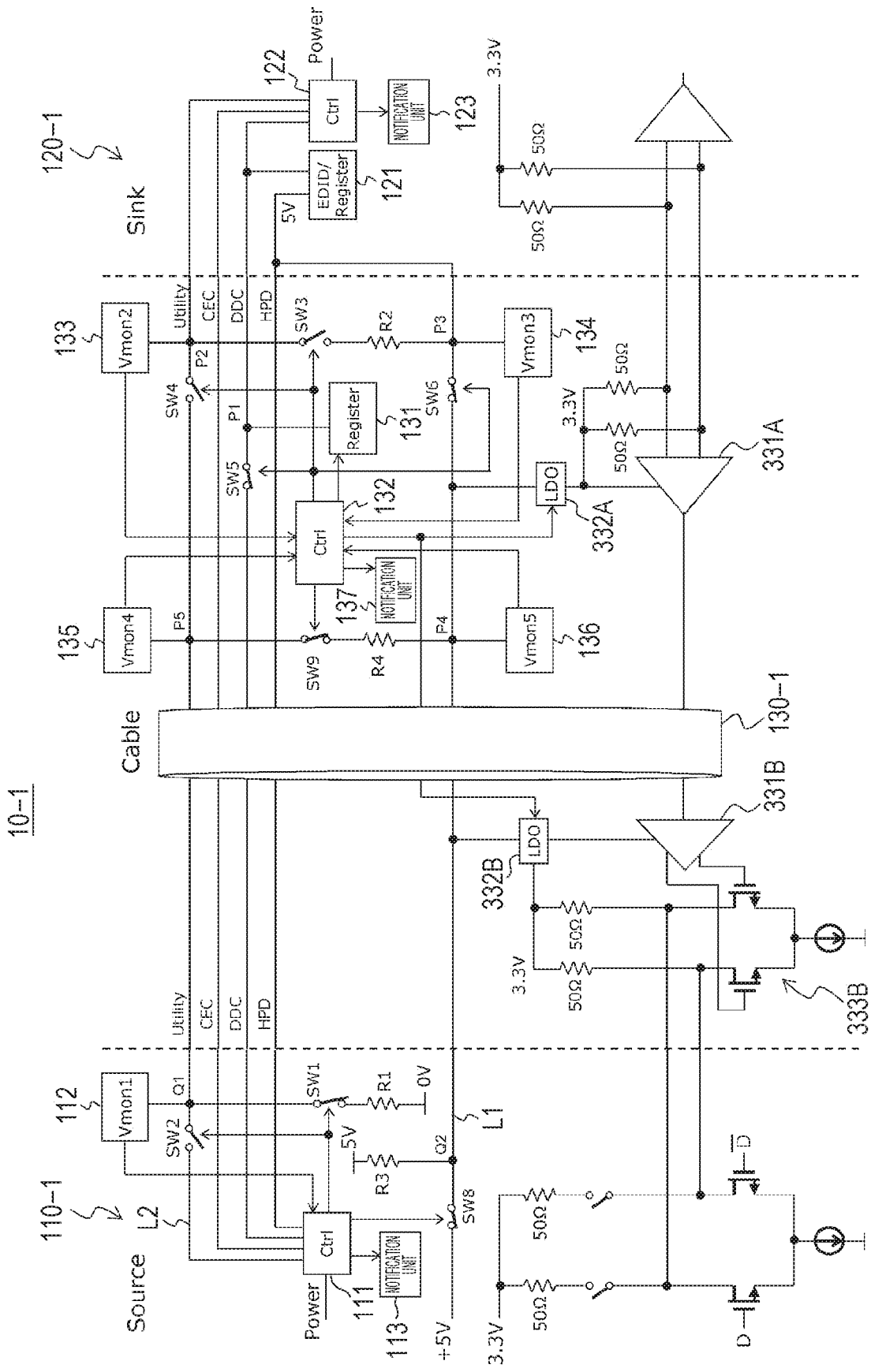
FIG. 31 is a diagram for explaining an operation of the transmission system shown in FIG. 26.

The voltage monitor unit 135 of the HDMI cable 130-1 monitors that the voltage at the point P5 is 1 V, and sends the monitor result to the control unit 111. On the basis of this monitor result, the control unit 111 puts the switch SW5 and the switch SW6 into a short-circuited state, as shown in FIG. 31. As the switch SW6 is put into a short-circuited state in this manner, it becomes possible to send a 5 V voltage from the source device 110-1 to the sink device 120-1 through the +5 V power-supply line. Further, as the switch SW5 is put into a short-circuited state, it becomes possible to access the EDID/register 121 of the sink sink device 120-1 from the source device 110-1 via the DDC line.

In a case where the control unit 111 of the source device 110-1 receives a 5 V voltage (a connection detection signal) from the sink device 120-1 via the HPD line as a 5 V voltage is supplied from the source device 110-1 to the sink device 120-1 through the +5 V power-supply line, the control unit 111 determines that the sink device 120-1 is connected.

The control unit 111 then accesses the EDID/register 121 of the sink device 120-1 via the DDC line, and writes information indicating that the connection direction of the cable is the reverse direction, into a register portion of the EDID/register 121. In this case, if it is determined that the HDMI cable 130-1 is connected directly to the source device 110-1, the information is written into "register 2", for example. If it is determined that the HDMI cable 130-1 is not connected directly to the source device 110-1, on the other hand, the information is written into "register 1".

Figure 32:
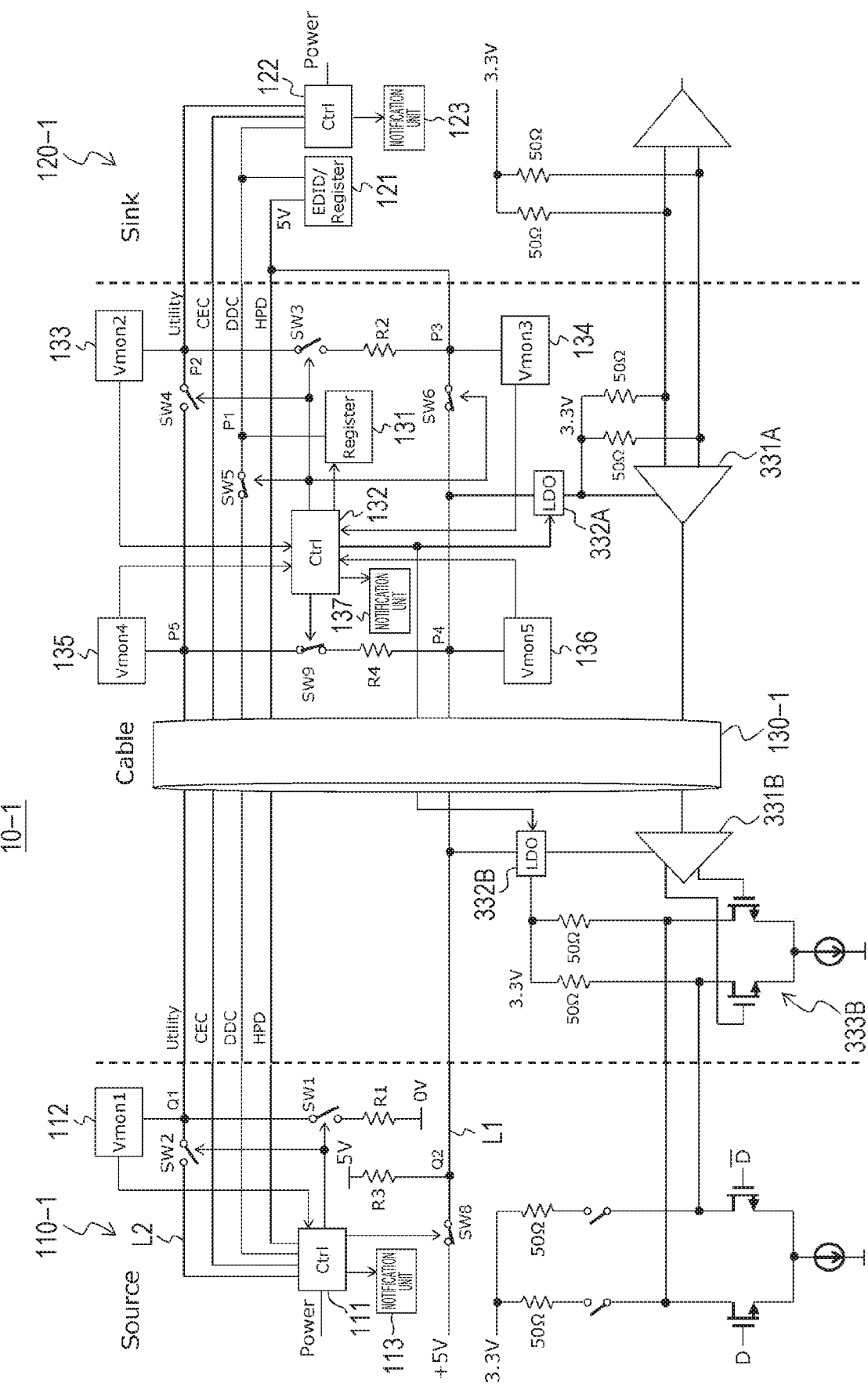
FIG. 32 is a diagram for explaining an operation of the transmission system shown in FIG. 26.

After completing the access to the EDID/register 121 described above, the control unit 111 of the source device 110-1 puts the switch SW1 into an open state, as shown in FIG. 32. Therefore, the voltage at the point P5 of the utility line changes to 5 V. In the HDMI cable 130-1, the voltage monitor unit 135 monitors that the voltage at the point P5 is 5 V, and sends the monitor result to the control unit 132.

Figure 33:
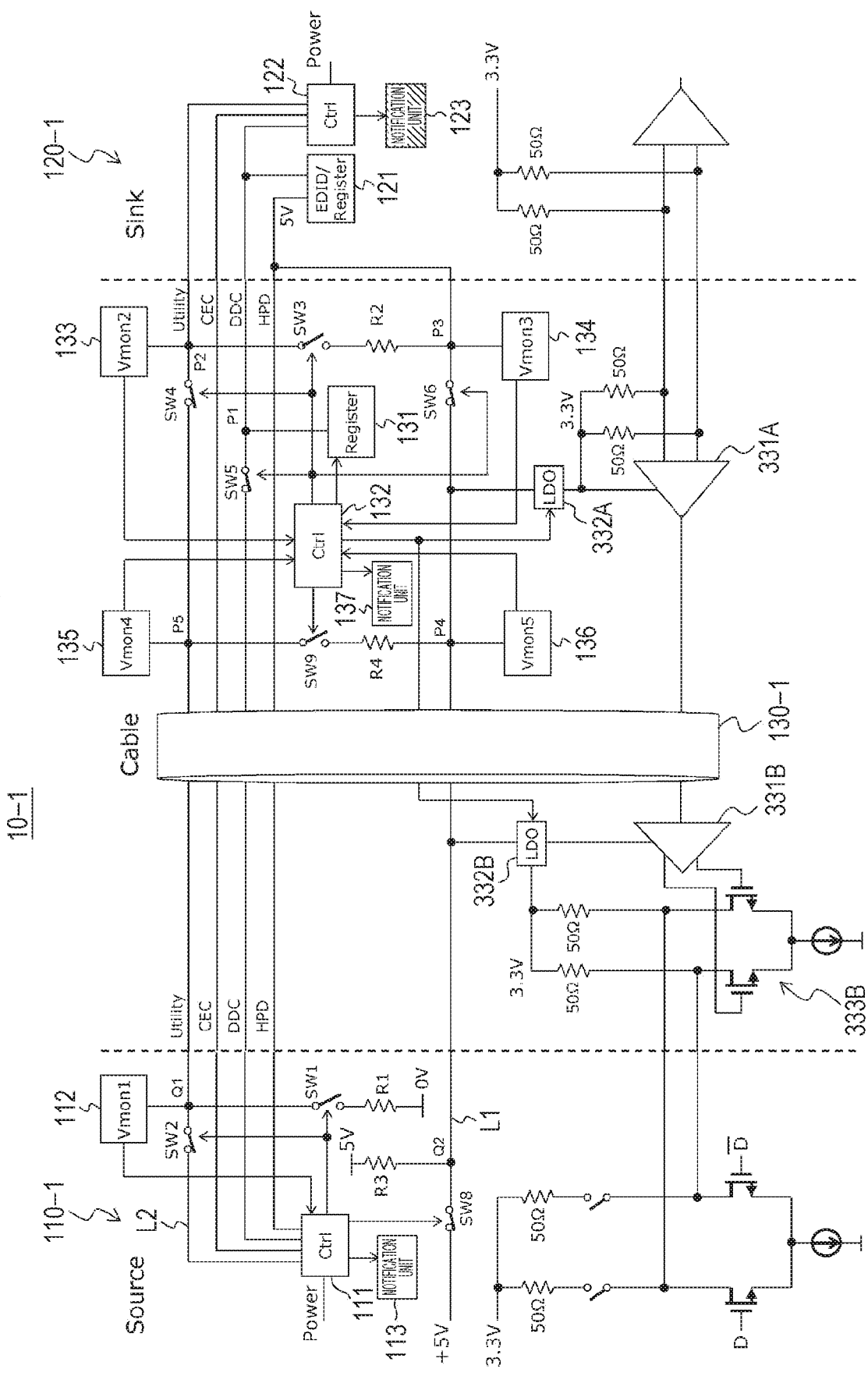
FIG. 33 is a diagram for explaining an operation of the transmission system shown in FIG. 26.

On the basis of this monitor result, the control unit 132 of the HDMI cable 130-1 puts the switch SW9 into an open state and the switch SW4 into a short-circuited state, as shown in FIG. 33. When a certain stand-by time has passed since the control unit 111 of the source device 110-1 put the switch SW1 into an open state, the control unit 111 further puts the switch SW2 into a short-circuited state, as shown in FIG. 33.

Meanwhile, on the basis of information written in a register portion of the EDID/register 121, the control unit 122 of the sink device 120-1 notifies the user that the connection direction of the HDMI cable 130-1 is the reverse direction, as indicated by the shaded portion of the notification unit 123 in FIG. 33. This notification is issued through display, voice, light emission, a buzzer sound, or the like.

Figure 34A:
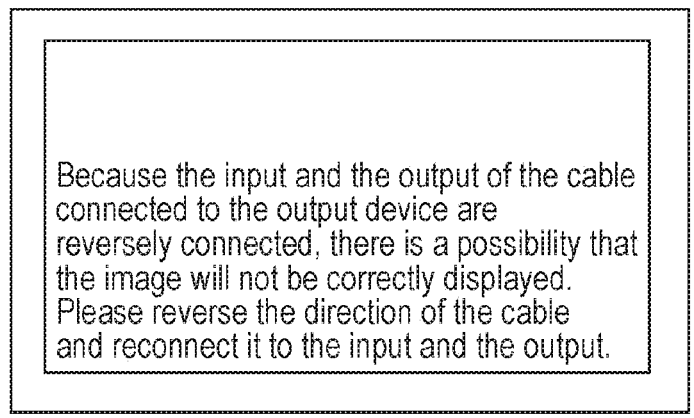
FIGS. 34A and 34B are diagrams for explaining example notifications in the notification unit of the sink device.
Figure 34B:
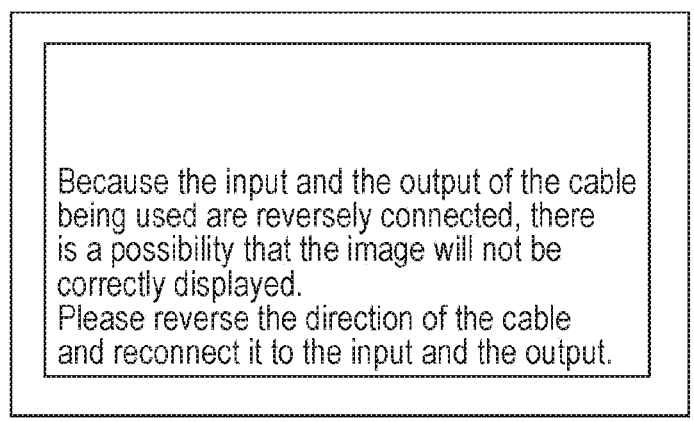

FIGS. 34A and 34B show example notifications by display in the notification unit 123. FIG. 34A shows an example notification in a case where information is written in the "register 2", and the HDMI cable 130-1 is connected directly to the source device 110-1. FIG. 34B shows an example notification in a case where information is written in the "register 1", and the HDMI cable 130-1 is not connected directly to the source device 110-1.

As shown in FIG. 26, in a case where the connection direction of the HDMI cable 130-1 with respect to the source device 110-1 and the sink device 120-1 is the reverse direction, a voltage of 5 V from the source device 110-1 is obtained at the point P4 of the +5 V power-supply line, but a voltage of 5 V is not obtained at the point P3 of the +5 V power-supply line, as described above. Therefore, in the HDMI cable 130-1, it is possible to easily determine that the connection direction of the cable is the reverse direction. Also, in the HDMI cable 130-1, the notification unit 137 notifies the user of the reverse connection, on the basis of the determination. This enables the user to recognize that the connection direction of the cable is the reverse direction.

Further, as shown in FIG. 26, in a case where the connection direction of the HDMI cable 130-1 with respect to the source device 110-1 and the sink device 120-1 is the reverse direction, information indicating that the connection direction of the cable is the reverse direction is sent from the HDMI cable 130-1 to the source device 110-1 through the utility line, as described above. In this case, the switch SW9 is put into a short-circuited state, so that 1.25 V divided by the voltage-dividing resistors R1 and R4 is generated in the utility line, and this 1.25 V voltage is sent as information indicating that the connection direction of the cable is the reverse direction, to the source device 110-1. Thus, the source device 110-1 can accurately recognize that the connection direction of the HDMI cable 130-1 is the reverse direction.

Further, as shown in FIG. 26, in a case where the connection direction of the HDMI cable 130-1 with respect to the source device 110-1 and the sink device 120-1 is the reverse direction, information indicating that the connection direction of the cable is the reverse direction is sent from the HDMI cable 130-1 to the source device 110-1 through the utility line as described above. After that, the switch SW8 is put into an open state, so that 1 V divided by the voltage-dividing resistors R1, R4, and R3 is generated at the point Q1. Thus, the source device 110-1 can determine that the HDMI cable 130-1 whose connection direction is the reverse direction is connected directly thereto.

Further, as shown in FIG. 26, in a case where the connection direction of the HDMI cable 130-1 with respect to the source device 110-1 and the sink device 120-1 is the reverse direction, the notification unit 113 in the source device 110-1 notifies the user of the reverse connection and the direct connection of the HDMI cable 130-1, on the basis of the recognition that the connection direction of the HDMI cable 130-1 is the reverse direction, and the determination that the HDMI cable 130-1 is connected directly to the source device 110-1, as described above. Thus, the user can recognize from the source device 110-1 that the connection direction of the cable is the reverse direction and that the cable is connected directly to the source device, and easily correct the connection.

Further, as shown in FIG. 26, in a case where the connection direction of the HDMI cable 130-1 with respect to the source device 110-1 and the sink device 120-1 is the reverse direction, the source device 110-1 recognizes that the connection direction of the HDMI cable 130-1 is the reverse direction, and further determines that the HDMI cable 130-1 is connected directly to the source device 110-1. After that, information indicating these facts is written into a register portion of the EDID/register 121 of the sink device 120-1, as described above. Accordingly, the sink device 120-1 also recognizes that the connection direction of the HDMI cable 130-1 is the reverse direction and that the HDMI cable 130-1 is connected directly to the source device 110-1, and the notification unit 123 notifies the user of these facts. Thus, the user can recognize from the sink device 120-1 that the connection direction of the cable is the reverse direction and that the cable is connected directly to the source device, and easily correct the connection.

Note that, in the source device 110-1 described above, to indicate that the HDMI cable 130-1 whose connection direction is the reverse direction is connected directly to the source device 110-1, information indicating that the connection direction of the HDMI cable 130-1 is the reverse direction is written into the "register 2" of the EDID/register 121 of the sink device 120-1. However, the information indicating that the connection direction of the HDMI cable 130-1 is the reverse direction may be written into a fixed register of the EDID/register 121, together with information indicating whether the HDMI cable 130-1 is connected directly to the source device 110-1.

In a case where an operation to determine whether the HDMI cable 130-1 is connected directly to the source device 110-1 is performed, the incorrect (reverse) cable connection detection sequence in the HDMI cable 130-1 is the same as that in a case where this operation is not performed. Therefore, explanation of this sequence is not made herein (see FIG. 25).

Figure 35:
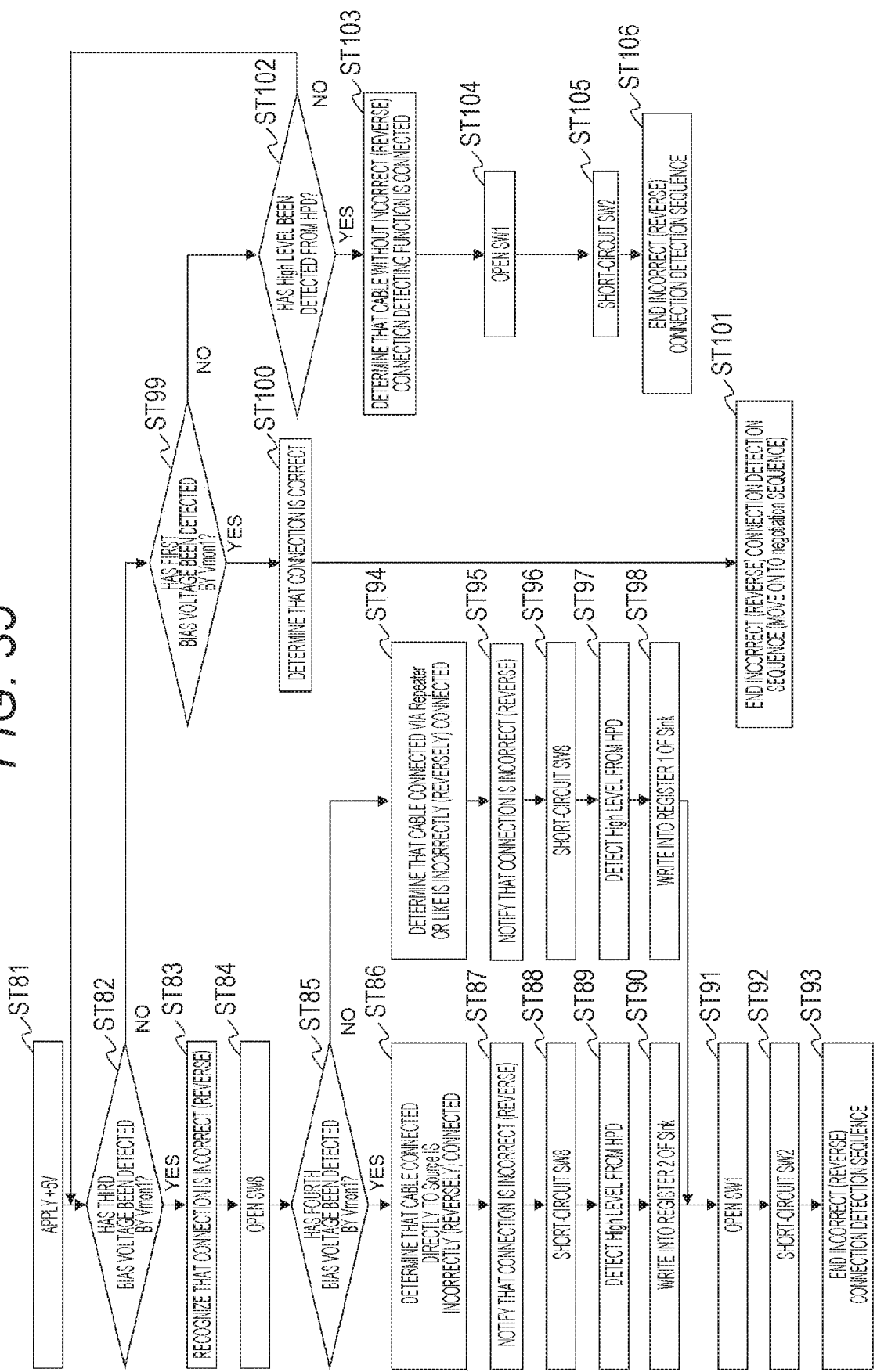
FIG. 35 is a diagram showing an example of an incorrect (reverse) cable connection detection sequence of the source device in the transmission system shown in FIG. 26.

FIG. 35 shows an example of the incorrect (reverse) cable connection detection sequence in the source device 110-1 in a case where the operation to determine whether the HDMI cable 130-1 is connected directly to the source device 110-1 is performed. In step ST81, when the power switch is turned on, and +5 V is applied, for example, the sequence is started and moves on to step ST82. In step ST82, the control unit 111 determines whether the voltage monitor unit 112 has detected the third bias voltage (1.25 V). If the third bias voltage (1.25 V) has been detected, the control unit 111 determines in step ST83 that the HDMI cable is incorrectly (reversely) connected.

Next, in step ST84, the control unit 111 changes the switch SW8 from a short-circuited state to an open state, to determine whether the incorrectly (reversely) connected HDMI cable is connected to directly to the source device. In step ST85, the control unit 111 then determines whether the voltage monitor unit 112 has detected a fourth bias voltage (1 V).

If the fourth bias voltage (1 V) has been detected, the control unit 111 determines in step ST86 that the HDMI cable connected directly to the source device is incorrectly (reversely) connected. In step ST87, the control unit 111 then controls the notification operation of the notification unit 113, to notify the user through display, voice, LED light emission, or the like. In this case, the display indicates that the connection of the HDMI cable connected to the source device is an incorrect (reverse) connection (see FIG. 30A), for example.

Next, in step ST88, the control unit 111 changes the switch SW8 from an open state to a short-circuited state. After the control unit 111 detects in step ST89 that the HPD line has switched to the high level (5 V), the control unit 111 in step ST90 then writes information indicating that the connection direction of the cable is the reverse direction, into the "register 2" of the EDID/register 121 of the sink device 120-1.

Next, in step ST91, the switch SW1 is changed from a short-circuited state to an open state. After a certain stand-by time, the control unit 111 then changes the switch SW2 from an open state to a short-circuited state in step ST92. After that, in step ST93, the sequence is ended.

If the fourth bias voltage (1 V) is not detected in step ST85, on the other hand, the control unit 111 determines in step ST94 that the HDMI cable connected via a repeater or the like is incorrectly (reversely) connected. In step ST95, the control unit 111 then controls the notification operation of the notification unit 113, to notify the user through display, voice, LED light emission, or the like. In this case, the display indicates that the connection of the HDMI cable connected to the destination device, which is the sink device, is an incorrect (reverse) connection (see FIG. 30B), for example.

Next, in step ST96, the control unit 111 changes the switch SW8 from an open state to a short-circuited state. After the control unit 111 detects in step ST97 that the HPD line has switched to the high level (5 V), the control unit 111 in step ST98 then writes information indicating that the connection direction of the cable is the reverse direction, into the "register 1" of the EDID/register 121 of the sink device 120-1.

Next, in step ST91, the switch SW1 is changed from a short-circuited state to an open state. After a certain stand-by time, the control unit 111 then changes the switch SW2 from an open state to a short-circuited state in step ST92. After that, in step ST93, the sequence is ended.

If the third bias voltage (1.25 V) is not detected in step ST82, on the other hand, the control unit 111 determines in step ST99 whether the first bias voltage (3.33 V) has been detected by the voltage monitor unit 112. If the first bias voltage (3.33V) has been detected, the control unit 111 determines in step ST100 that the connection is correct. After that, in step ST101, the sequence is ended and moves on to the negotiation operation described above.

If the first bias voltage (3.33 V) is not detected in step ST99, on the other hand, the control unit 111 determines in step ST102 whether or not the high level (5 V) of the HPD line has been detected. If the high level (5 V) of the HPD line is not detected, the sequence returns to step ST82. If the high level (5 V) of the HPD line is detected, on the other hand, the control unit 111 determines in step ST103 that an HDMI cable without an incorrect (reverse) connection detecting function is connected.

In step ST104, the control unit 111 then changes the switch SW1 from a short-circuited state to an open state. Next, in step ST105, the control unit 111 changes the switch SW2 from an open state to a short-circuited state. In step ST106, the sequence is then ended.

EXAMPLE 2

Figure 36:
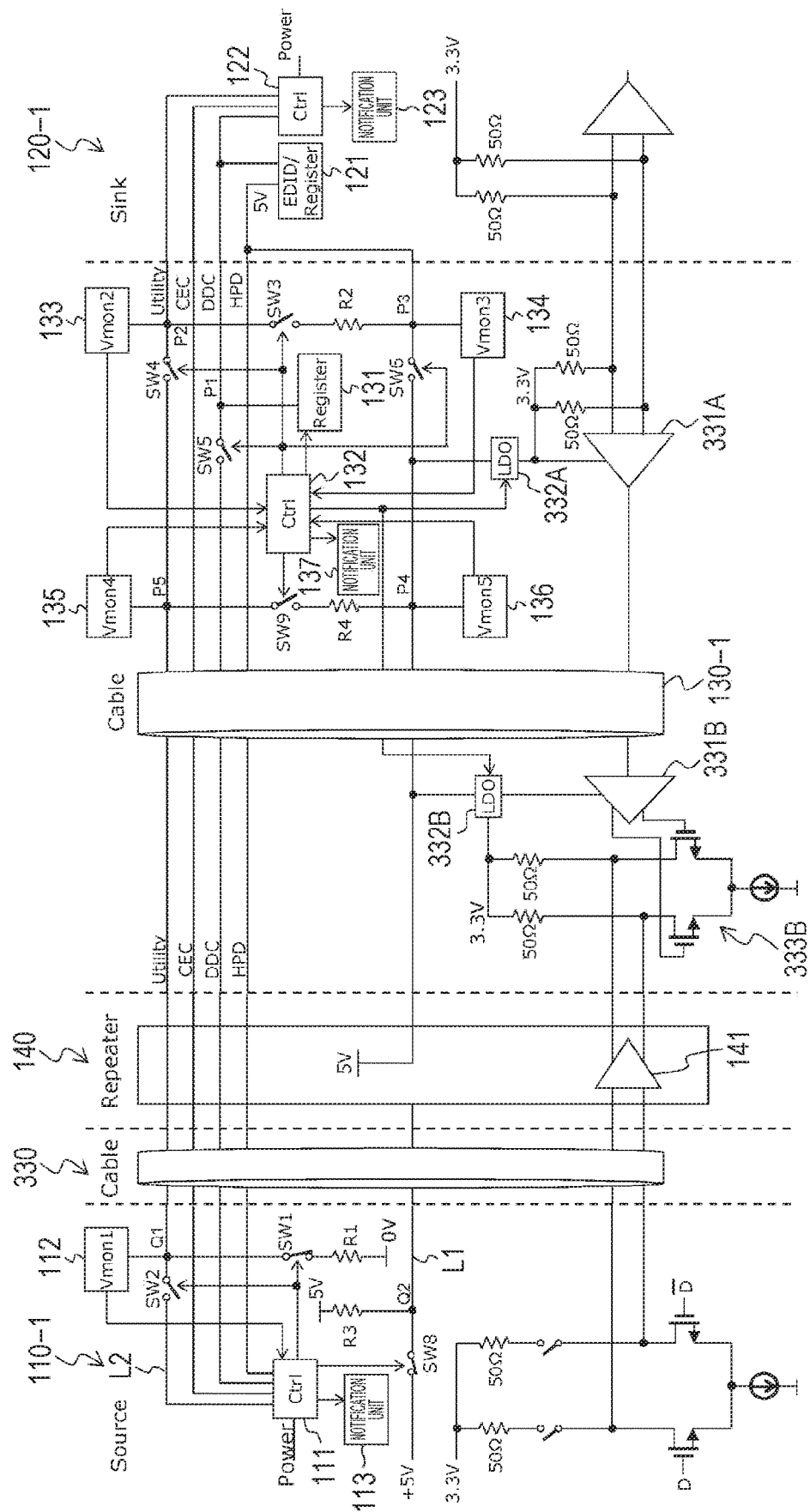
FIG. 36 is a diagram showing an example configuration (the HDMI cable being in a reverse connection state, a repeater being interposed) of a transmission system of Example 2.

FIG. 36 shows an example configuration of a transmission system 10-2. This transmission system 10-2 is an HDMI transmission system that uses HDMI as a digital interface. This transmission system 10-2 includes a source device 110-1 as a transmission device, a repeater 140 as a relay, a sink device 120-1 as a reception device, a cable 330 connecting the source device 110-1 and the repeater 140, and an HDMI cable 130-1 connecting the repeater 140 and the sink device 120-1.

In the above transmission system 10-1 shown in FIG. 26, the source device 110-1, which is a compatible source device, and the sink device 120-1 are connected directly to each other via the HDMI cable 130-1, which is a compatible cable. In the transmission system 10-2, however, the HDMI cable 330 and the repeater 140 are further inserted between the source device 110-1 and the HDMI cable 130-1. In FIG. 36, the components corresponding to the components shown in FIGS. 1 and 26 are denoted by the same reference numerals as those used in FIGS. 1 and 26, and detailed explanation of them is not repeated herein. Note that the control line is in a state where the input and the output are connected in the repeater 140.

Here, the repeater 140 has an amplifier 141 on the data line. The repeater 140 also has a power supply of a system different from the +5 V power-supply line supplied from the source device 110-1, and 5 V is supplied to the sink device 120-1 from this power supply of the different system through the +5 V power-supply line of the HDMI cable 130-1. In this case, the +5 V power-supply line is separated by the repeater 140 between the source device 110-1 and the HDMI cable 130-1. Here, the input and the output of the control line such as the utility line of the repeater 140 are further connected with low impedance.

FIG. 36 shows a case where the connection direction of the HDMI cable 130-1 is the reverse direction in the transmission system 10-2. Also, in FIG. 36, the source device 110-1 and the HDMI cable 130-1 exhibit an initial state.

Figure 37:
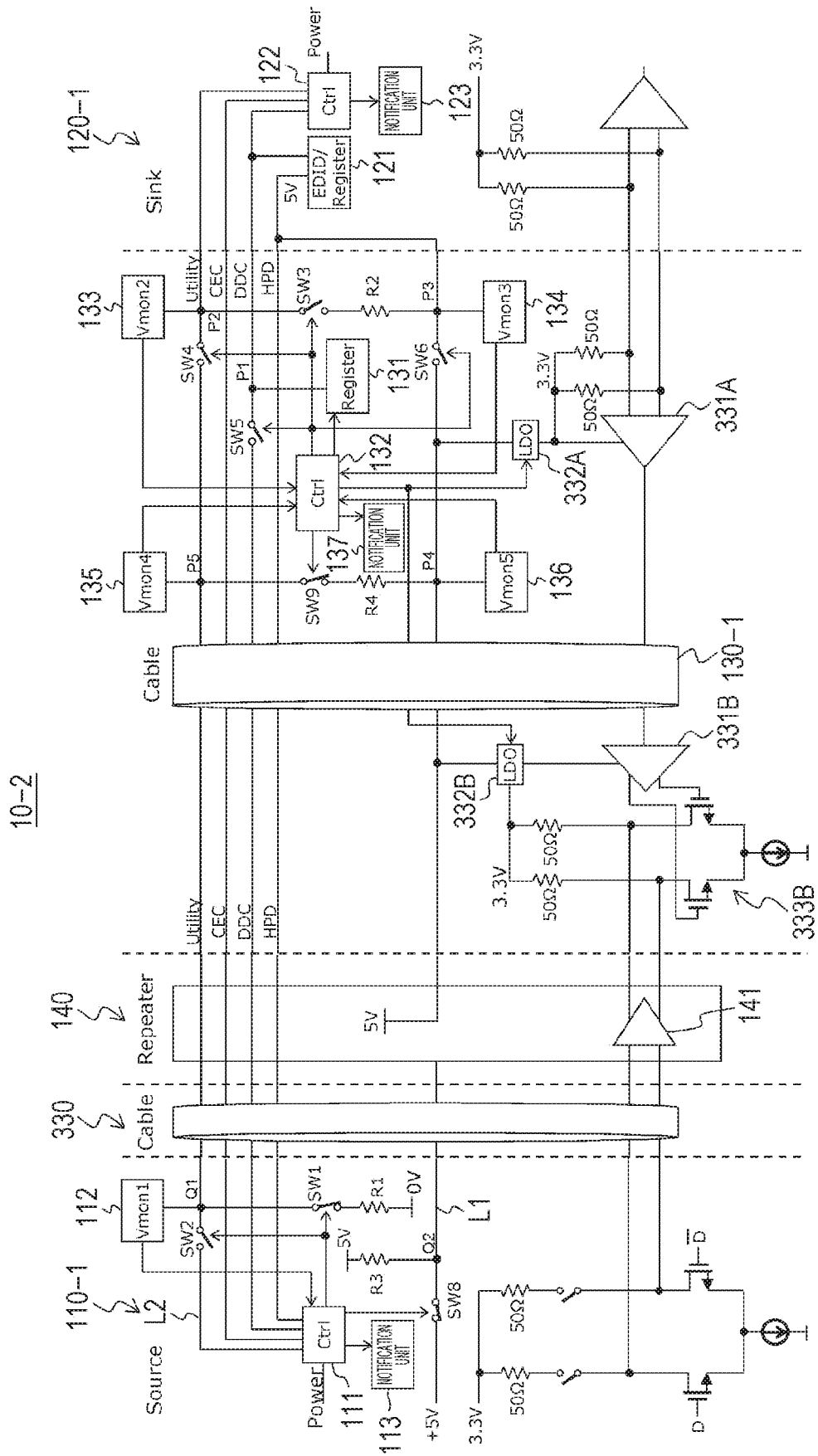
FIG. 37 is a diagram for explaining an operation of the transmission system shown in FIG. 36.

In this initial state, the voltage monitor unit 136 of the HDMI cable 130-1 monitors that the voltage at the point P4 is 5 V, and sends the monitor result to the control unit 132. Likewise, the voltage monitor unit 134 of the HDMI cable 130-1 monitors that the voltage at the point P3 is not 5 V, and sends the monitor result to the control unit 132. On the basis of these monitor results, the control unit 132 determines that the connection direction of the cable is the reverse direction, and puts the switch SW9 into a short-circuited state, as shown in FIG. 37.

When the switch SW9 is put into a short-circuited state, the resistors R1 and R4 are connected in series between the ground (0 V) of the source device 110-1 and the +5 V power-supply line of the HDMI cable 130-1, and a voltage of 1.25 V, which is bias voltage 3, is obtained at the points Q1 and P2 through resistance voltage division. In this arrangement, the HDMI cable 130-1 transmits information indicating that the direction of the cable is the reverse direction, to the source device 110-1, via the utility line. The voltage monitor unit 112 of the source device 110-1 monitors that the voltage at the point Q1 is 1.25 V, and sends the monitor result to the control unit 111. On the basis of this monitor result, the control unit 111 recognizes the existence of the HDMI cable 130-1 whose connection direction is the reverse direction.

Figure 38:
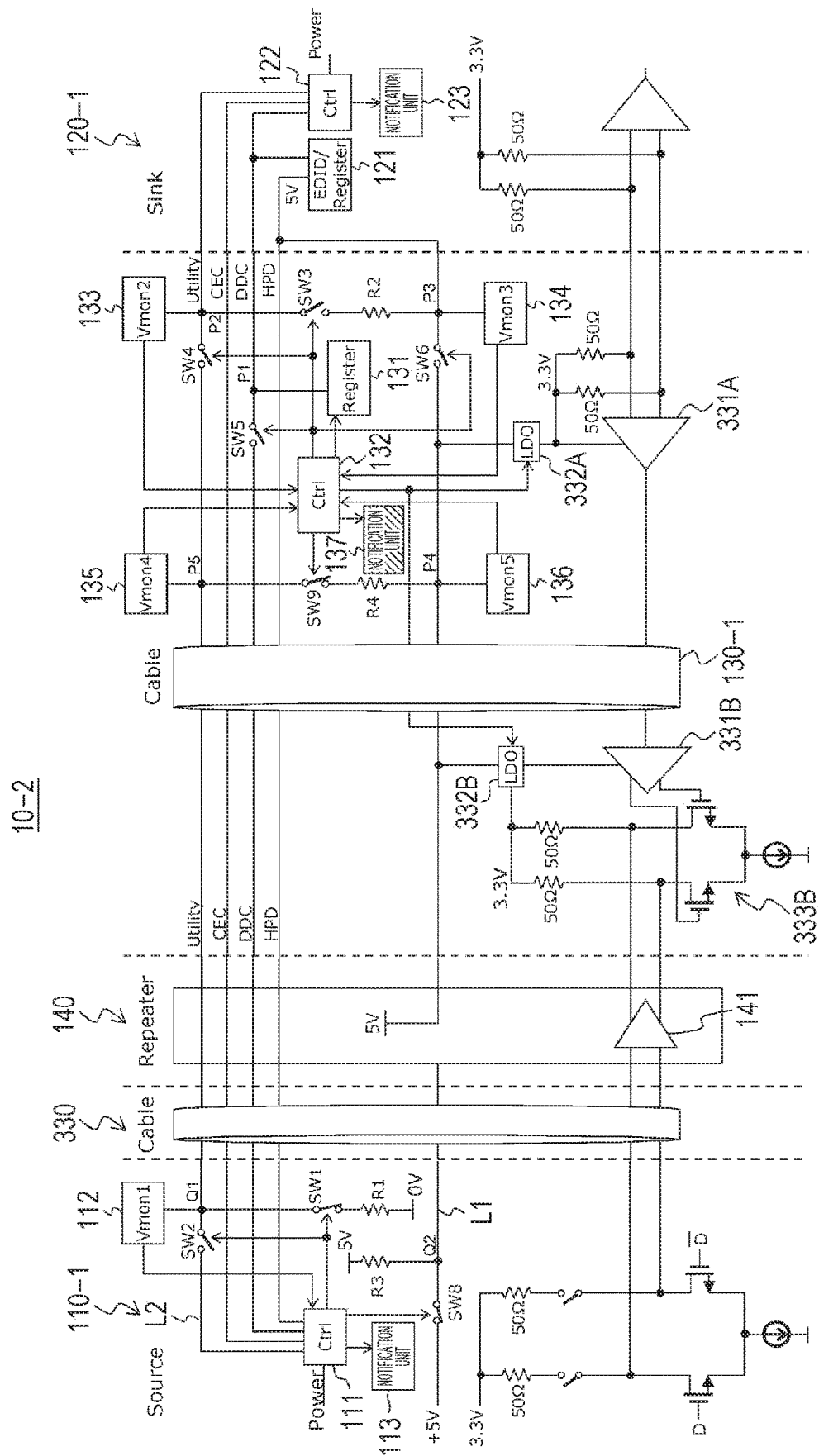
FIG. 38 is a diagram for explaining an operation of the transmission system shown in FIG. 36.

On the basis of the determination that the connection direction of the cable is the reverse direction, the control unit 132 of the HDMI cable 130-1 controls the notification operation of the notification unit 137, to notify the user that the connection direction of the cable is the reverse direction, as indicated by the shaded portion of the notification unit 137 in FIG. 38. This notification is issued through light emission, a buzzer sound, or the like (see FIGS. 18A and 18B).

Figure 39:
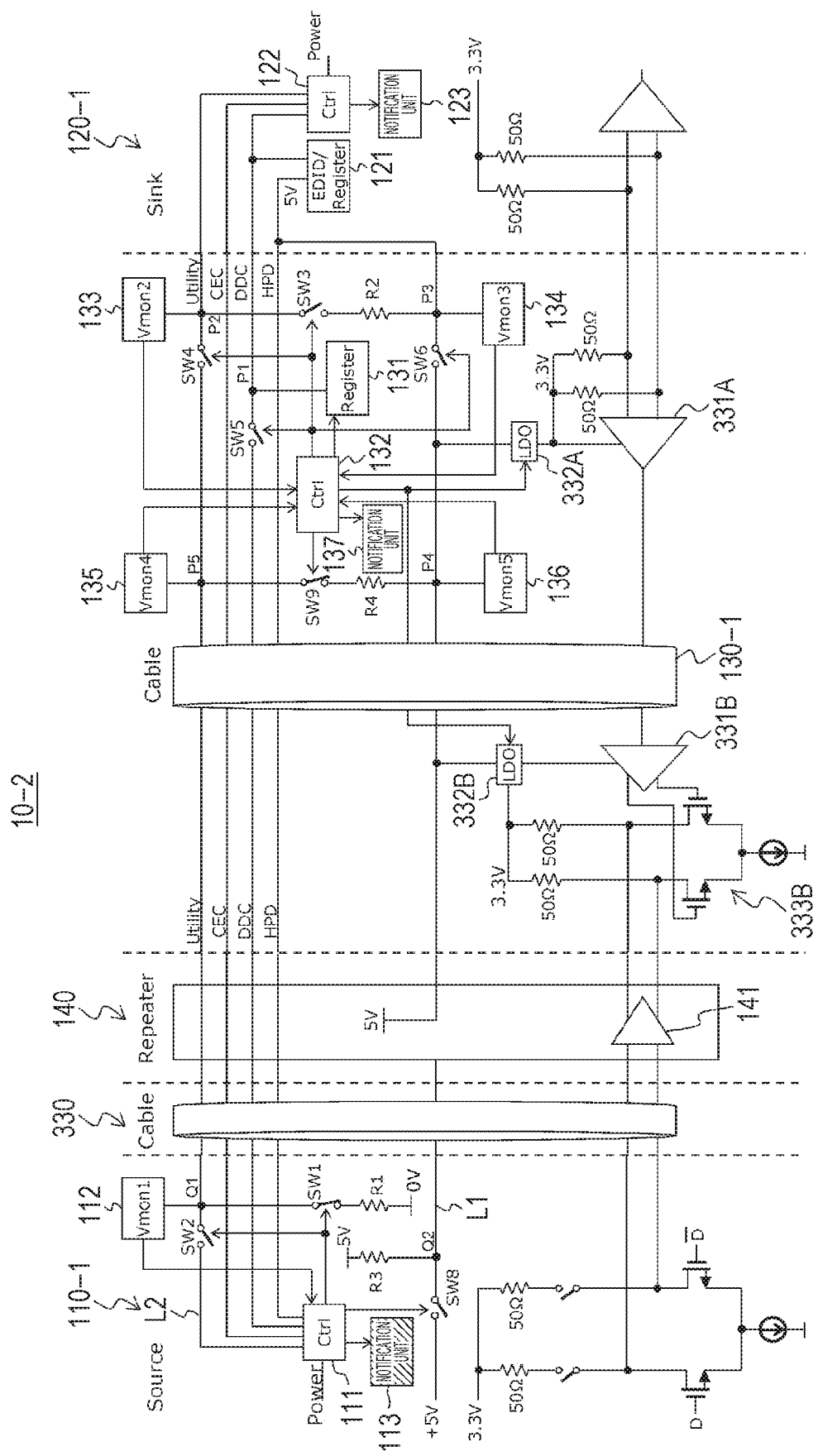
FIG. 39 is a diagram for explaining an operation of the transmission system shown in FIG. 36.

After recognizing the existence of the HDMI cable 130-1 whose connection direction is the reverse direction, the control unit 111 of the source device 110-1 further puts the switch SW8 into an open state as shown in FIG. 39, to determine whether the HDMI cable 130-1 is connected directly to the source device 110-1. At this point of time, the +5 V power-supply line of the HDMI cable 330, to which power is supplied through the first path L1 of the source device 110-1, and the +5 V power-supply line of the HDMI cable 130-1 are separated in the repeater 140. Therefore, the resistor R3 is not connected in series to the resistors R1 and R4, so that the voltage at the point Q1 does not change from 1.25 V, which is the bias voltage 3.

On the basis of a 1.25 V monitor result from the voltage monitor unit 112, the control unit 111 of the source device 110-1 determines that a relay device such as a repeater that separates the +5 V power-supply line is interposed between the source device 110-1 and the HDMI cable 130-1, and the HDMI cable 130-1 whose connection direction is the reverse direction is not connected directly to the source device 110-1.

Further, on the basis of the recognition that the connection direction of the HDMI cable 130-1 is the reverse direction, and the determination that the HDMI cable 130-1 is not connected directly to the source device 110-1, the control unit 111 of the source device 110-1 controls the notification operation of the notification unit 113, to notify the user of the facts, as indicated by the shaded portion of the notification unit 113 in FIG. 39. This notification is issued through display, voice, or the like. In this case, the display unit displays that there is an HDMI cable whose connection direction is the reverse direction, and that the HDMI cable is not connected directly to the source device 110-1 (see FIG. 30B), for example.

Figure 40:
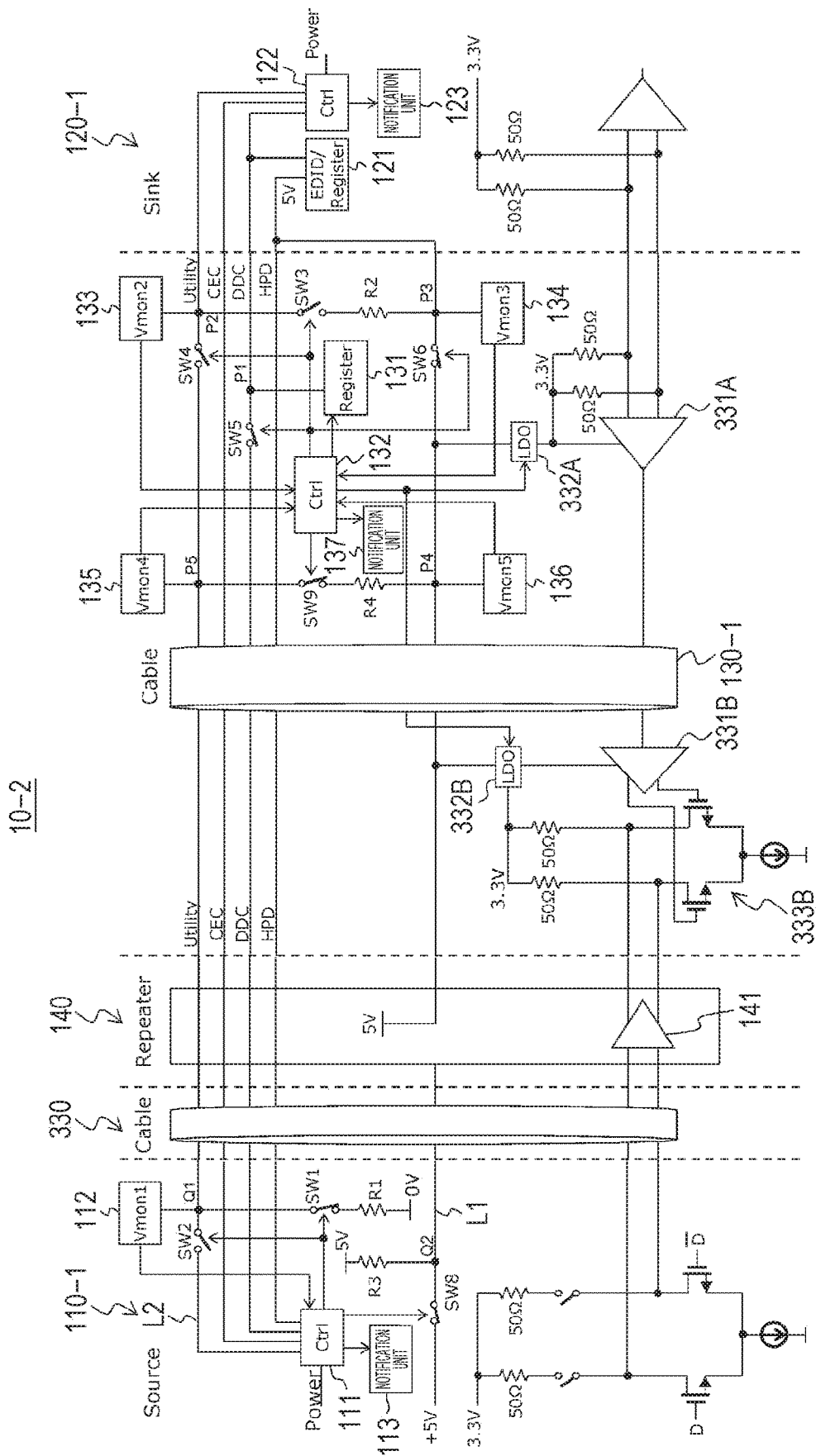
FIG. 40 is a diagram for explaining an operation of the transmission system shown in FIG. 36.

After a certain time has passed since the voltage monitor unit 135 detected 1.25 V, which is the bias voltage 3, the control unit 132 of the HDMI cable 130-1 puts the switch SW6 into a short-circuited state and the switch SW5 into a short-circuited state as shown in FIG. 40, even though 1 V, which is bias voltage 4, has not been detected. As the switch SW6 is put into a short-circuited state, a 5 V voltage can be sent from the +5 V power-supply line of the HDMI cable 130-1 to the sink device 120-1. Further, as the switch SW5 is put into a short-circuited state, it becomes possible to access the EDID/register 121 of the sink sink device 120-1 from the source device 110-1 via the DDC line.

In a case where the control unit 111 of the source device 110-1 receives a 5 V voltage (a connection detection signal) from the sink device 120-1 via the HPD line as a 5 V voltage is supplied to the sink device 120-1 through the +5 V power-supply line, the control unit 111 determines that the sink device 120-1 is connected. The control unit 111 then accesses the EDID/register 121 of the sink sink device 120-1 via the DDC line, and writes information indicating that the connection direction of the cable is the reverse direction, into "register 1" of the EDID/register 121.

Figure 41:
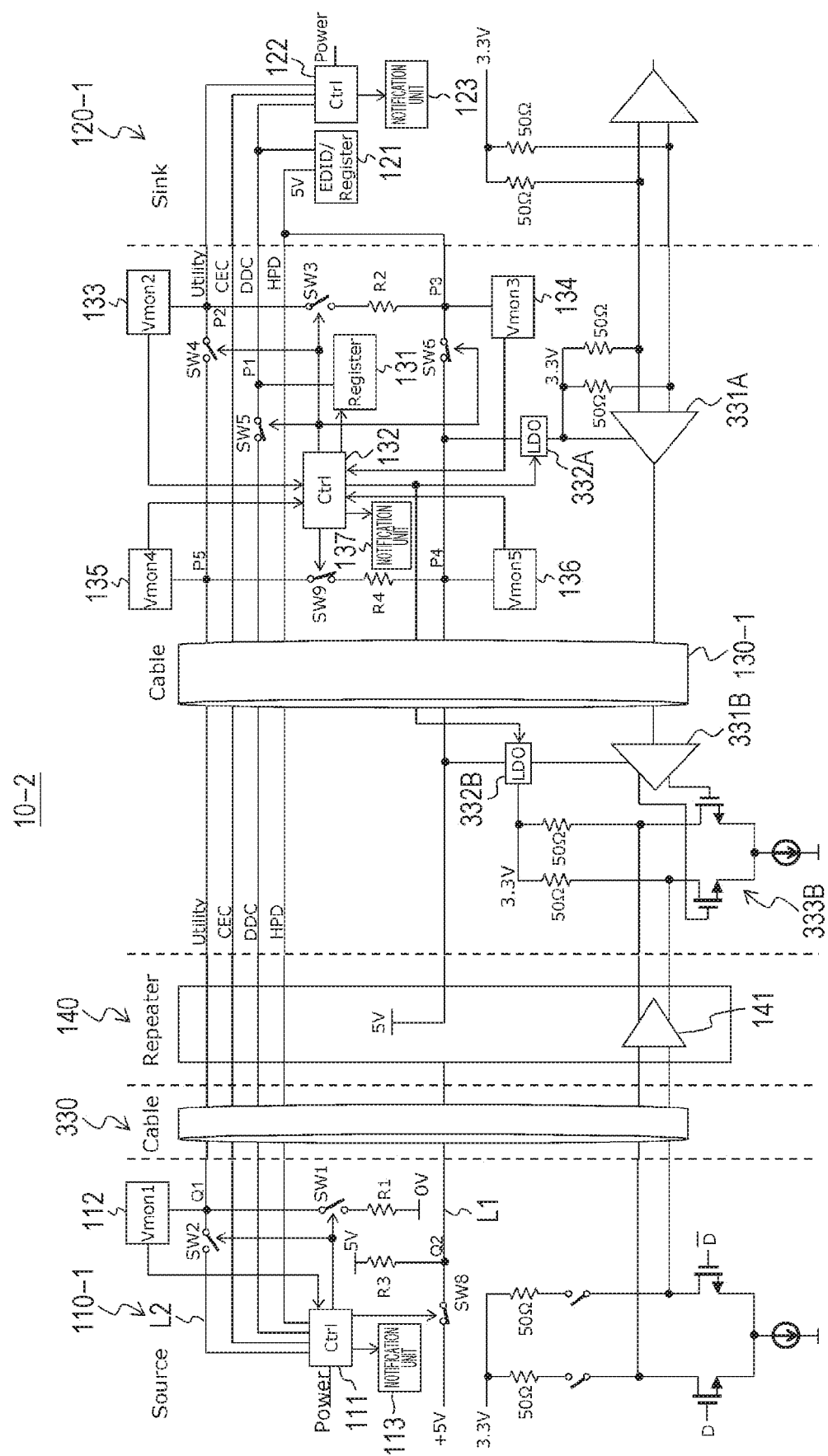
FIG. 41 is a diagram for explaining an operation of the transmission system shown in FIG. 36.

After completing the access to the EDID/register 121 described above, the control unit 111 of the source device 110-1 puts the switch SW1 into an open state, as shown in FIG. 41. Therefore, the voltage at the point P5 of the utility line changes to 5 V. In the HDMI cable 130-1, the voltage monitor unit 135 monitors that the voltage at the point P5 is 5 V, and sends the monitor result to the control unit 132.

Figure 42:
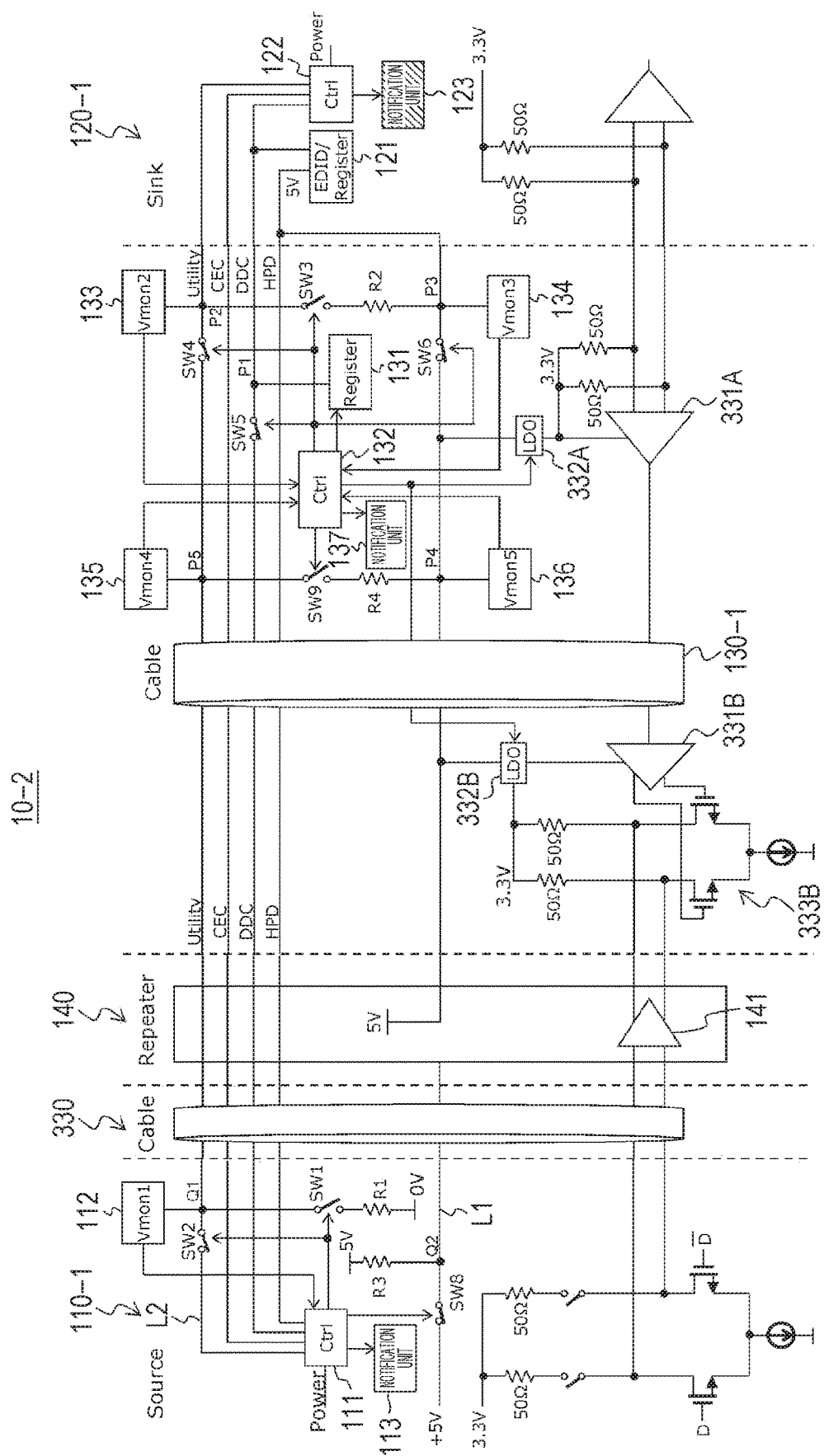
FIG. 42 is a diagram for explaining an operation of the transmission system shown in FIG. 36.

On the basis of this monitor result, the control unit 132 of the HDMI cable 130-1 puts the switch SW9 into an open state and the switch SW4 into a short-circuited state, as shown in FIG. 42. When a certain stand-by time has passed since the control unit 111 of the source device 110-1 put the switch SW1 into an open state, the control unit 111 further puts the switch SW2 into a short-circuited state, as shown in FIG. 42.

Meanwhile, on the basis of information written in the "register 1" of the EDID/register 121, the control unit 122 of the sink device 120-1 displays that the connection direction of the HDMI cable 130-1 is the reverse direction, and that the HDMI cable is not connected directly to the source device 110-1 (see FIG. 34B), as indicated by the shaded portion of the notification unit 123 in FIG. 42.

As shown in FIG. 36, in a case where the connection direction of the HDMI cable 130-1 connecting the repeater 140 and the sink device 120-1 is the reverse direction, information indicating that the connection direction of the cable is the reverse direction is sent from the HDMI cable 130-1 to the source device 110-1 through the utility line as described above. After that, 1 V, which is "bias voltage 4", is not generated at the point Q1, even if the switch SW8 is put into an open state. Thus, the source device 110-1 can determine that the HDMI cable 130-1 whose connection direction is the reverse direction is not connected directly thereto.

The source device 110-1 and the sink device 120-1 then display that there is an HDMI cable whose connection direction is the reverse direction, and that the HDMI cable is not connected directly to the source device 110-1. Thus, the user can recognize from the source device 110-1 or the sink device 120-1 that there is an HDMI cable whose the connection direction is the reverse direction and that the HDMI cable is not connected directly to the source device 110-1, and easily correct the connection.

EXAMPLE 3

Figure 43:
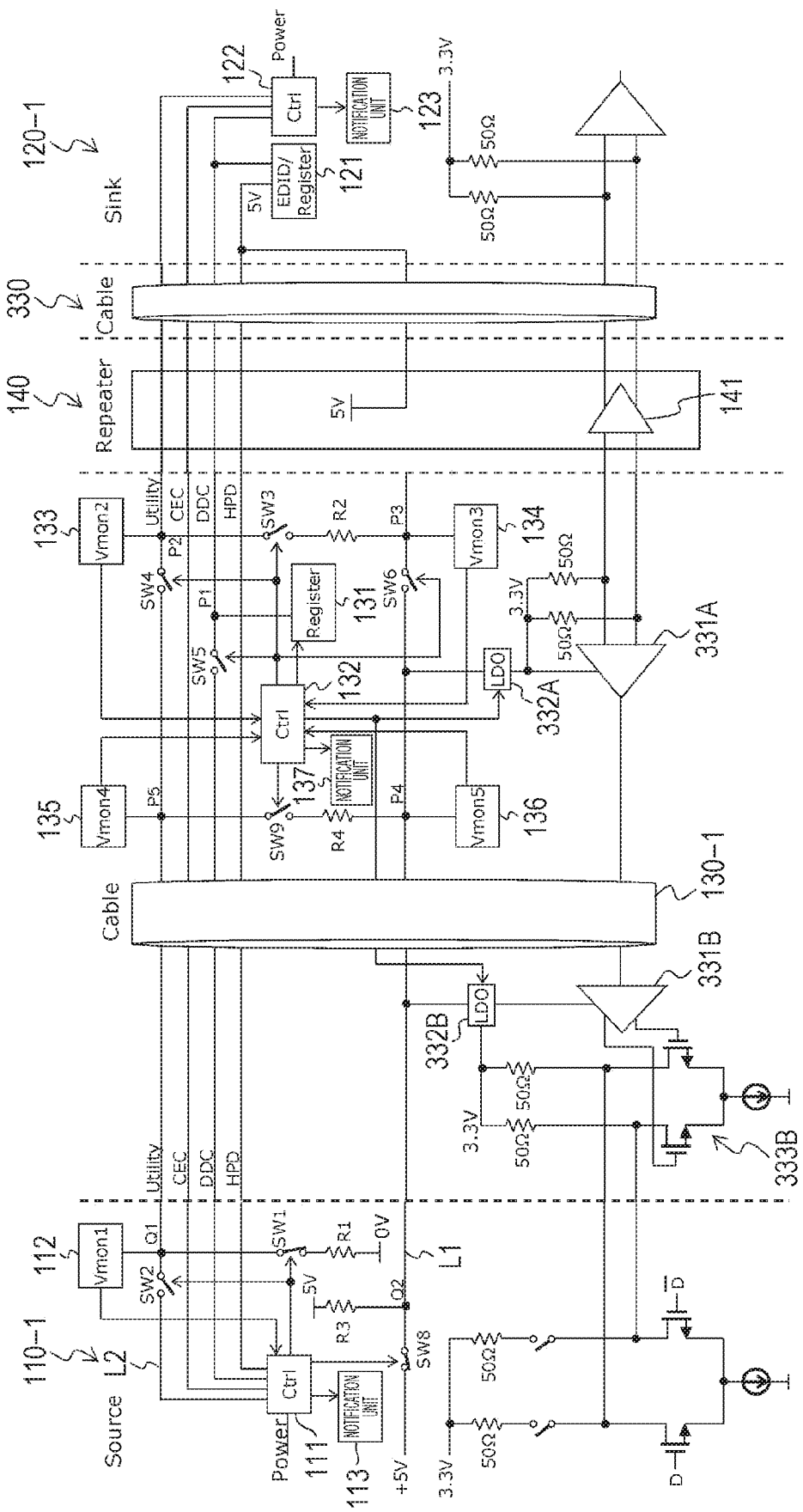
FIG. 43 is a diagram showing an example configuration (the HDMI cable being in a reverse connection state, a repeater being interposed) of a transmission system of Example 3.

FIG. 43 shows an example configuration of a transmission system 10-3. This transmission system 10-3 is an HDMI transmission system that uses HDMI as a digital interface. This transmission system 10-3 includes a source device 110-1 as a transmission device, a repeater 140 as a relay, a sink device 120-1 as a reception device, an HDMI cable 130-1 connecting the source device 110-1 and the repeater 140, and a cable 330 connecting the repeater 140 and the sink device 120-1.

In the above transmission system 10-1 shown in FIG. 26, the source device 110-1, which is a compatible source device, and the sink device 120-1 are connected directly to each other via the HDMI cable 130-1, which is a compatible cable. In the transmission system 10-3, however, the repeater 140 and the HDMI cable 330 are further inserted between the HDMI cable 130-1 and the sink device 120-1. In FIG. 43, the components corresponding to the components shown in FIGS. 1 and 26 are denoted by the same reference numerals as those used in FIGS. 1 and 26, and detailed explanation of them is not repeated herein. Note that the control line is in a state where the input and the output are connected in the repeater 140.

Here, the repeater 140 has an amplifier 141 on the data line. The repeater 140 also has a power supply of a system different from the +5 V power-supply line supplied from the source device 110-1, and 5 V is supplied to the sink device 120-1 from this power supply of the different system through the +5 V power-supply line of the HDMI cable 330. In this case, the +5 V power-supply line is separated by the repeater 140 between the HDMI cable 130-1 and the sink device 120-1. Here, the input and the output of the control line such as the utility line of the repeater 140 are further connected with low impedance.

FIG. 43 shows a case where the connection direction of the HDMI cable 130-1 is the reverse direction in the transmission system 10-3. Also, in FIG. 43, the source device 110-1 and the HDMI cable 130-1 exhibit an initial state.

Figure 44:
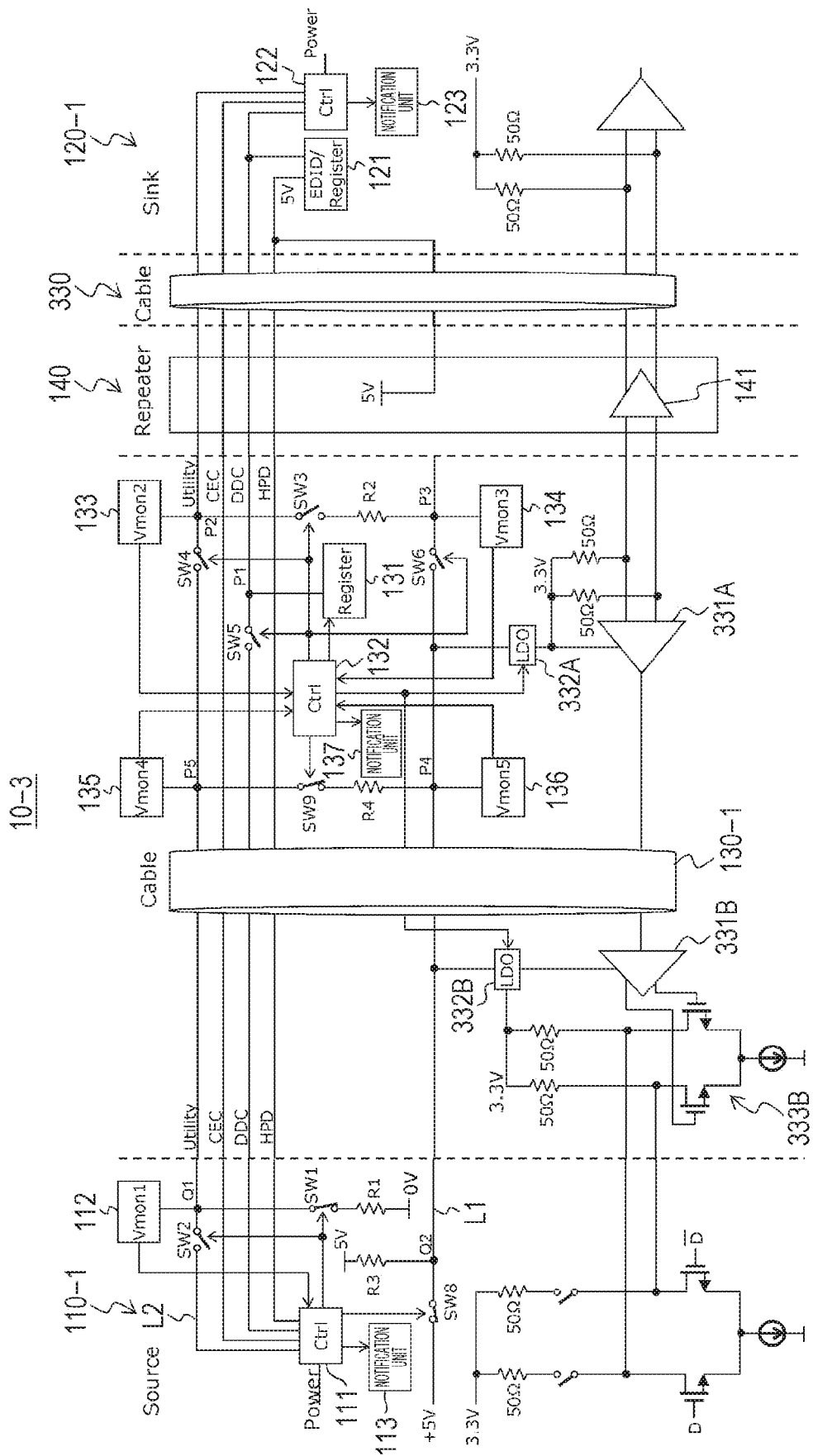
FIG. 44 is a diagram for explaining an operation of the transmission system shown in FIG. 43.

In this initial state, the voltage monitor unit 136 of the HDMI cable 130-1 monitors that the voltage at the point P4 is 5 V, and sends the monitor result to the control unit 132. Likewise, the voltage monitor unit 134 of the HDMI cable 130-1 monitors that the voltage at the point P3 is not 5 V, and sends the monitor result to the control unit 132. On the basis of these monitor results, the control unit 132 determines that the connection direction of the cable is the reverse direction, and puts the switch SW9 into a short-circuited state, as shown in FIG. 44.

When the switch SW9 is put into a short-circuited state, the resistors R1 and R4 are connected in series between the ground (0 V) of the source device 110-1 and the +5 V power-supply line of the HDMI cable 130-1, and a voltage of 1.25 V, which is bias voltage 3, is obtained at the points Q1 and P2 through resistance voltage division. In this arrangement, the HDMI cable 130-1 transmits information indicating that the direction of the cable is the reverse direction, to the source device 110-1, via the utility line. The voltage monitor unit 112 of the source device 110-1 monitors that the voltage at the point Q1 is 1.25 V, and sends the monitor result to the control unit 111. On the basis of this monitor result, the control unit 111 recognizes the existence of the HDMI cable 130-1 whose connection direction is the reverse direction.

Figure 45:
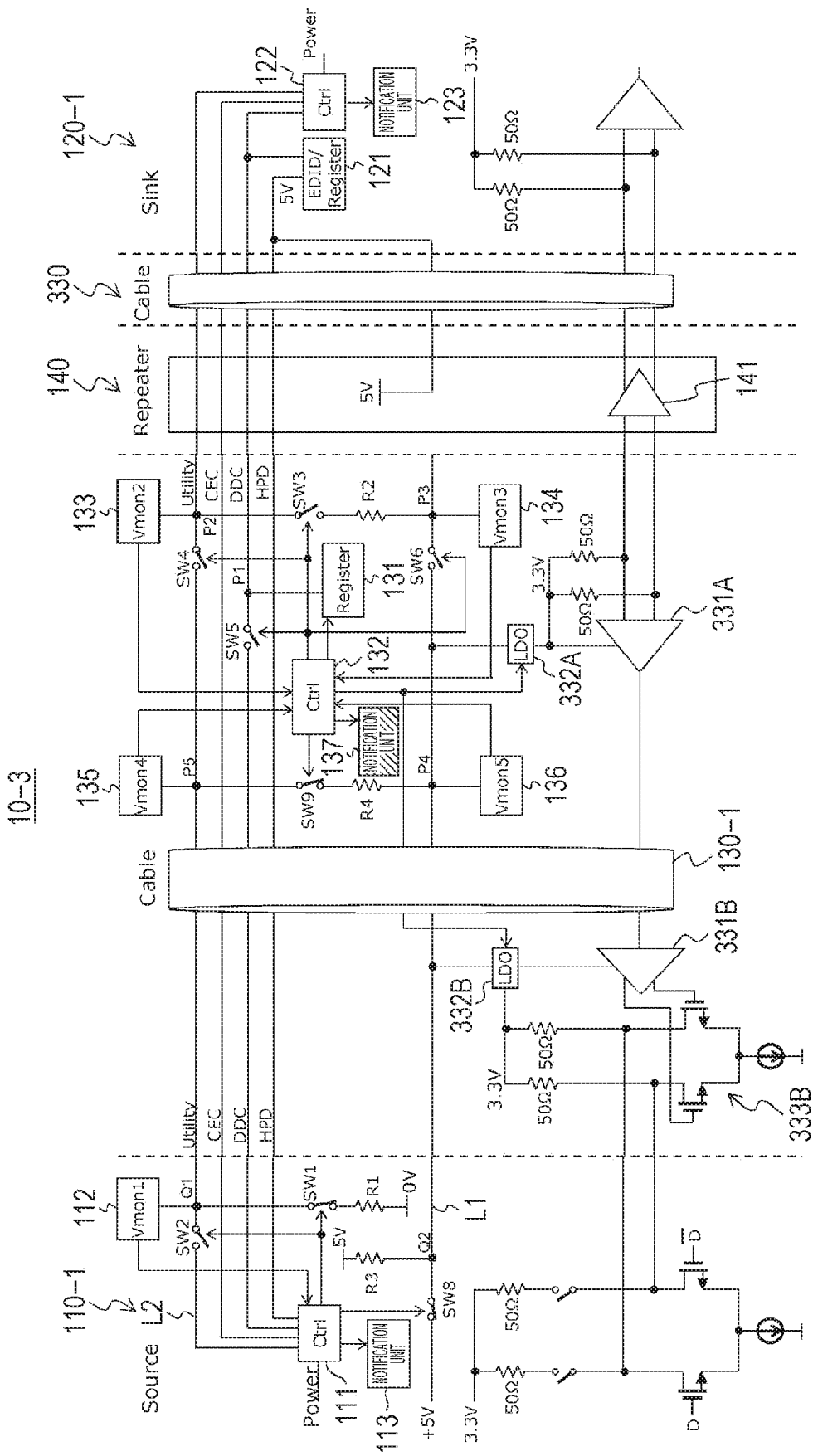
FIG. 45 is a diagram for explaining an operation of the transmission system shown in FIG. 43.

On the basis of the determination that the connection direction of the cable is the reverse direction, the control unit 132 of the HDMI cable 130-1 controls the notification operation of the notification unit 137, to notify the user that the connection direction of the cable is the reverse direction, as indicated by the shaded portion of the notification unit 137 in FIG. 45. This notification is issued through light emission, a buzzer sound, or the like (see FIGS. 18A and 18B).

Figure 46:
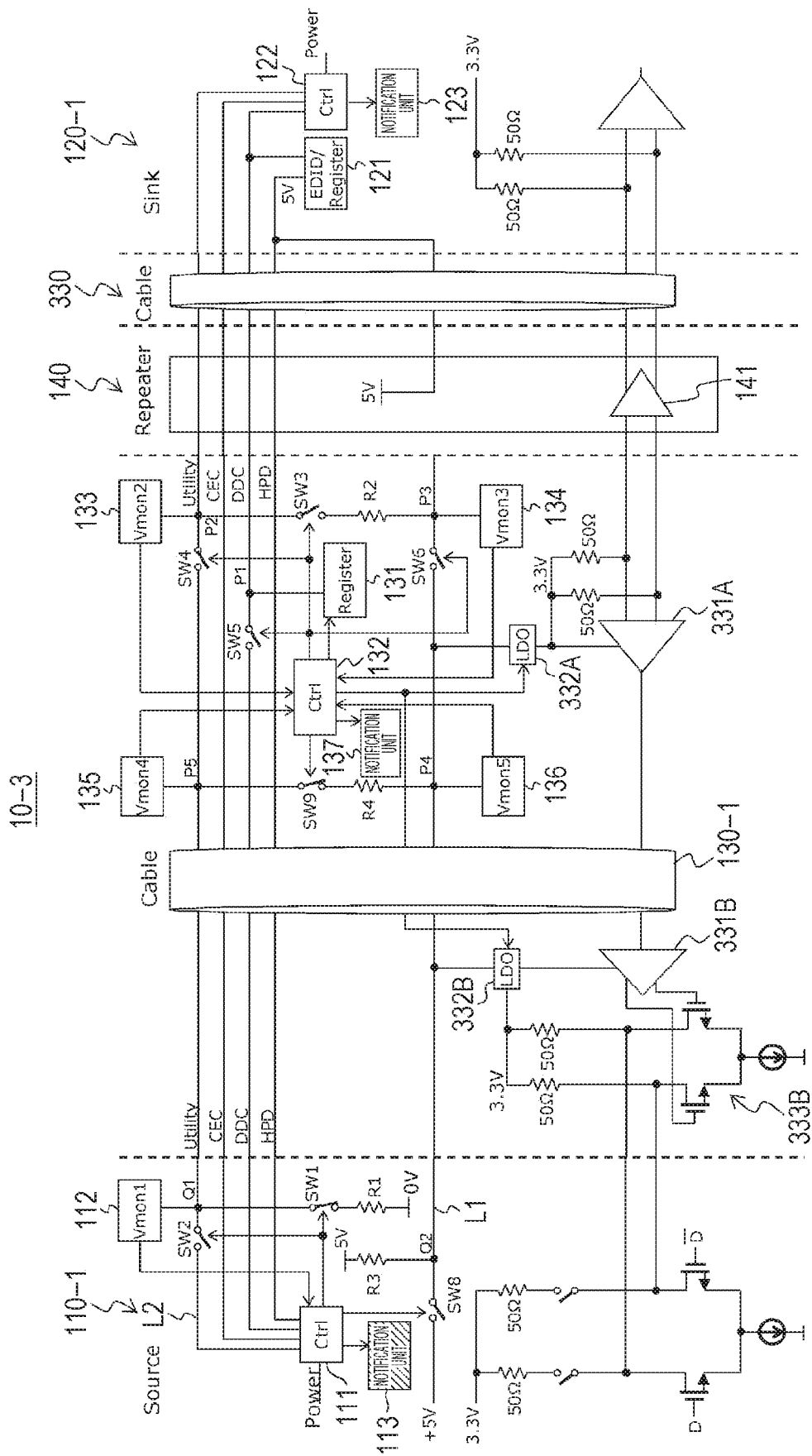
FIG. 46 is a diagram for explaining an operation of the transmission system shown in FIG. 43.

After recognizing the existence of the HDMI cable 130-1 whose connection direction is the reverse direction, the control unit 111 of the source device 110-1 further puts the switch SW8 into an open state as shown in FIG. 46, to determine whether the HDMI cable 130-1 is connected directly to the source device 110-1. Here, the resistor R3 is connected in series to the resistors R1 and R4, and a voltage of 1 V, which is the bias voltage 4, is obtained at the points Q1 and P5 through resistance voltage division.

The voltage monitor unit 112 of the source device 110-1 monitors that the voltage at the point Q1 is 1 V, and sends the monitor result to the control unit 111. On the basis of this monitor result, the control unit 111 determines that the HDMI cable 130-1 is connected directly to the source device 110-1.

Further, on the basis of the recognition that the connection direction of the HDMI cable 130-1 is the reverse direction, and the determination that the HDMI cable 130-1 is connected directly to the source device 110-1, the control unit 111 of the source device 110-1 controls the notification operation of the notification unit 113, to notify the user of the facts, as indicated by the shaded portion of the notification unit 113 in FIG. 46. This notification is issued through display, voice, or the like. In this case, the display unit displays that there is an HDMI cable whose connection direction is the reverse direction, and that the HDMI cable is connected directly to the source device 110-1 (see FIG. 30A), for example.

Figure 47:
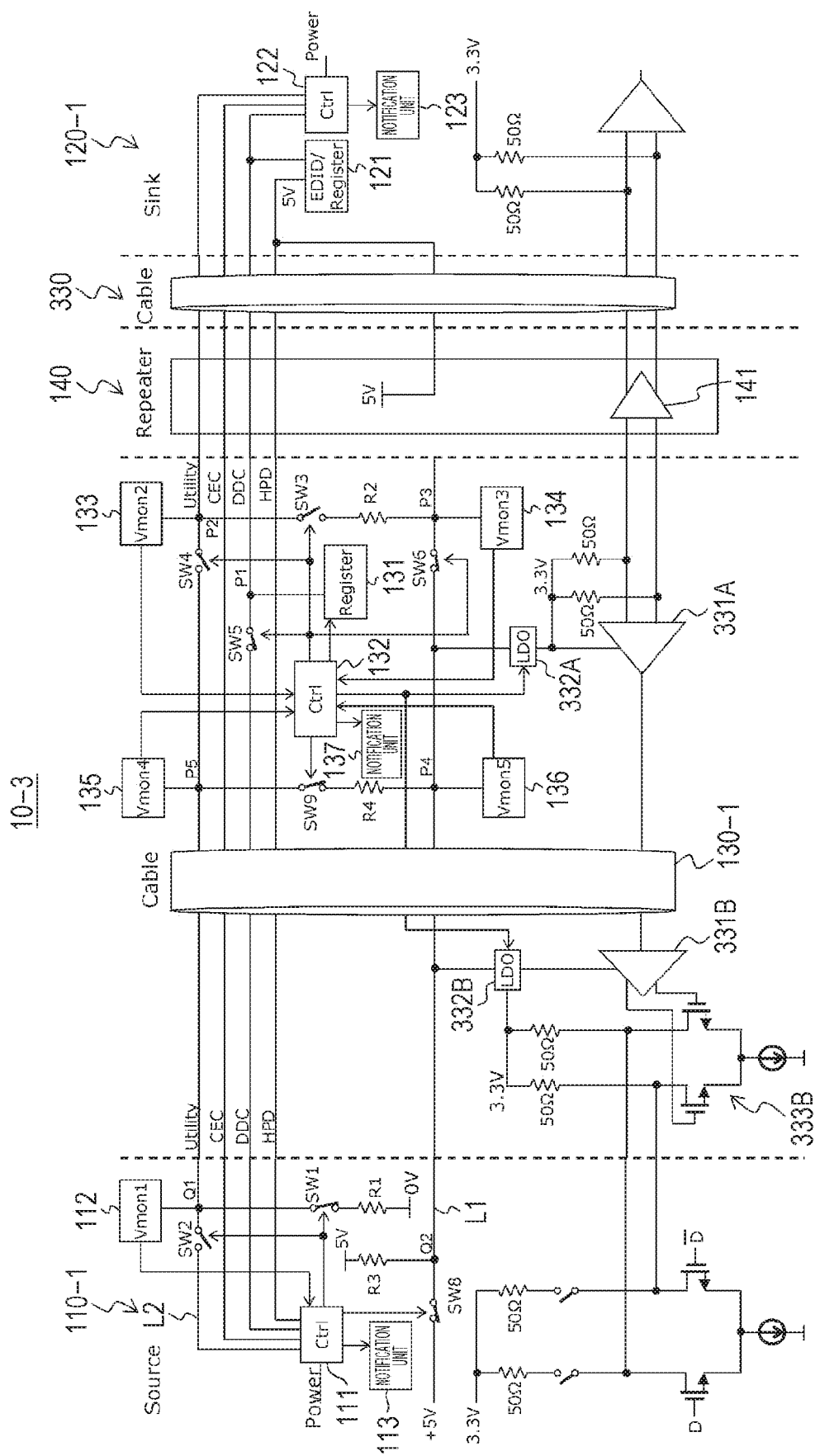
FIG. 47 is a diagram for explaining an operation of the transmission system shown in FIG. 43.

In a case where 1 V, which is the bias voltage 4, is detected after the voltage monitor unit 135 detected 1.25 V, which is the bias voltage 3, the control unit 132 of the HDMI cable 130-1 puts the switch SW6 into a short-circuited state and the switch SW5 into a short-circuited state, as shown in FIG. 47. As the switch SW6 is put into a short-circuited state, a 5 V voltage can be sent from the +5 V power-supply line of the HDMI cable 130-1 to the sink device 120-1. Further, as the switch SW5 is put into a short-circuited state, it becomes possible to access the EDID/register 121 of the sink sink device 120-1 from the source device 110-1 via the DDC line.

In a case where the control unit 111 of the source device 110-1 receives a 5 V voltage (a connection detection signal) from the sink device 120-1 via the HPD line as a 5 V voltage is supplied to the sink device 120-1 through the +5 V power-supply line, the control unit 111 determines that the sink device 120-1 is connected. The control unit 111 then accesses the EDID/register 121 of the sink sink device 120-1 via the DDC line, and writes information indicating that the connection direction of the cable is the reverse direction, into "register 2" of the EDID/register 121.

Figure 48:
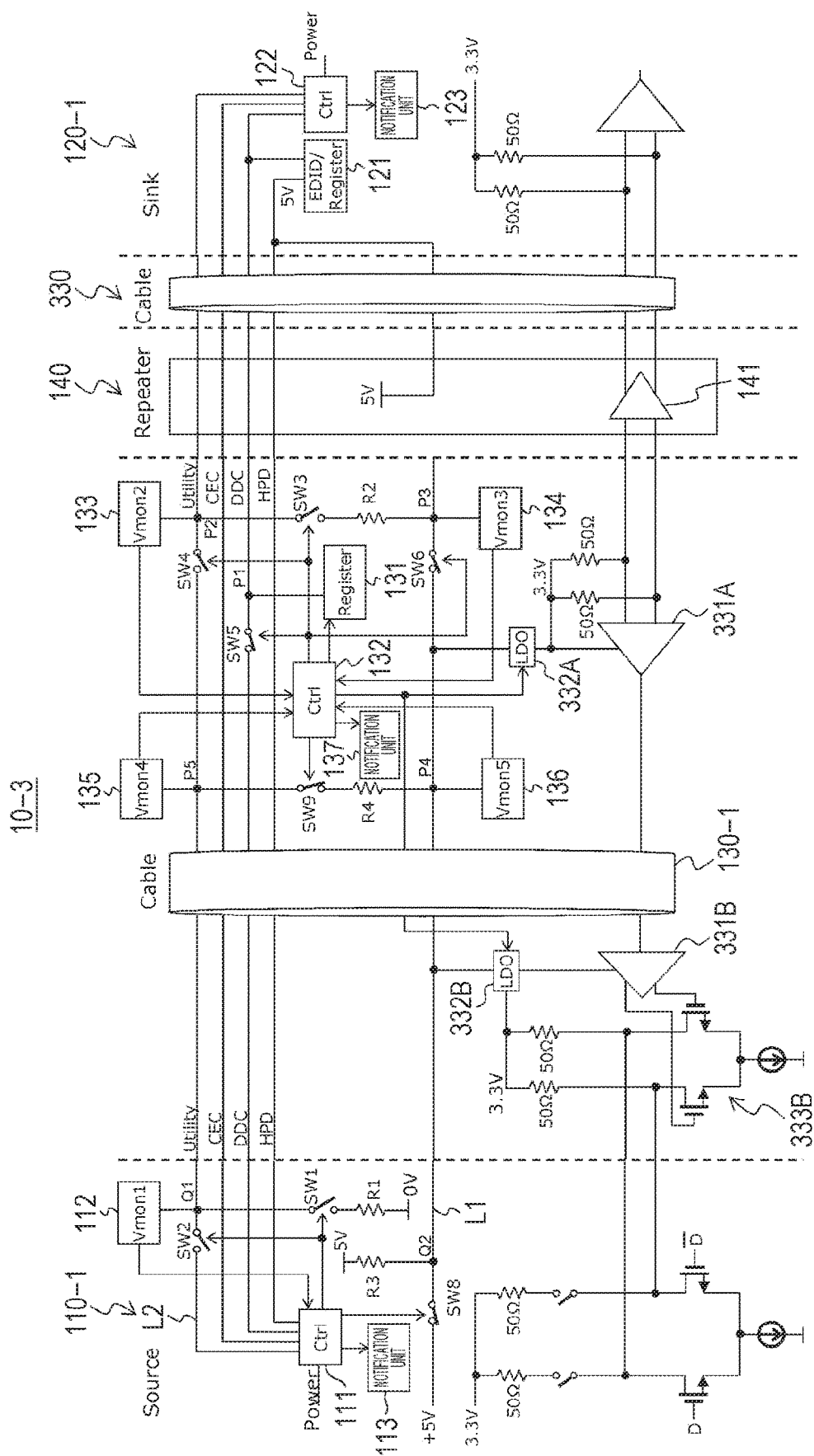
FIG. 48 is a diagram for explaining an operation of the transmission system shown in FIG. 43.

After completing the access to the EDID/register 121 described above, the control unit 111 of the source device 110-1 puts the switch SW1 into an open state, as shown in FIG. 48. Therefore, the voltage at the point P5 of the utility line changes to 5 V. In the HDMI cable 130-1, the voltage monitor unit 135 monitors that the voltage at the point P5 is 5 V, and sends the monitor result to the control unit 132.

Figure 49:
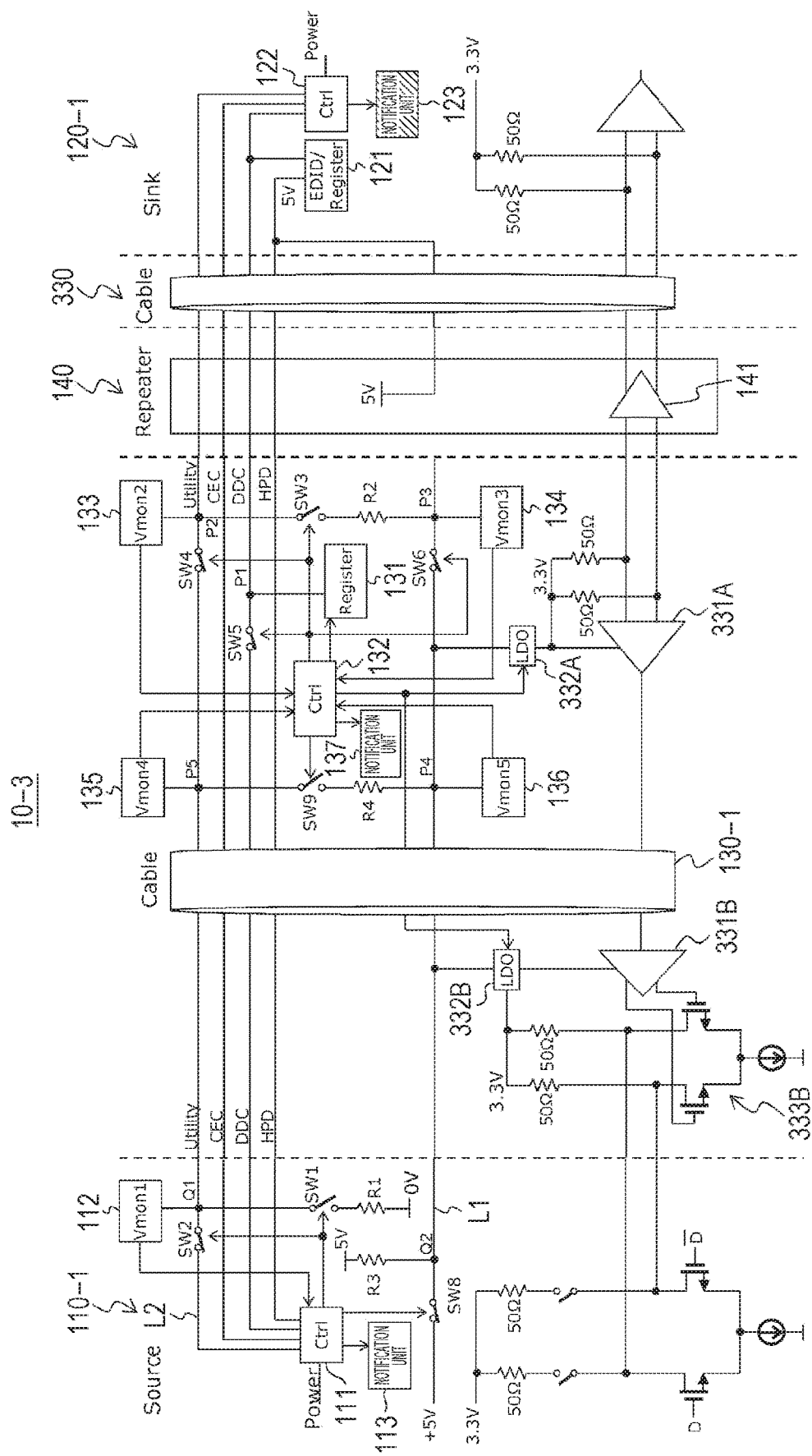
FIG. 49 is a diagram for explaining an operation of the transmission system shown in FIG. 43.

On the basis of this monitor result, the control unit 132 of the HDMI cable 130-1 puts the switch SW9 into an open state and the switch SW4 into a short-circuited state, as shown in FIG. 49. When a certain stand-by time has passed since the control unit 111 of the source device 110-1 put the switch SW1 into an open state, the control unit 111 further puts the switch SW2 into a short-circuited state, as shown in FIG. 49.

Meanwhile, on the basis of information written in the "register 2" of the EDID/register 121, the control unit 122 of the sink device 120-1 displays that the connection direction of the HDMI cable 130-1 is the reverse direction, and that the HDMI cable is connected directly to the source device 110-1 (see FIG. 34A), as indicated by the shaded portion of the notification unit 123 in FIG. 49.

As shown in FIG. 43, in a case where the connection direction of the HDMI cable 130-1 connecting the source device 110-1 and the sink device 120-1 is the reverse direction, information indicating that the connection direction of the cable is the reverse direction is sent from the HDMI cable 130-1 to the source device 110-1 through the utility line as described above. After that, the switch SW8 is put into an open state, so that 1 V, which is the bias voltage 4, is generated at the point Q1. Thus, the source device 110-1 can determine that the HDMI cable 130-1 whose connection direction is the reverse direction is connected directly thereto.

The source device 110-1 and the sink device 120-1 then display that there is an HDMI cable whose connection direction is the reverse direction, and that the HDMI cable is connected directly to the source device 110-1. Thus, the user can recognize from the source device 110-1 or the sink device 120-1 that there is an HDMI cable whose the connection direction is the reverse direction and that the HDMI cable is connected directly to the source device 110-1, and easily correct the connection.

EXAMPLE 4

Figure 50:
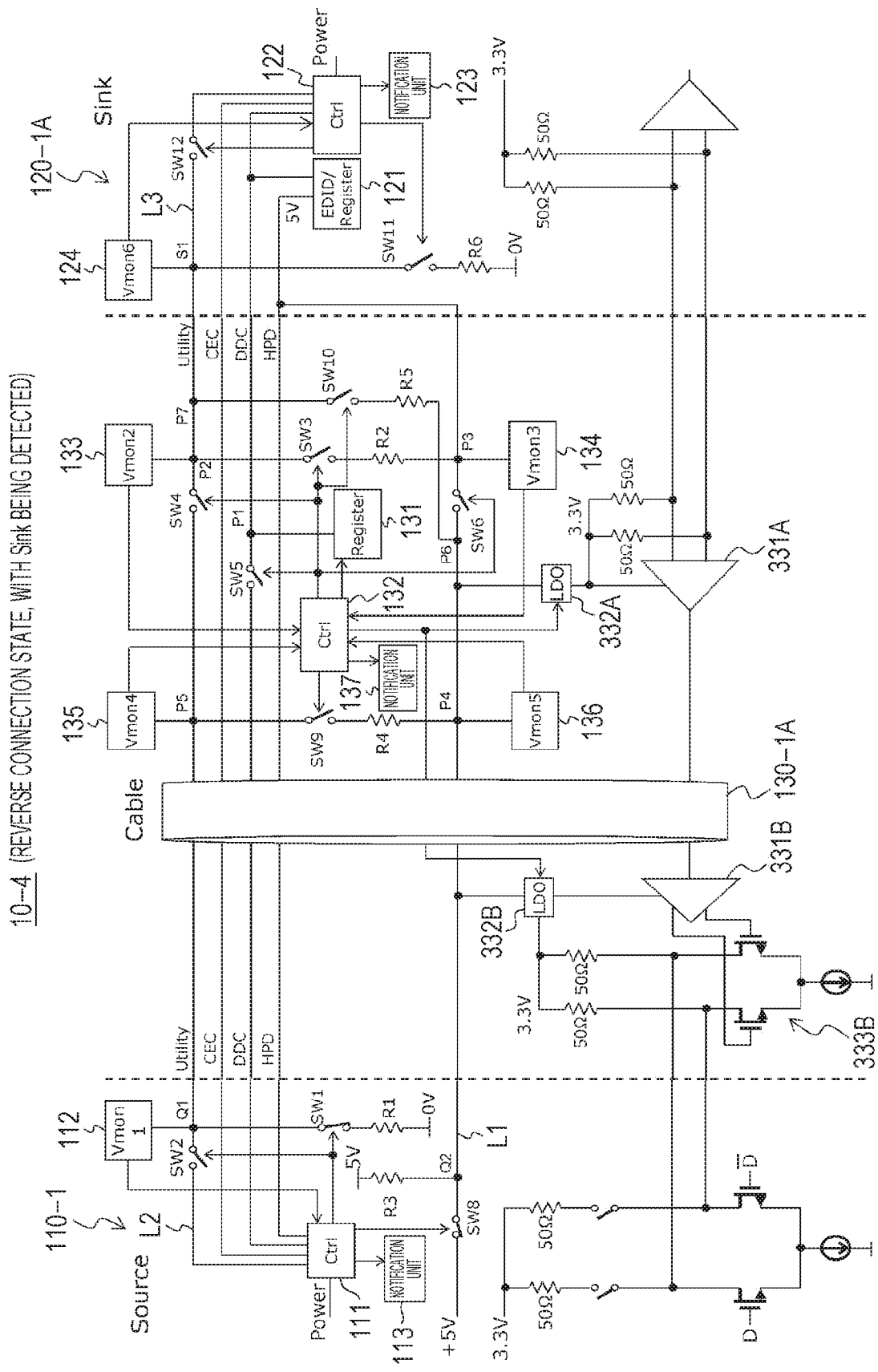
FIG. 50 is a diagram showing an example configuration (the HDMI cable being in a reverse connection state, a sink being detected) of a transmission system of Example 4.

FIG. 50 shows an example configuration of a transmission system 10-4. In FIG. 50, the components corresponding to the components shown in FIGS. 4 and 15 are denoted by the same reference numerals as those used in FIGS. 4 and 15, and detailed explanation of them is not repeated herein. This transmission system 10-4 is an HDMI transmission system that uses HDMI as a digital interface. This transmission system 10-4 includes a source device 110-1 as a transmission device, a sink device 120-1A as a reception device, and an HDMI cable 130-1A connecting these devices.

The HDMI cable 130-1A is an active optical cable (AOC) as a compatible cable. This HDMI cable 130-1A includes a register 131, a control unit 132, voltage monitor units 133, 134, 135, and 136, switches SW3, SW4, SW5, SW6, SW9, and SW10, and resistors R2, R4, and R5 for voltage division. The HDMI cable 130-1A further includes AOC constituent circuits, such as conversion circuits 331A and 331B, LDO regulators 332A and 332B, and a current drive unit 333B, and a notification unit 137.

A series circuit of the resistor R5 and the switch SW10 is connected between point P7 on the same side as the point P2 with respect to the switch SW4 of the utility line and point P6 on the same side as the point P4 with respect to the switch SW6 of the +5 V power-supply line. Although not described in detail, the other components of the HDMI cable 130-1A are configured in a manner similar to the HDMI cable 130-1 in the transmission system 10-1 shown in FIGS. 4 and 15.

The sink device 120-1A includes an EDID/register 121, a control unit 122, a notification unit 123, a voltage monitor unit 124, switches SW11 and SW12, and a voltage-dividing resistor R6. The switch SW12 is inserted in a third path L3 connected to the utility line of the HDMI cable 130-1A. Further, a series circuit of the resistor R6 and the switch SW11 is connected between point S1 closer to the side of the HDMI cable 130-1A than the position of insertion of the switch SW12 in the third path L3, and the ground (0 V). Meanwhile, the voltage monitor unit 124 monitors the voltage at the point S1 of the third path L3, and sends the monitor result to the control unit 122. Although not described in detail, the other components of the sink device 120-1A are configured in a manner similar to the sink device 120-1 in the transmission system 10-1 shown in FIGS. 4 and 15. In the description below, R5=50 kΩ, and R6=450 kΩ. Note that the resistance value is not limited to this.

FIG. 50 shows a case where the connection direction of the HDMI cable 130-1A is the reverse direction in the transmission system 10-4. In FIG. 50, the source device 110-1, the HDMI cable 130-1A, and the sink device 120-1A exhibit an initial state. An operation to be performed in a case where the connection direction of the HDMI cable 130-1A is the reverse direction as above is now described in detail.

Figure 51:
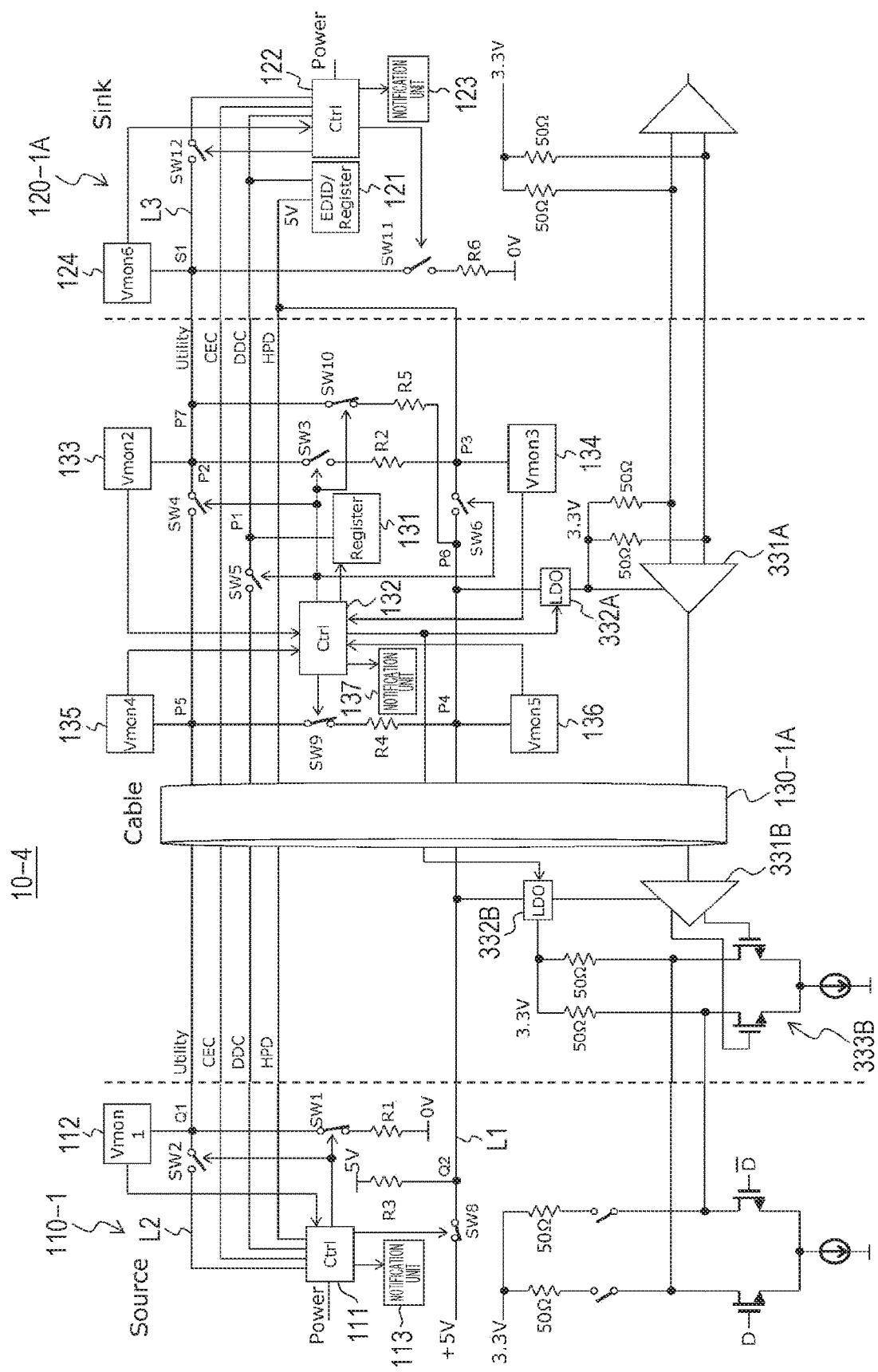
FIG. 51 is a diagram for explaining an operation of the transmission system shown in FIG. 50.

In this initial state, the voltage monitor unit 136 of the HDMI cable 130-1A monitors that the voltage at the point P4 is 5 V, and sends the monitor result to the control unit 132. Likewise, the voltage monitor unit 134 of the HDMI cable 130-1 monitors that the voltage at the point P3 is not 5 V, and sends the monitor result to the control unit 132. On the basis of these monitor results, the control unit 132 determines that the connection direction of the cable is the reverse direction, and puts the switch SW9 and the switch SW10 into a short-circuited state, as shown in FIG. 51.

When the switch SW9 is put into a short-circuited state, the resistors R1 and R4 are connected in series between the ground (0 V) of the source device 110-1 and the +5 V power-supply line of the HDMI cable 130-1A, and a voltage of 1.25 V is obtained at the points Q1 and P2 through resistance voltage division. In this arrangement, the HDMI cable 130-1A transmits information indicating that the direction of the cable is the reverse direction, to the source device 110-1 via the utility line. The voltage monitor unit 112 of the source device 110-1 monitors that the voltage at the point Q1 is 1.25 V, and sends the monitor result to the control unit 111. On the basis of this monitor result, the control unit 111 recognizes that the connection direction of the HDMI cable 130-1A is the reverse direction.

Figure 52:
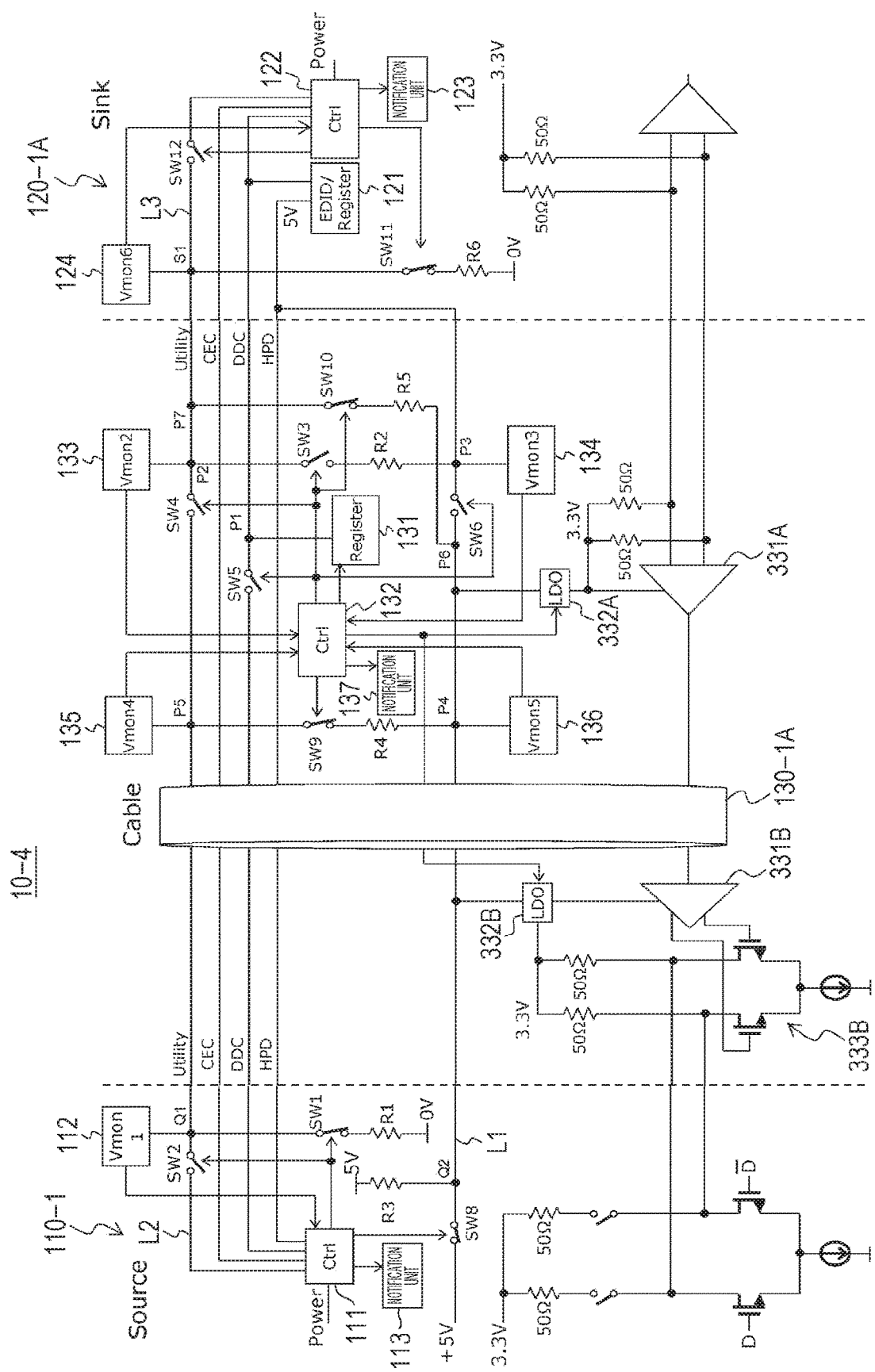
FIG. 52 is a diagram for explaining an operation of the transmission system shown in FIG. 50.

Meanwhile, when the switch SW10 is put into a short-circuited state, a voltage of 5 V is applied to the third path L3 of the sink device 120-1A connected to the utility line of the HDMI cable 130-1A. In this arrangement, the HDMI cable 130-1A transmits information indicating that the direction of the cable is the reverse direction, to the sink device 120-1A via the utility line. The voltage monitor unit 124 of the sink device 120-1A monitors that the voltage at the point S1 is 5 V, and sends the monitor result to the control unit 122. On the basis of this monitor result, the control unit 122 puts the switch SW11 into a short-circuited state, as shown in FIG. 52.

When the switch SW11 is put into a short-circuited state, the resistors R5 and R6 are connected in series between the ground (0 V) of the sink device 120-1A and the +5 V power-supply line of the HDMI cable 130-1A, and a voltage of 4.5 V is obtained at the point S1 through resistance voltage division. The voltage monitor unit 124 of the sink device 120-1A monitors that the voltage at the point S1 is 4.5 V, and sends the monitor result to the control unit 122. On the basis of this monitor result, the control unit 122 recognizes that the connection direction of the HDMI cable 130-1A is the reverse direction.

Figure 53:
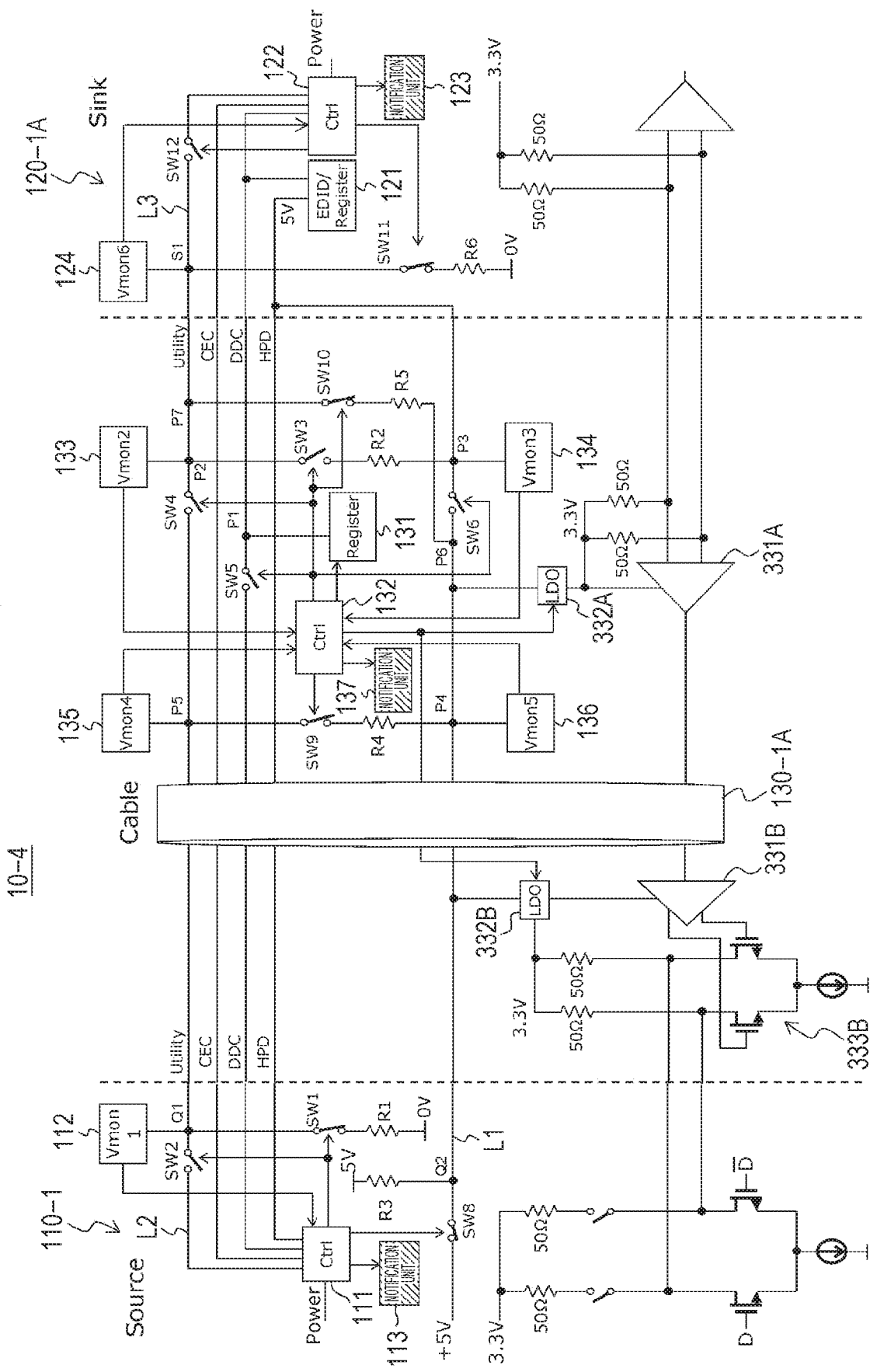
FIG. 53 is a diagram for explaining an operation of the transmission system shown in FIG. 50.

On the basis of the determination that the connection direction of the cable is the reverse direction, the control unit 132 of the HDMI cable 130-1A controls the notification operation of the notification unit 137, to notify the user that the connection direction of the cable is the reverse direction, as indicated by the shaded portion of the notification unit 137 in FIG. 53. This notification is issued through light emission, a buzzer sound, or the like (see FIGS. 18A and 18B).

Further, on the basis of the recognition that the connection direction of the HDMI cable 130-1A is the reverse direction, the control unit 111 of the source device 110-1 controls the notification operation of the notification unit 113, to notify the user that the connection direction of the HDMI cable 130-1A is the reverse direction, as indicated by the shaded portion of the notification unit 113 in FIG. 53. This notification is issued through display, voice, light emission, a buzzer sound, or the like. In this case, a display unit displays that the connection direction of the HDMI cable 130-1A is the reverse direction (see FIG. 19A), for example.

Meanwhile, on the basis of the recognition that the connection direction of the HDMI cable 130-1A is the reverse direction, the control unit 122 of the sink device 120-1A controls the notification operation of the notification unit 123, to notify the user that the connection direction of the HDMI cable 130-1A is the reverse direction, as indicated by the shaded portion of the notification unit 123 in FIG. 53. This notification is issued through display, voice, light emission, a buzzer sound, or the like. In this case, a display unit displays that the connection direction of the HDMI cable 130-1A is the reverse direction (see FIG. 23), for example.

Figure 54:
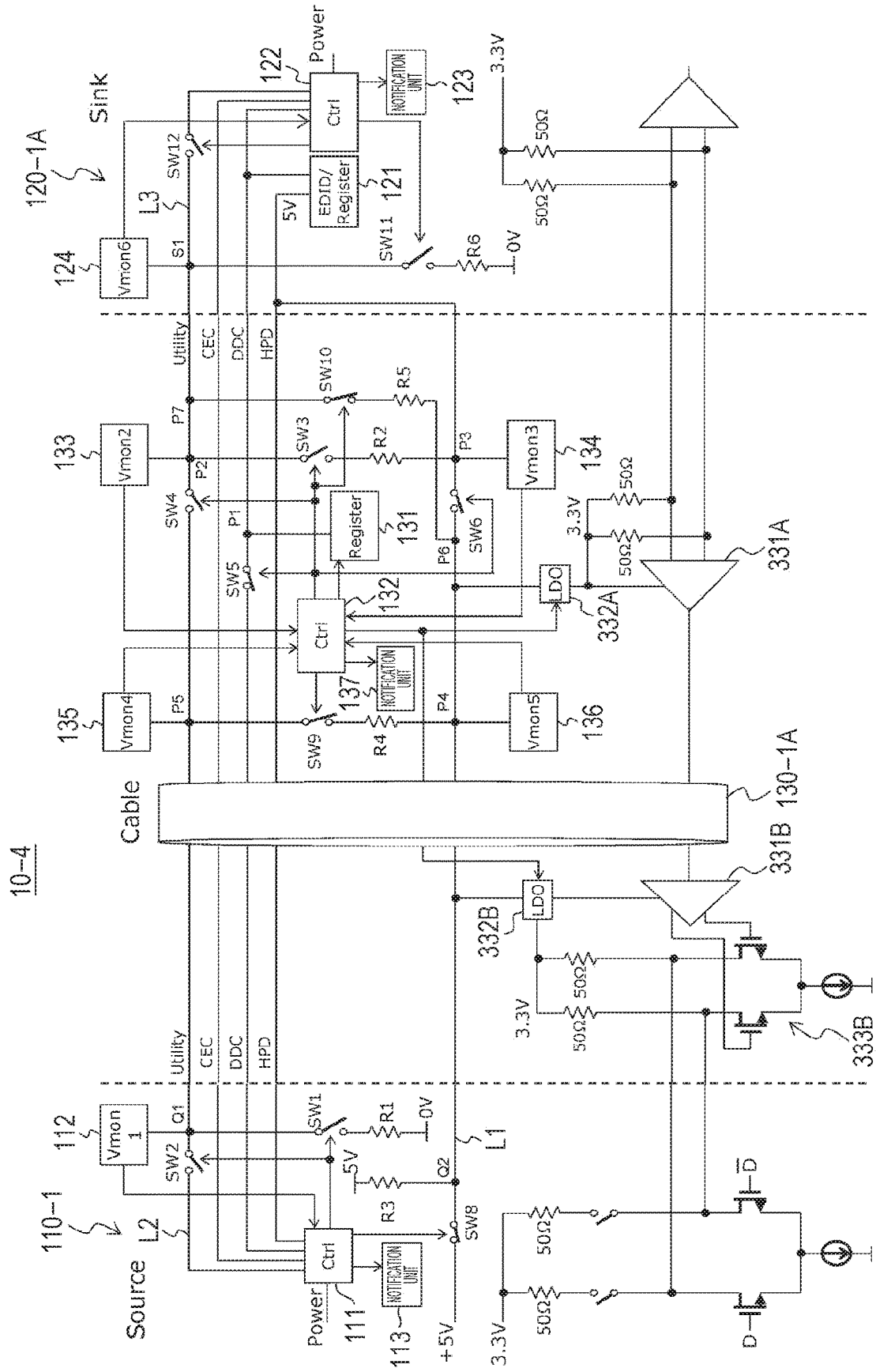
FIG. 54 is a diagram for explaining an operation of the transmission system shown in FIG. 50.

After the notification unit 137 notifies the user as described above, the control unit 132 of the HDMI cable 130-1A puts the switch SW5 and the switch SW6 into a short-circuited state, as shown in FIG. 54. Also, in a case where the source device 110-1 receives a 5 V voltage (a connection detection signal) from the sink device 120-1A via the HPD line after the notification unit 113 notifies the user as described above, as shown in FIG. 54, the source device 110-1 puts the switch SW1 into an open state. Further, after the notification unit 123 notifies the user as described above, the sink device 120-1A puts the switch SW11 into an open state, as shown in FIG. 54.

In the sink device 120-1A, when the switch SW11 is put into an open state as described above, the voltage at the point S1 changes to 5 V. In the sink device 120-1A, the voltage monitor unit 124 monitors that the voltage at the point S1 is 5 V, and sends the monitor result to the control unit 122. On the basis of this monitor result, the control unit 122 puts the switch SW12 into a short-circuited state, as shown in FIG. 55.

Meanwhile, in the source device 110-1, the switch SW1 is put into an open state, so that the voltage at the point P5 of the utility line of the HDMI cable 130-1A changes to 5 V. In the HDMI cable 130-1A, the voltage monitor unit 135 monitors that the voltage at the point P5 is 5 V, and sends the monitor result to the control unit 132.

Figure 55:
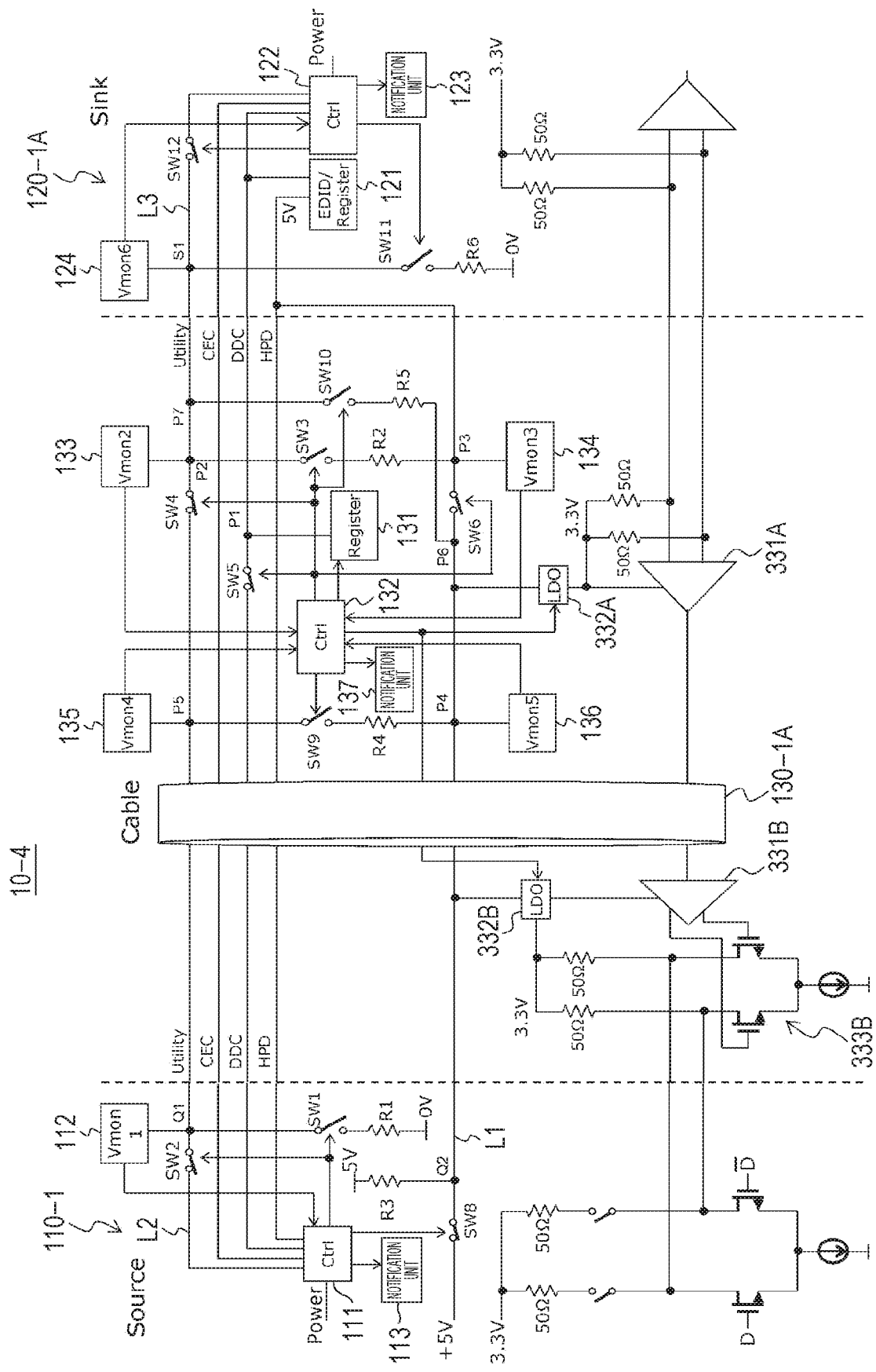
FIG. 55 is a diagram for explaining an operation of the transmission system shown in FIG. 50.

On the basis of this monitor result, the control unit 132 of the HDMI cable 130-1A puts the switch SW9 into an open state, the switch SW10 into an open state, and further, the switch SW4 into a short-circuited state, as shown in FIG. 55. When a certain stand-by time has passed since the control unit 111 of the source device 110-1 put the switch SW1 into an open state, the control unit 111 further puts the switch SW2 into a short-circuited state, as shown in FIG. 55.

As shown in FIG. 50, in a case where the connection direction of the HDMI cable 130-1A with respect to the source device 110-1 and the sink device 120-1A is the reverse direction, a voltage of 5 V from the source device 110-1 is obtained at the point P4 of the +5 V power-supply line, but a voltage of 5 V is not obtained at the point P3 of the +5 V power-supply line, as described above. Therefore, in the HDMI cable 130-1A, it is possible to easily determine that the connection direction of the cable is the reverse direction. Also, in the HDMI cable 130-1A, the notification unit 137 notifies the user of the reverse connection, on the basis of the determination. This enables the user to recognize that the connection direction of the cable is the reverse direction.

Also, as shown in FIG. 50, in a case where the connection direction of the HDMI cable 130-1A with respect to the source device 110-1 and the sink device 120-1A is the reverse direction, information indicating that the connection direction of the cable is the reverse direction is sent from the HDMI cable 130-1A to the source device 110-1 through the utility line, as described above. In this case, the switch SW9 is put into a short-circuited state, so that 2 V divided by the voltage-dividing resistors R1 and R4 is generated in the utility line, and this 2 V voltage is sent as information indicating that the connection direction of the cable is the reverse direction, to the source device 110-1. Thus, the source device 110-1 can accurately recognize that the connection direction of the HDMI cable 130-1A is the reverse direction.

Further, as shown in FIG. 50, in a case where the connection direction of the HDMI cable 130-1A with respect to the source device 110-1 and the sink device 120-1A is the reverse direction, the source device 110-1 recognizes that the connection direction of the cable is the reverse direction, on the basis of the information to that effect sent from the HDMI cable 130-1A. The notification unit 113 then notifies the user of the reverse connection. Thus, the user can recognize from the source device 110-1 that the connection direction of the cable is the reverse direction, and easily correct the connection.

Further, as shown in FIG. 50, in a case where the connection direction of the HDMI cable 130-1A with respect to the source device 110-1 and the sink device 120-1A is the reverse direction, information indicating that the connection direction of the cable is the reverse direction is sent from the HDMI cable 130-1A to the sink device 120-1A through the utility line, as described above. In this case, the switch SW10 is put into a short-circuited state, so that a voltage of 5 V is applied to the point S1 of the third path L3 connected to the utility line. In conjunction with that, the switch SW11 is then put into a short-circuited state in the sink device 120-1A, so that a voltage of 4.5 V is generated at the point S1. Thus, the sink device 120-1A can accurately recognize that the connection direction of the HDMI cable 130-1A is the reverse direction.

Further, as shown in FIG. 50, in a case where the connection direction of the HDMI cable 130-1A with respect to the source device 110-1 and the sink device 120-1A is the reverse direction, the sink device 120-1A recognizes that the connection direction of the cable is the reverse direction, on the basis of the information to that effect sent from the HDMI cable 130-1A. The notification unit 123 then notifies the user of the reverse connection. Thus, the user can recognize from the sink device 120-1A that the connection direction of the cable is the reverse direction, and easily correct the connection.

The incorrect (reverse) cable connection detection sequence in the source device 110-1 is the same as that in the case with the transmission system 10-1 shown in FIG. 15, and therefore, explanation thereof is not made herein (see FIG. 24).

Figure 56:
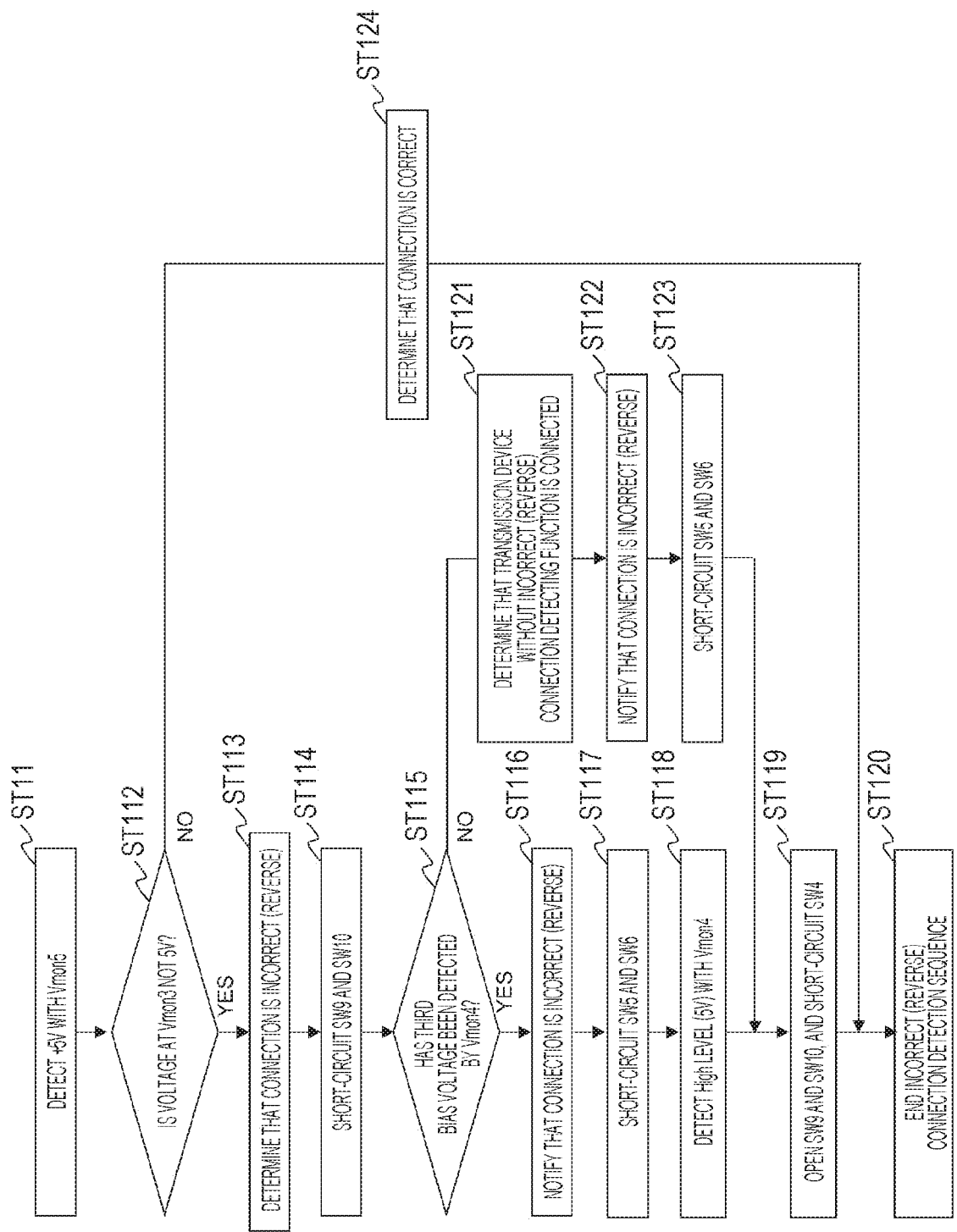
FIG. 56 shows an example of an incorrect (reverse) cable connection detection sequence of the HDMI cable in the transmission system shown in FIG. 50.

FIG. 56 shows an example of an incorrect (reverse) cable connection detection sequence in the HDMI cable 130-1A. In step ST111, when the voltage monitor unit 136 detects a voltage of 5 V, the sequence is started, and moves on to step S112. In step ST112, the control unit 132 determines whether or not the voltage monitor unit 134 has detected a voltage of 5 V. If a voltage of 5 V has not been detected, the control unit 132 determines in step ST113 that the connection is incorrect (reverse).

Next, in step ST114, the control unit 132 changes the switch SW9 from an open state to a short-circuited state to send the source device 110-1 information indicating that the connection direction of the cable is the reverse direction, and changes the switch SW10 from an open state to a short-circuited state to send the sink device 120-1A information indicating that the connection direction of the cable is the reverse direction.

Next, in step ST115, the control unit 132 determines whether the voltage monitor unit 135 has detected the third bias voltage (1.25 V). If the third bias voltage (1.25 V) has been detected, the notification operation of the notification unit 137 is controlled by the control unit 132 in step ST116, so that the user is notified that the connection direction of the cable is the reverse direction, through LED light emission, a buzzer sound, or the like.

Next, in step ST117, the control unit 132 changes the switch SW6 from an open state to a short-circuited state, and changes the switch SW5 from an open state to a short-circuited state. Next, after 5 V is detected by the voltage monitor unit 135 in step ST118, the switch SW9 is changed from a short-circuited state to an open state, the switch SW4 is changed from an open state to a short-circuited state, and further, the switch SW10 is changed from a short-circuited state to an open state in step ST119. In step ST120, the sequence is then ended.

If the third bias voltage (1.25 V) is not detected in step ST115, on the other hand, the control unit 132 determines in step ST121 that a transmission device without an incorrect (reverse) connection detecting function is connected. In step ST122, the notification operation of the notification unit 137 is then controlled by the control unit 132, so that the user is notified that the connection direction of the cable is the reverse direction, through LED light emission, a buzzer sound, or the like.

Next, in step ST123, the control unit 132 changes the switch SW6 from an open state to a short-circuited state, and changes the switch SW5 from an open state to a short-circuited state. The switch SW9 is then changed from a short-circuited state to an open state, the switch SW4 is changed from an open state to a short-circuited state, and further, the switch SW10 is changed from a short-circuited state to an open state in step ST119. In step ST120, the sequence is then ended.

If a voltage of 5 V has been detected in step ST112, on the other hand, the control unit 132 determines in step ST124 that the connection is correct. In step ST120, the sequence is then ended.

Figure 57:
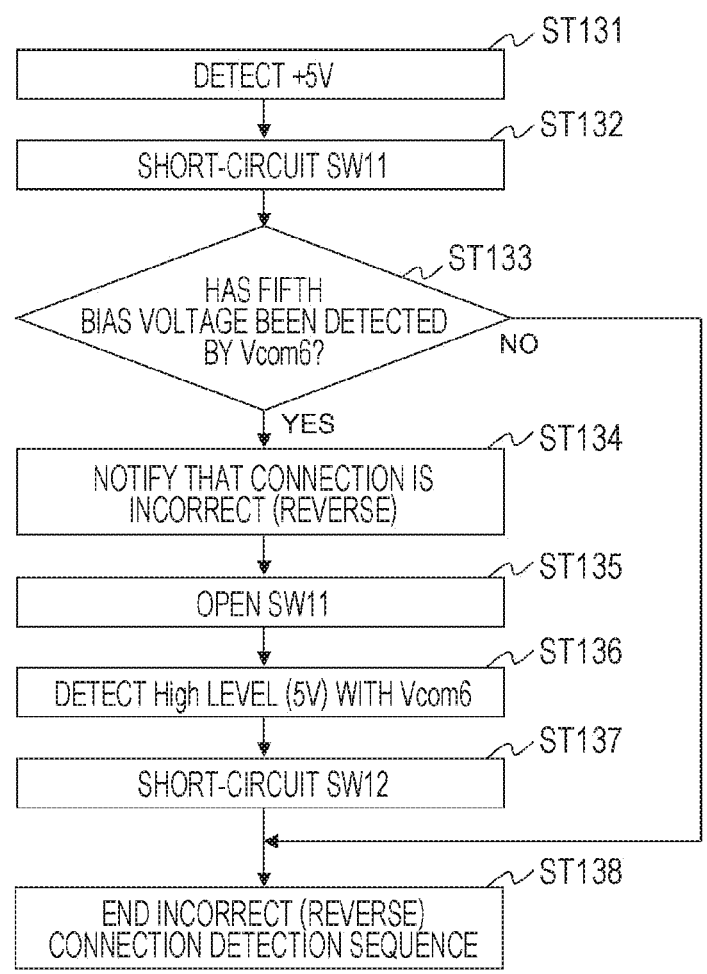
FIG. 57 shows an example of an incorrect (reverse) cable connection detection sequence of the sink device in the transmission system shown in FIG. 50.

FIG. 57 shows an example of an incorrect (reverse) cable connection detection sequence in the sink device 120-1A. In step ST131, when the voltage monitor unit 124 detects a voltage of 5 V, the sequence is started, and moves on to step S132. In step ST132, the control unit 122 changes the switch SW11 from an open state to a short-circuited state.

Next, in step ST133, the control unit 122 determines whether the voltage monitor unit 124 has detected a fifth bias voltage (4.5 V). If the fifth bias voltage (4.5 V) has been detected, the notification operation of the notification unit 123 is controlled by the control unit 122 in step ST134, so that the user is notified that the connection direction of the cable is the reverse direction, through display, voice, or the like.

Next, in step ST135, the switch SW11 is changed from a short-circuited state to an open state. Next, when 5 V is detected by the voltage monitor unit 124 in step ST136, the switch SW12 is changed from an open state to a short-circuited state in step ST137. In step ST138, the sequence is then ended. If the fifth bias voltage (4.5 V) is not detected in step ST133, on the other hand, the sequence is also ended in step ST138.

2. Modifications

Note that, in the examples described in the above embodiment, information indicating that the cable connection direction is the reverse direction is sent from an HDMI cable to a source device or a sink device. However, the line to be used is not limited to this, and some other line may be used.

Also, in the examples described in the above embodiment, a transmission system connects a source device and a sink device with an HDMI cable. However, in a manner similar to the above, this technology can be applied to a cable that uses the mechanism in which the transmission device and the reception device are defined in the "VESA Plug and Display (P&D) Specification". Accordingly, the present technology can also be applied to DVI, MHL, Display Port, and the like. Further, the present technology can be applied not only to AOC and ACC, but also to wireless communication and the like. Furthermore, the present technology can of course be applied to a USB cable or the like in a manner similar to the above.

For example, a configuration in a case where "Display Port" is used is now briefly described. FIG. 58A shows the pin arrangement in "Display Port". AuX+/− corresponds to DDC of HDMI, and 3.3 V corresponds to +5 V of HDMI. Hot plug detection corresponds to HPD of HDMI.

The present technology can also be applied to "Thunderbolt". FIG. 58B shows the pin arrangement in "Thunderbolt". In the case of "Thunderbolt", "DPPWR" corresponds to the +5 V line. HPD is prepared in advance. In the HDMI examples described above, the utility line is used in resistance voltage division between the source and the cable. In the case of "Thunderbolt", however, the No. 10 or No. 12 reserve may be used.

The present technology may also be embodied in the configurations described below.

(1) A cable that is connected for use between a transmission device and a reception device, and transmits data in one direction,
the cable including:
a connection direction determination unit that determines whether a connection direction is a reverse direction, on the basis of a result of voltage monitoring at a predetermined position on a power-supply line; and
an information transmission unit that transmits information indicating that the connection direction is the reverse direction to the transmission device or the reception device, when the connection direction is determined to be the reverse direction.

(2) The cable according to (1), in which
a first switch is disposed on the power-supply line at a position that becomes closer to a side of the transmission device than the predetermined position when the connection direction is correct, and
the connection direction determination unit determines whether the connection direction is the reverse direction, on the basis of the result of voltage monitoring at the predetermined position at a time when the first switch is in an unconnected state.

(3) The cable according to (1) or (2), in which
the information transmission unit transmits the information, using a predetermined line that is not the power-supply line.

(4) The cable according to (3), in which
the predetermined line is grounded via a series circuit of a voltage-dividing resistor and a second switch, and
the information transmission unit changes the second switch from an unconnected state to a connected state, to transmit the information using the predetermined line.

(5) The cable according to (4), in which
a third switch is disposed at a position that becomes closer to a side of the reception device than a point of connection of the series circuit to the predetermined line at a time when the connection direction is the reverse direction, and
the third switch is put into an unconnected state when the second switch is put into a connected state.

(6) The cable according to any one of (1) to (5), further including
a notification unit that notifies a user that the connection direction is the reverse direction, when the connection direction is determined to be the reverse direction.

(7) The cable according to any one of (1) to (6), further including:
a compatible device determination unit that determines whether the transmission device is a compatible device; and
a control unit that performs control to operate in a compatible mode, when the transmission device is determined to be the compatible device.

(8) A method for controlling a cable that is connected for use between a transmission device and a reception device, and transmits data in one direction,
the method including:
a step of determining whether a connection direction is a reverse direction, on the basis of a result of voltage monitoring at a predetermined position on a power-supply line; and
a step of transmitting information indicating that the connection direction is the reverse direction to the transmission device or the reception device, when the connection direction is determined to be the reverse direction.

(9) A transmission device that is connected to a reception device via a cable that transmits data in one direction,
the transmission device including:
an information reception unit that receives information indicating that a connection direction of the cable is a reverse direction, the information being transmitted from the cable;
a notification unit that notifies a user of reverse connection, on the basis of the received information; and
a power supply unit that supplies power to a power-supply line of the cable via a first path, in which
a ground voltage is applied to a second path via a first voltage-dividing resistor, the second path being connected to a predetermined line of the cable, the predetermined line not being the power-supply line, and
the information reception unit receives the information on the basis of a result of voltage monitoring in the second path.

(10) The transmission device according to (9), further including
a connection determination unit that determines whether the cable is connected directly to the transmission device, on the basis of a result of voltage monitoring in the second path at a time when a predetermined voltage, instead of the power, is applied to the first path via a second voltage-dividing resistor.

(11) The transmission device according to (10), in which the notification unit issues a notification that the connection direction of the cable is the reverse direction, and a notification as to whether the cable is connected directly to the transmission device.

(12) The transmission device according to any one of (9) to (11), further including an information transmission unit that transmits information indicating that a direction of the cable is the reverse direction, to the reception device through a predetermined line of the cable, on the basis of the received information.

(13) The transmission device according to (12), in which the information transmission unit writes the information into a register of the reception device.

(14) The transmission device according to any one of (9) to (13), further including:

a compatible device determination unit that determines whether the cable is a compatible cable; and a control unit that performs control to operate in a compatible mode, when the cable is determined to be the compatible cable, in which the compatible device determination unit and the control unit operate when the cable is correctly oriented.

(15) A method for controlling a transmission device that is connected to a reception device via a cable that transmits data in one direction, the method including:

a step of receiving information indicating that a connection direction of the cable is a reverse direction, the information being transmitted from the cable; and a step of notifying a user of reverse connection, on the basis of the received information, in which a ground voltage is applied to a second path via a first voltage-dividing resistor, the second path being connected to a predetermined line of the cable, the predetermined line not being the power-supply line, and, in the step of receiving the information, the information is received on the basis of a result of voltage monitoring in the second path.

(16) A reception device that is connected to a transmission device via a cable that transmits data in one direction, the reception device including:

an information acquisition unit that acquires information indicating that a connection direction of the cable is a reverse direction; and a notification unit that notifies a user of reverse connection, on the basis of the acquired information, in which the information acquisition unit acquires the information from a register on which writing has been performed by the transmission device.

(17) A method for controlling a reception device that is connected to a transmission device via a cable that transmits data in one direction, the method including:

a step of acquiring information indicating that a connection direction of the cable is a reverse direction; and a step of notifying a user of reverse connection, on the basis of the acquired information, in which, in the step of acquiring the information, the information is acquired from a register on which writing has been performed by the transmission device.

REFERENCE SIGNS LIST 10-1 to 10-4 Transmission system
110-1 Source device
111 Control unit
112 Voltage monitor unit
113 Notification unit
120-1, 120-1A Sink device
121 EDID/register
122 Control unit
123 Notification unit
130-1, 130-1A, 330 HDMI cable
131 Register
132 Control unit
133, 134, 135, 136 Voltage monitor unit
137 Notification unit
140 Repeater
141 Amplifier
331A, 331B Conversion circuit
332A, 332B LDO regulator
333B Current drive unit
SW1 to SW6, SW8 to SW12 Switch
R1 to R6 Resistor for voltage division

The invention claimed is:

1. A cable that is connected for use between a transmission device and a reception device, and transmits data in one direction, the cable comprising:

a connection direction determination unit that determines whether a connection direction is a reverse direction, on a basis of a result of voltage monitoring at a predetermined position on a power-supply line; and an information transmission unit that transmits information indicating that the connection direction is the reverse direction to the transmission device or the reception device, when the connection direction is determined to be the reverse direction.

2. The cable according to claim 1, wherein a first switch is disposed on the power-supply line at a position that becomes closer to a side of the transmission device than the predetermined position when the connection direction is correct, and the connection direction determination unit determines whether the connection direction is the reverse direction, on a basis of the result of the voltage monitoring at the predetermined position at a time when the first switch is in an unconnected state.

3. The cable according to claim 1, wherein the information transmission unit transmits the information, using a predetermined line that is not the power-supply line.

4. The cable according to claim 3, wherein the predetermined line is grounded via a series circuit of a voltage-dividing resistor and a second switch, and the information transmission unit changes the second switch from an unconnected state to a connected state, to transmit the information using the predetermined line.

5. The cable according to claim 4, wherein a third switch is disposed at a position that becomes closer to a side of the reception device than a point of connection of the series circuit to the predetermined line at a time when the connection direction is the reverse direction, and the third switch is put into an unconnected state when the second switch is put into the connected state.

6. The cable according to claim 1, further comprising a notification unit that notifies a user that the connection direction is the reverse direction, when the connection direction is determined to be the reverse direction.

7. The cable according to claim 1, further comprising:
a compatible device determination unit that determines whether the transmission device is a compatible device; and
a control unit that performs control to operate in a compatible mode, when the transmission device is determined to be the compatible device.

8. A method for controlling a cable that is connected for use between a transmission device and a reception device, and transmits data in one direction, the method comprising:
determining, by a connection direction determination unit included in the cable, whether a connection direction is a reverse direction, on a basis of a result of voltage monitoring at a predetermined position on a power-supply line; and
transmitting, by an information transmission unit included in the cable, information indicating that the connection direction is the reverse direction to the transmission device or the reception device, when the connection direction is determined to be the reverse direction.

9. A transmission device that is connected to a reception device via a cable that transmits data in one direction, the transmission device comprising:
an information reception unit that receives information indicating that a connection direction of the cable is a reverse direction, the information being transmitted from the cable;
a notification unit that notifies a user of reverse connection, on a basis of the received information; and
a power supply unit that supplies power to a power-supply line of the cable via a first path, wherein:
a ground voltage is applied to a second path via a first voltage-dividing resistor, the second path being connected to a predetermined line of the cable, the predetermined line not being the power-supply line, and
the information reception unit receives the information on a basis of a result of voltage monitoring in the second path.

10. The transmission device according to claim 9, further comprising
a connection determination unit that determines whether the cable is connected directly to the transmission device, on a basis of the result of the voltage monitoring in the second path at a time when a predetermined voltage, instead of the power, is applied to the first path via a second voltage-dividing resistor.

11. The transmission device according to claim 10, wherein
the notification unit issues a notification that the connection direction of the cable is the reverse direction, and a notification as to whether the cable is connected directly to the transmission device.

12. The transmission device according to claim 9, further comprising
an information transmission unit that transmits information indicating that a direction of the cable is the reverse direction, to the reception device through the predetermined line of the cable, on a basis of the received information.

13. The transmission device according to claim 12, wherein
the information transmission unit writes the information into a register of the reception device.

14. The transmission device according to claim 9, further comprising:
a compatible device determination unit that determines whether the cable is a compatible cable; and
a control unit that performs control to operate in a compatible mode, when the cable is determined to be the compatible cable,
wherein the compatible device determination unit and the control unit operate when the cable is correctly oriented.

15. A method for controlling a transmission device that is connected to a reception device via a cable that transmits data in one direction,
the method comprising:
receiving, by an information reception unit, information indicating that a connection direction of the cable is a reverse direction, the information being transmitted from the cable; and
notifying, by a notification unit, a user of reverse connection, on a basis of the received information,
wherein:
a ground voltage is applied to a second path via a first voltage-dividing resistor, the second path being connected to a predetermined line of the cable, the predetermined line not being a power-supply line, and
the information is received on a basis of a result of voltage monitoring in the second path.

16. A reception device that is connected to a transmission device via a cable that transmits data in one direction,
the reception device comprising:
an information acquisition unit that acquires information indicating that a connection direction of the cable is a reverse direction; and
a notification unit that notifies a user of reverse connection, on a basis of the acquired information,
wherein the information acquisition unit acquires the information from a register on which writing has been performed by the transmission device.

17. A method for controlling a reception device that is connected to a transmission device via a cable that transmits data in one direction,
the method comprising:
acquiring, by an information acquisition unit, information indicating that a connection direction of the cable is a reverse direction; and
notifying, by a notification unit, a user of reverse connection, on a basis of the acquired information,
wherein the information is acquired from a register on which writing has been performed by the transmission device.

* * * * *